(12) United States Patent
Isobe et al.

(10) Patent No.: US 7,718,547 B2
(45) Date of Patent: May 18, 2010

(54) SEMICONDUCTOR DEVICE AND METHOD FOR MANUFACTURING THE SAME

(75) Inventors: Atsuo Isobe, Atsugi (JP); Satoshi Murakami, Atsugi (JP); Tamae Takano, Atsugi (JP); Shunpei Yamazaki, Setagaya (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 12/334,589

(22) Filed: Dec. 15, 2008

(65) Prior Publication Data

US 2009/0098720 A1    Apr. 16, 2009

Related U.S. Application Data

(62) Division of application No. 11/410,070, filed on Apr. 25, 2006, now Pat. No. 7,465,677.

(30) Foreign Application Priority Data

Apr. 28, 2005    (JP)    ............... 2005-133680

(51) Int. Cl.
*H01L 21/31* (2006.01)
(52) U.S. Cl. .................................... 438/772
(58) Field of Classification Search ............... 438/772, 438/777, 788, 792; 257/E21.193, E21.251
See application file for complete search history.

(56) References Cited

U.S. PATENT DOCUMENTS

| | | |
|---|---|---|
| 4,727,044 A | 2/1988 | Yamazaki |
| 5,485,019 A | 1/1996 | Yamazaki et al. |
| 5,757,456 A | 5/1998 | Yamazaki et al. |
| 5,956,581 A | 9/1999 | Yamazaki et al. |
| 6,127,199 A | 10/2000 | Inoue et al. |
| 6,426,245 B1 | 7/2002 | Kawasaki et al. |
| 6,519,136 B1 | 2/2003 | Chu et al. |

(Continued)

FOREIGN PATENT DOCUMENTS

EP    1 617 483    1/2006

(Continued)

OTHER PUBLICATIONS

*The Advancing Introduction of Plasma Oxynitriding Apparatus Adopted by More Than 10 LSI Makers*, Nikkei Microdevices, Apr. 2005, pp. 100-103.

*Primary Examiner*—Calvin Lee
(74) *Attorney, Agent, or Firm*—Eric J. Robinson; Robinson Intellectual Property Law Office, P.C.

(57) ABSTRACT

A manufacturing method of a semiconductor device of the present invention includes the steps of forming a first insulating film over a substrate, forming a semiconductor film over the first insulating film, oxidizing or nitriding the semiconductor film by conducting a plasma treatment to the semiconductor film under a condition of an electron density of $1\times10^{11}$ cm$^{-3}$ or more and $1\times10^{13}$ cm$^{-3}$ or less and an electron temperature of 0.5 eV or more and 1.5 eV or less, using a high frequency wave, forming a second insulating film to cover the semiconductor film, forming a gate electrode over the second insulating film, forming a third insulating film to cover the gate electrode, and forming a conductive film over the third insulating film.

58 Claims, 29 Drawing Sheets

U.S. PATENT DOCUMENTS

| | | | |
|---|---|---|---|
| 6,521,912 | B1 | 2/2003 | Sakama et al. |
| 6,534,826 | B2 | 3/2003 | Yamazaki |
| 6,555,420 | B1 | 4/2003 | Yamazaki |
| 6,716,761 | B2 | 4/2004 | Mitsuiki |
| 6,773,996 | B2 | 8/2004 | Suzawa et al. |
| 6,818,852 | B2 | 11/2004 | Ohmi et al. |
| 6,919,282 | B2 | 7/2005 | Sakama et al. |
| 6,975,018 | B2 | 12/2005 | Ohmi et al. |
| 7,081,640 | B2 | 7/2006 | Uchida et al. |
| 7,097,735 | B2 | 8/2006 | Ohmi et al. |
| 7,166,899 | B2 | 1/2007 | Sakama et al. |
| 7,205,716 | B2 | 4/2007 | Yamazaki et al. |
| 7,364,954 | B2 | 4/2008 | Kuwashima et al. |
| 7,399,989 | B2 | 7/2008 | Moriya et al. |
| 7,410,839 | B2 | 8/2008 | Isobe et al. |
| 7,465,677 | B2 * | 12/2008 | Isobe et al. ............ 438/772 |
| 2002/0020497 | A1 | 2/2002 | Ohmi et al. |
| 2004/0217431 | A1 | 11/2004 | Shimada |
| 2005/0158665 | A1 | 7/2005 | Maekawa et al. |
| 2005/0196973 | A1 | 9/2005 | Suzuki et al. |
| 2005/0285102 | A1 | 12/2005 | Koo et al. |
| 2006/0055314 | A1 | 3/2006 | Nakamura et al. |
| 2006/0121694 | A1 | 6/2006 | Tamura |
| 2006/0154492 | A1 | 7/2006 | Ide et al. |
| 2006/0246633 | A1 | 11/2006 | Arai et al. |
| 2006/0246644 | A1 | 11/2006 | Isobe et al. |
| 2006/0270066 | A1 | 11/2006 | Imahayashi et al. |
| 2008/0032511 | A1 * | 2/2008 | Kabe et al. ............ 438/771 |

FOREIGN PATENT DOCUMENTS

| | | |
|---|---|---|
| EP | 1 622 194 | 2/2006 |
| JP | 06-013615 | 1/1994 |
| JP | 2000-174277 | 6/2000 |
| JP | 2001-135824 | 5/2001 |
| JP | 2004-319952 | 11/2004 |
| JP | 2005-093737 | 4/2005 |
| WO | WO 2004/017396 | 2/2004 |
| WO | WO 2005/004223 | 1/2005 |

* cited by examiner

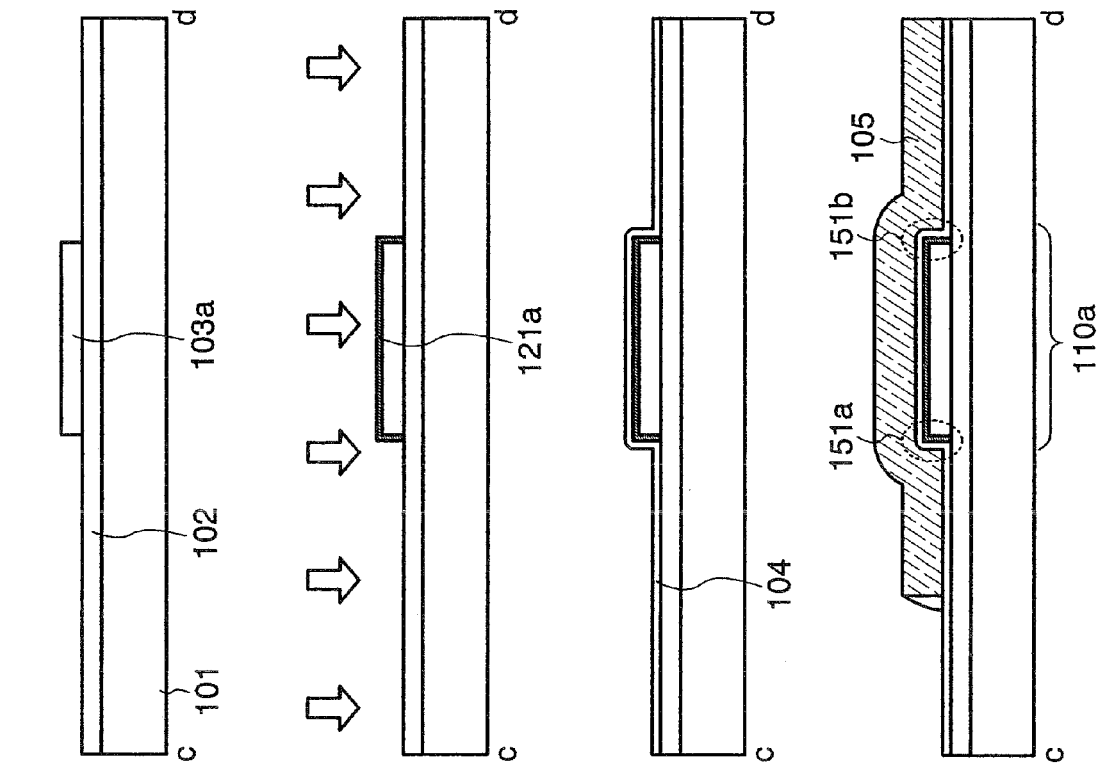
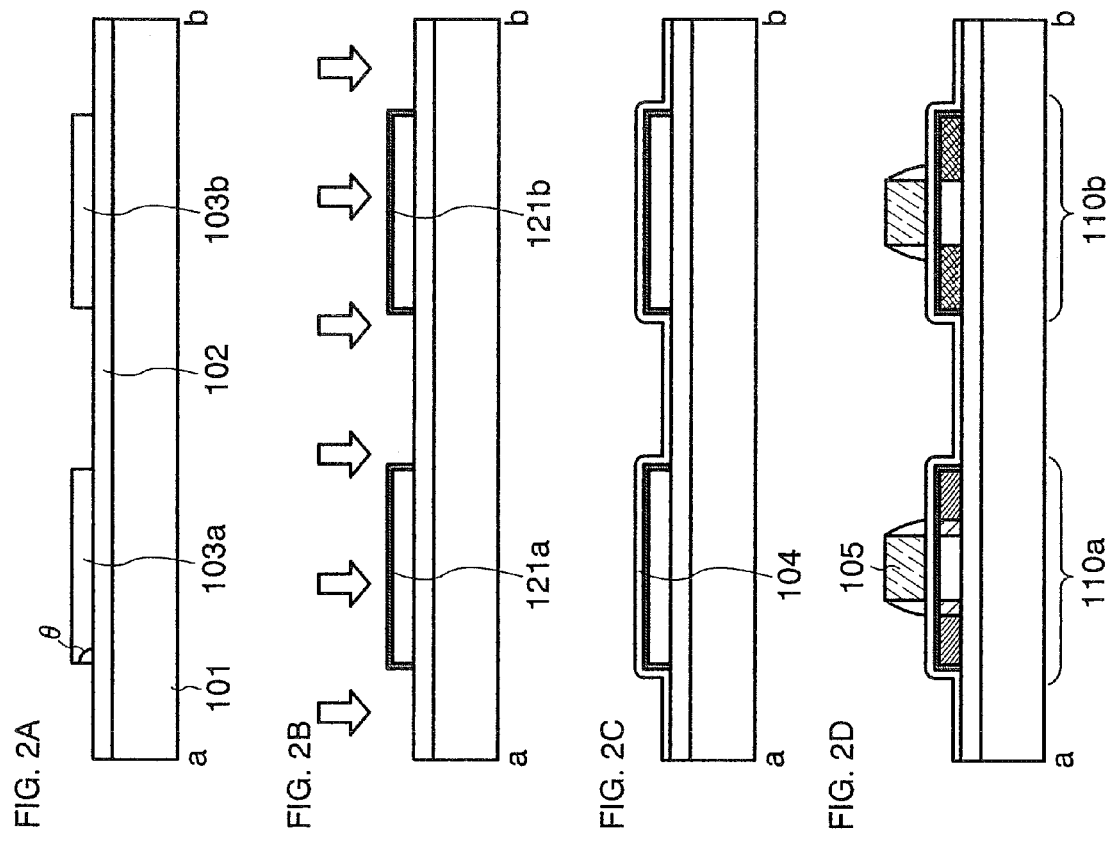

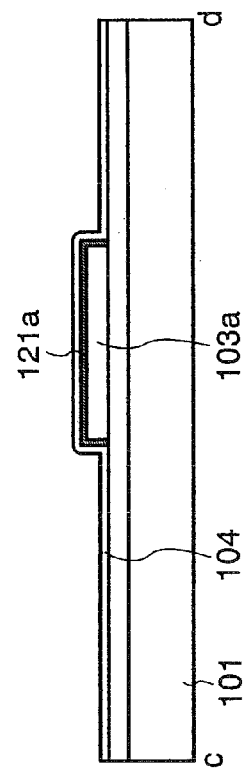
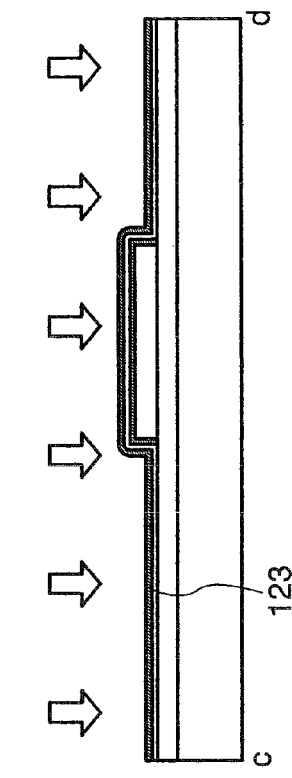
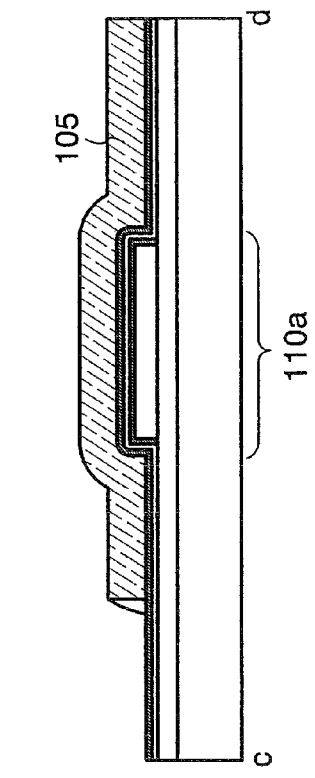
FIG. 3A
FIG. 3B
FIG. 3C

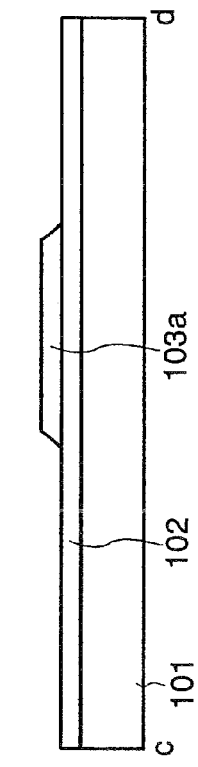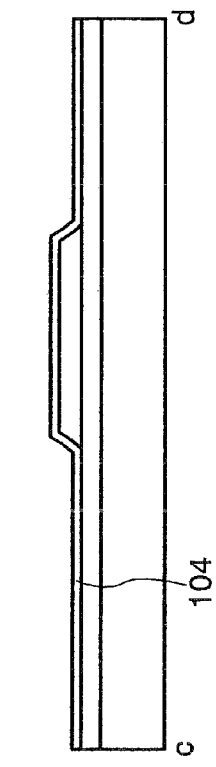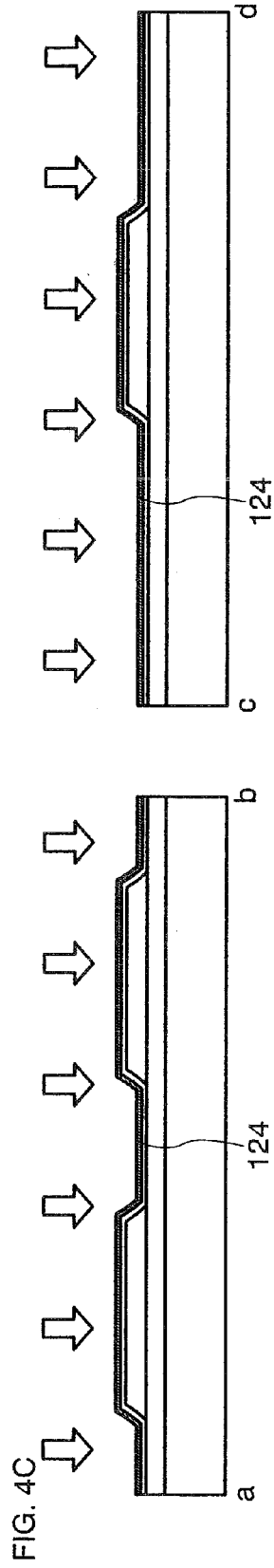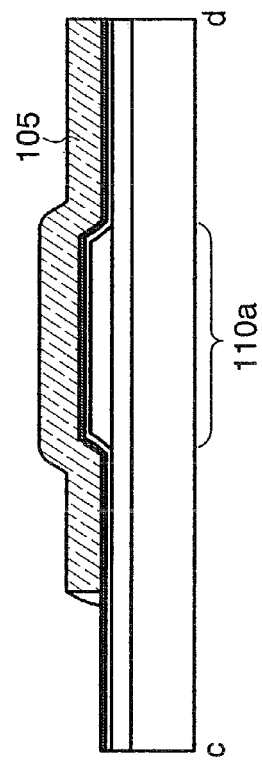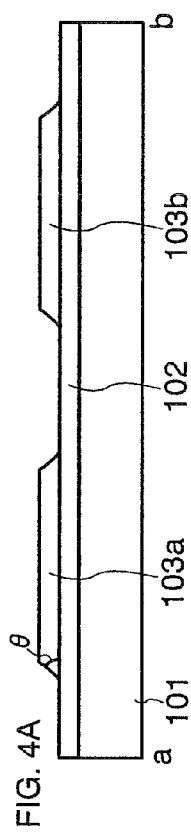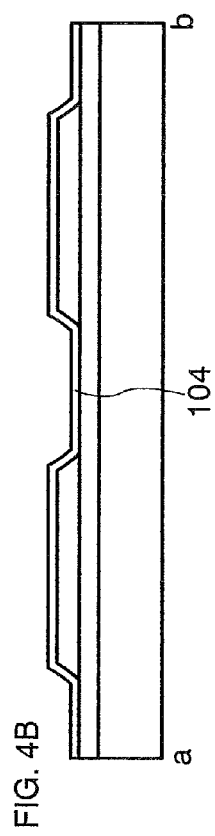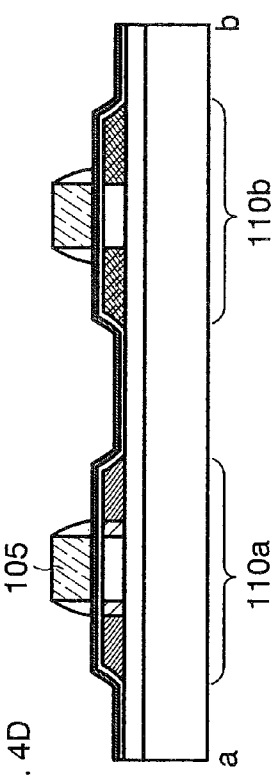

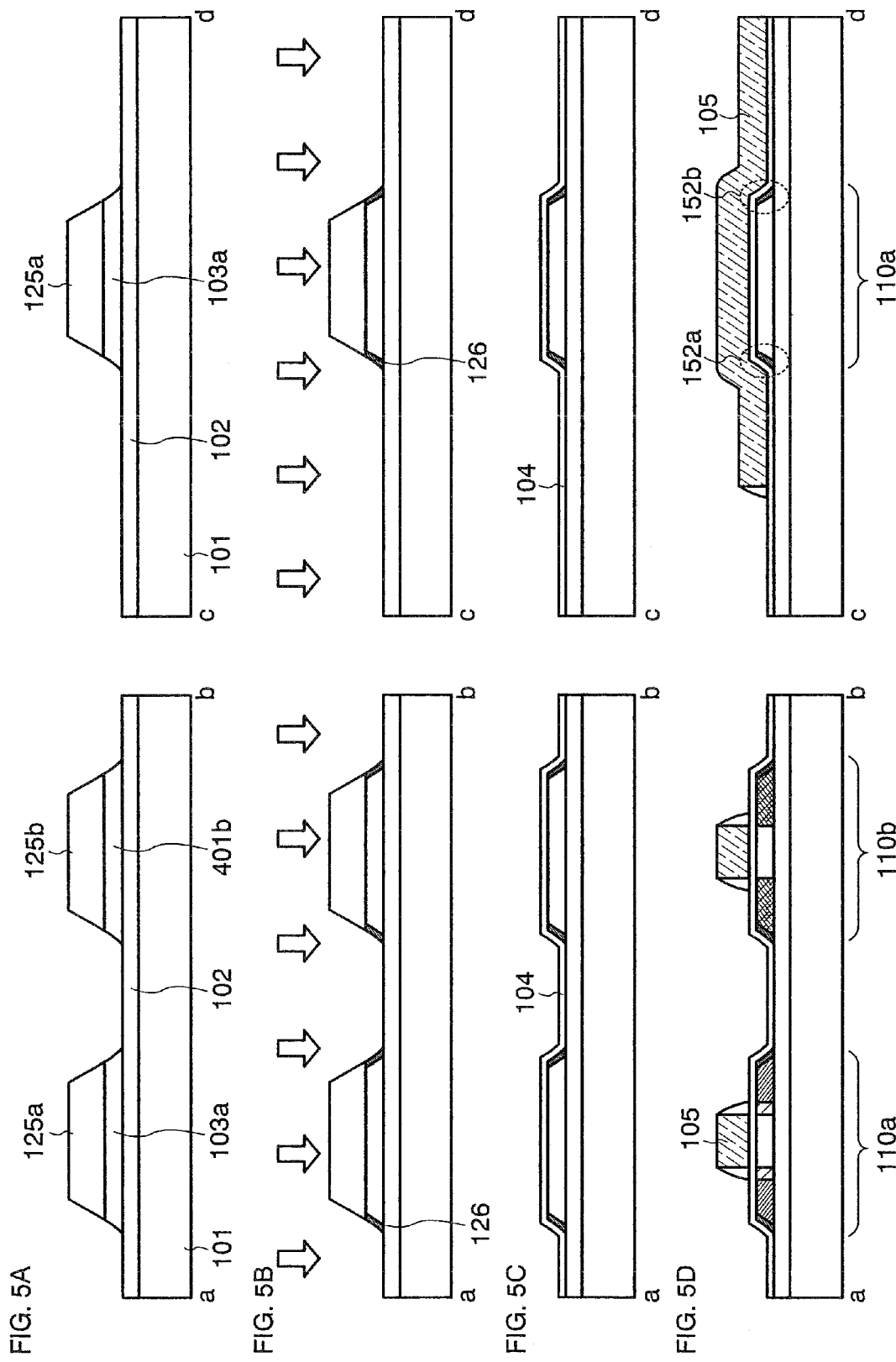

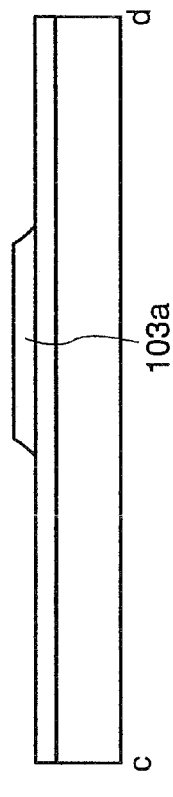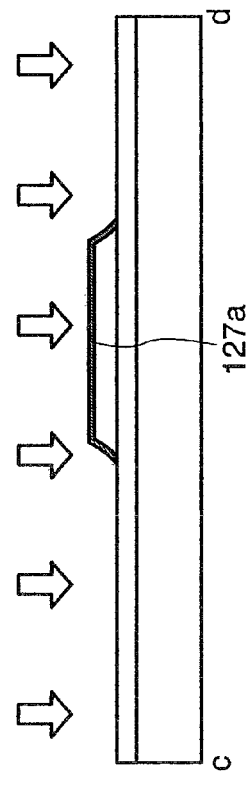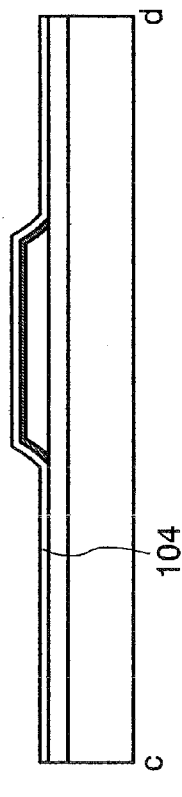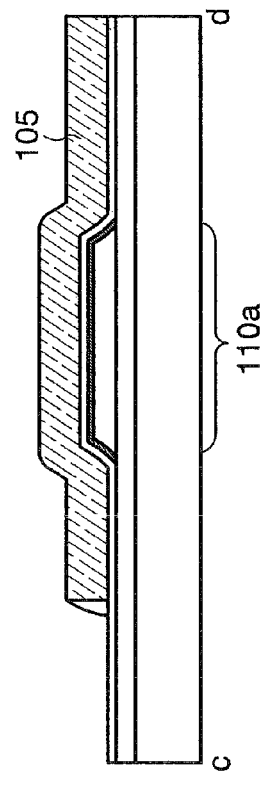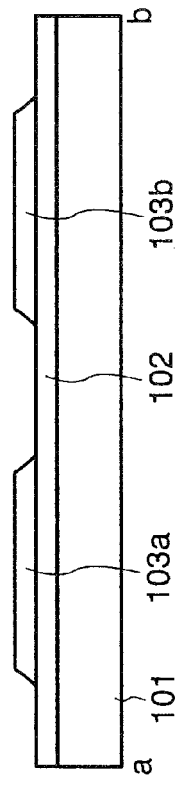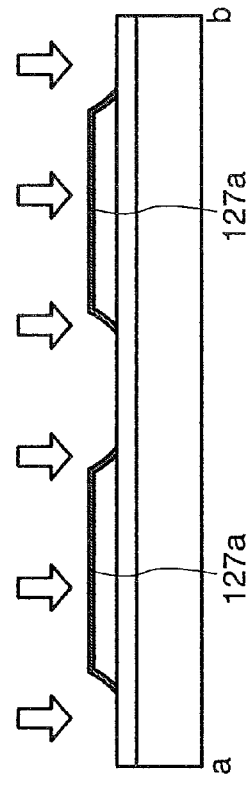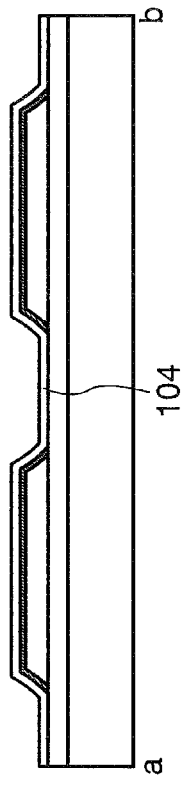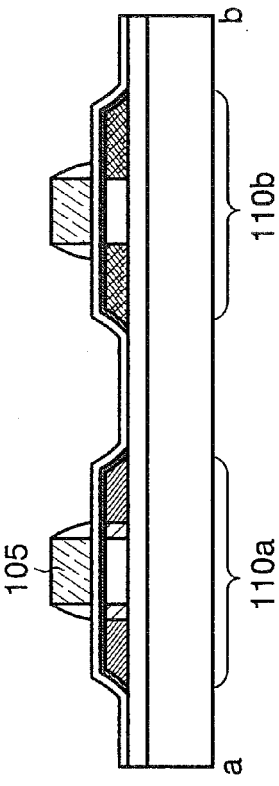

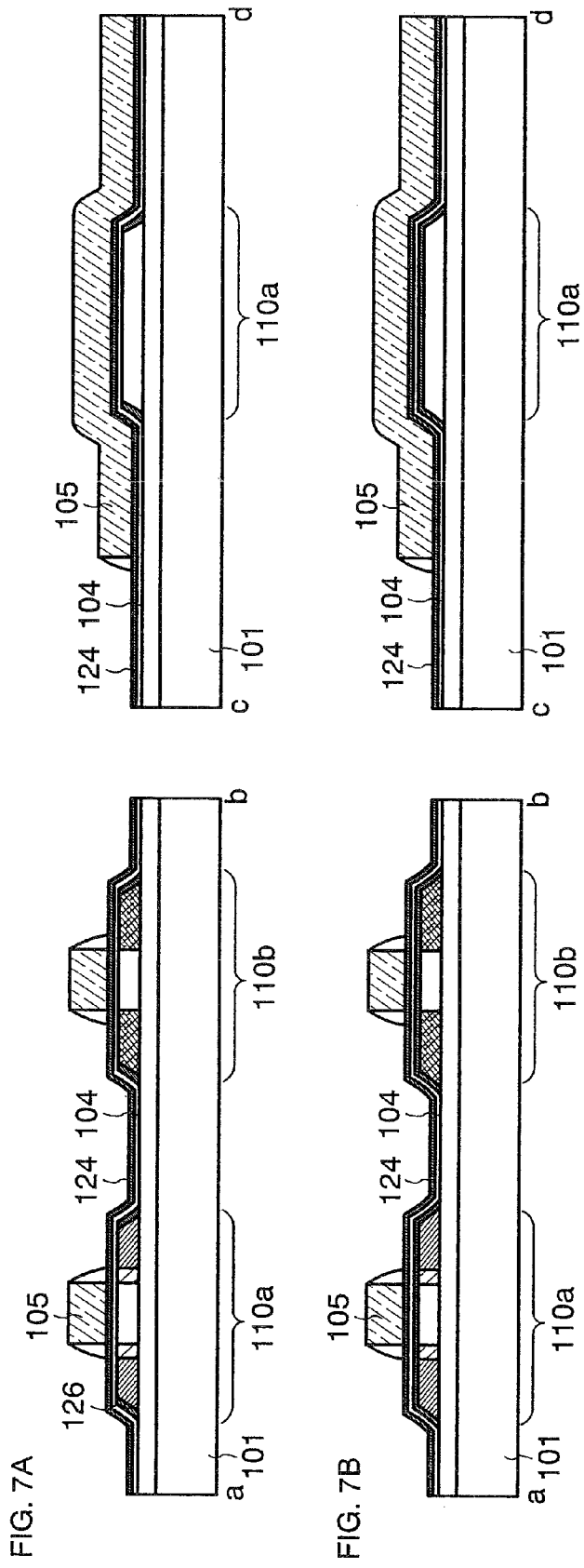

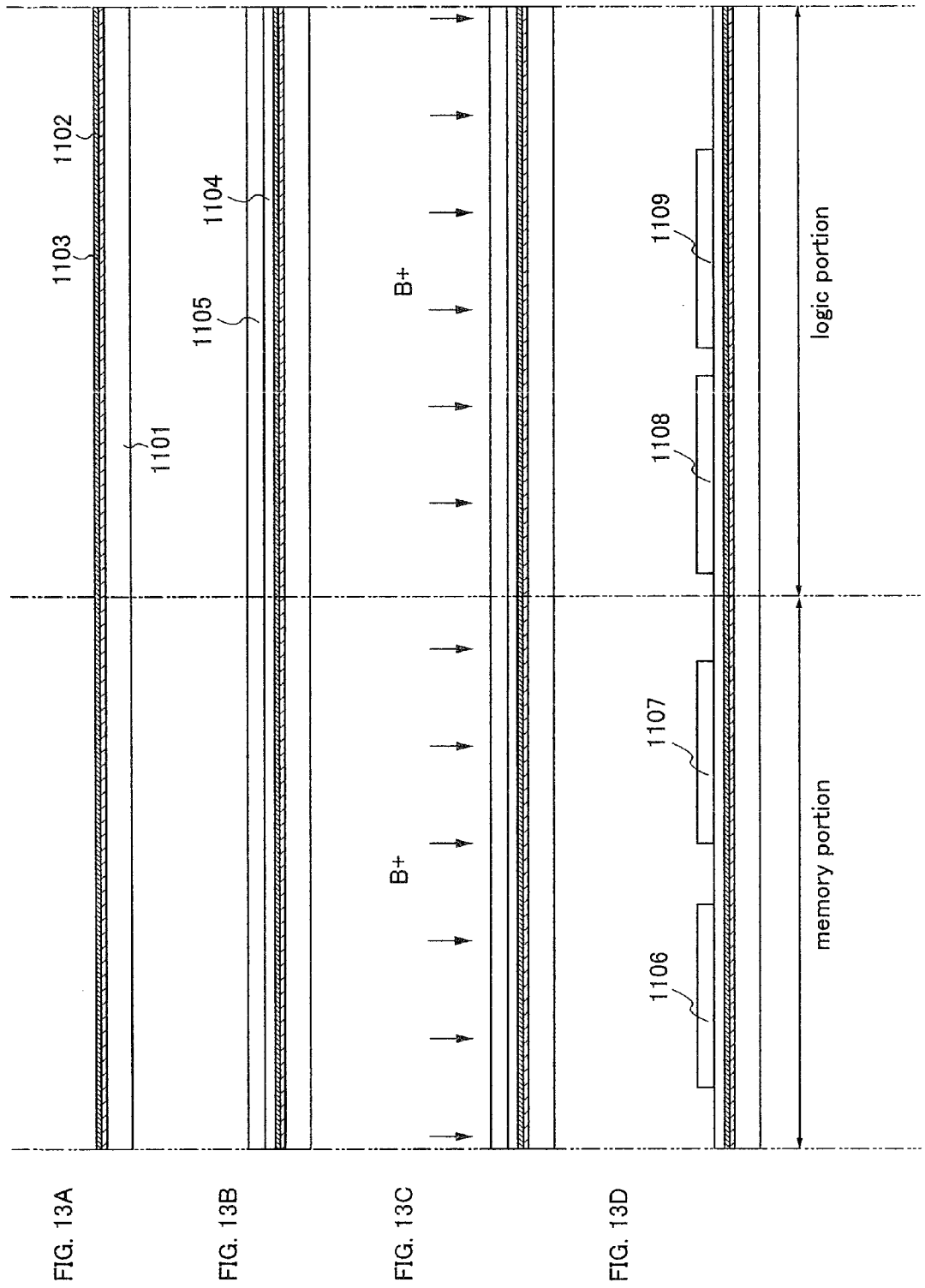

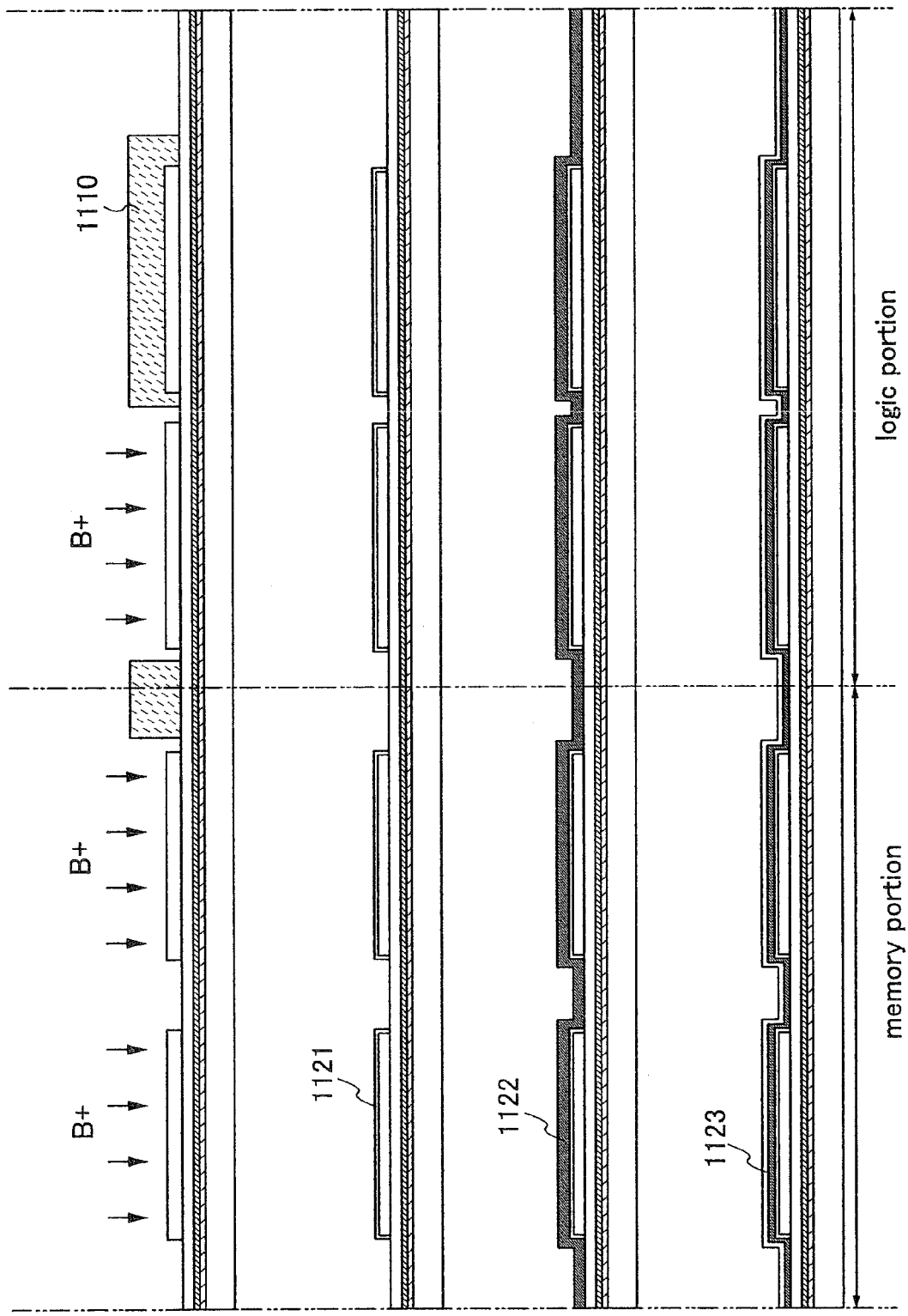

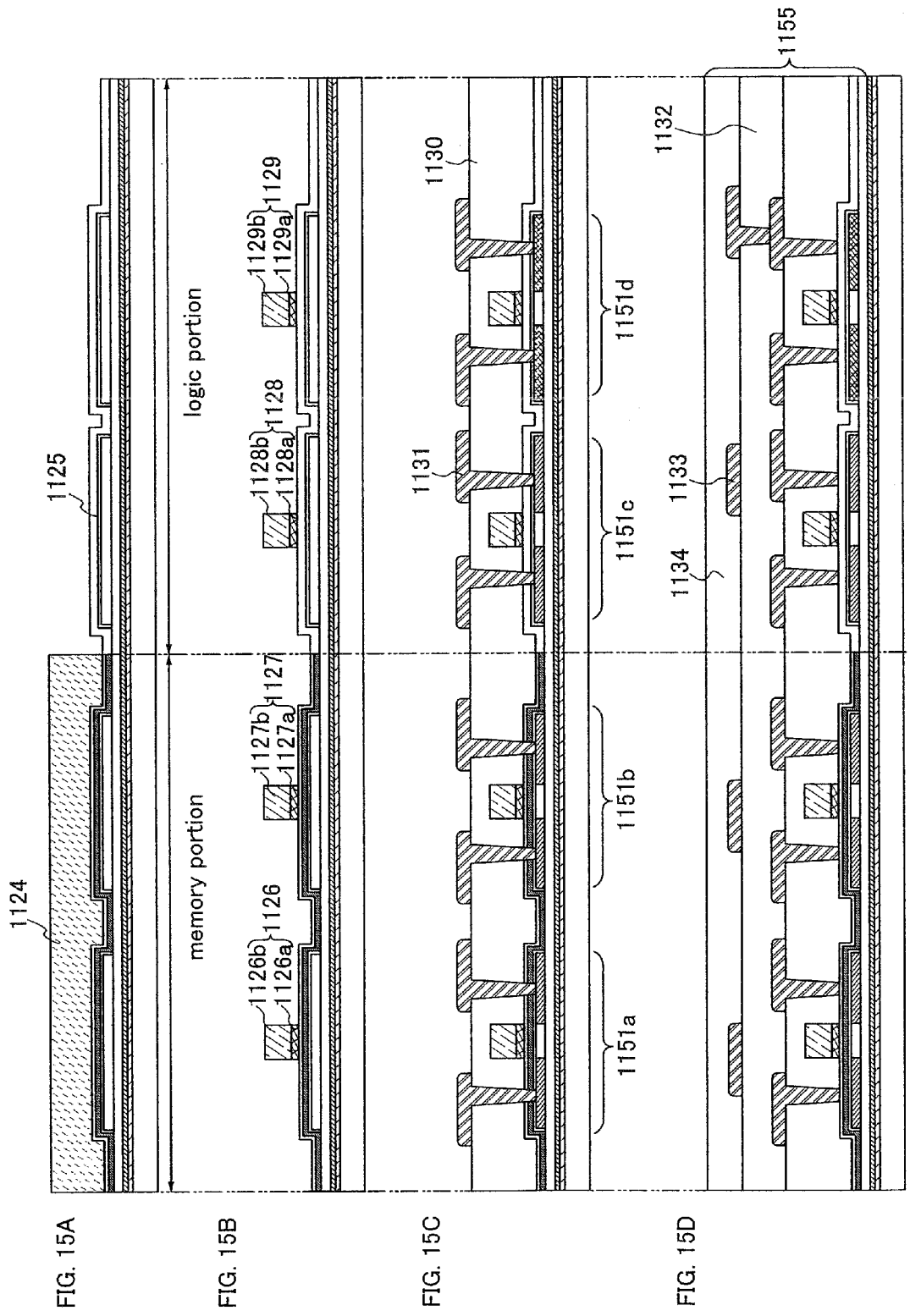

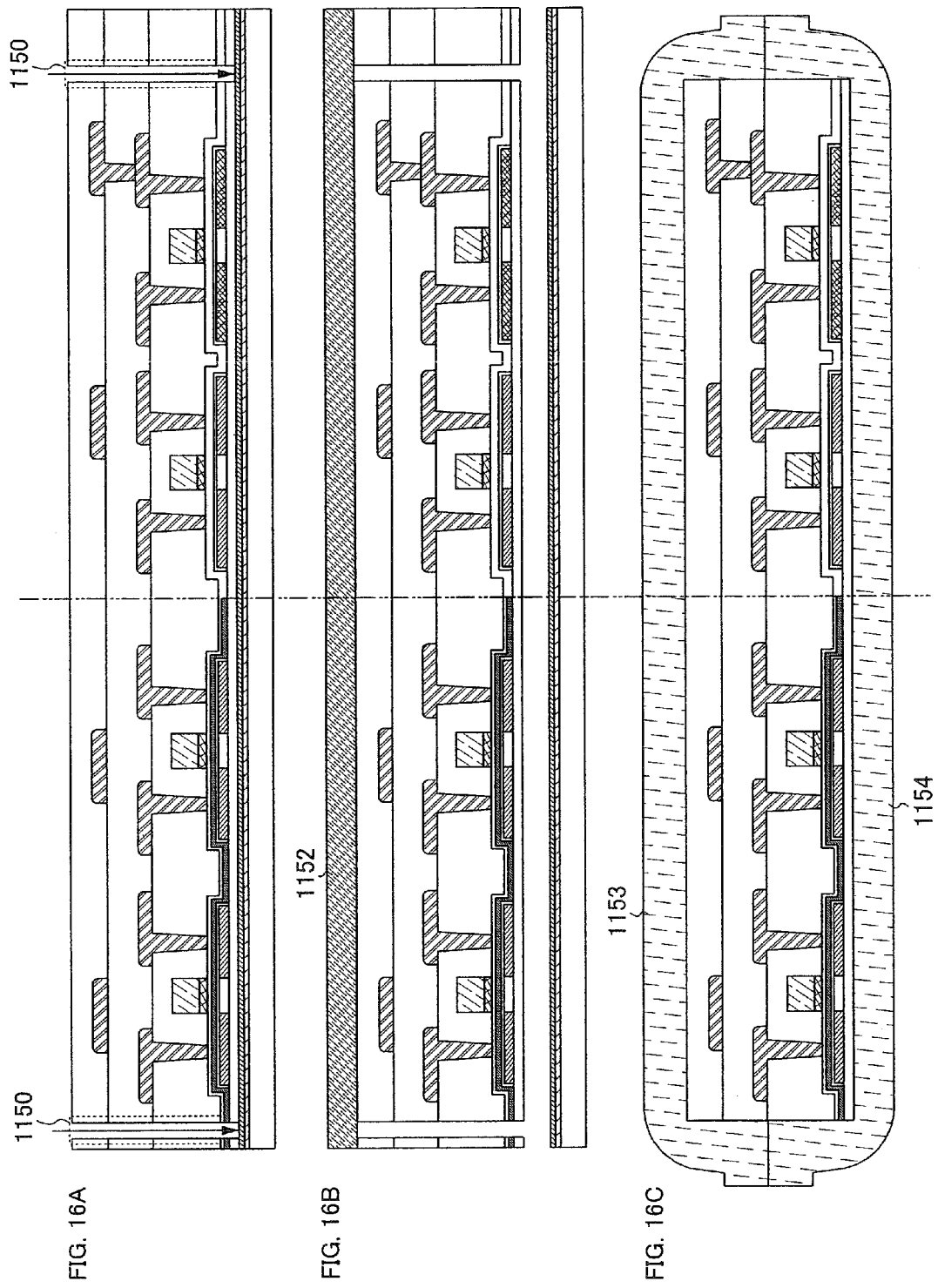

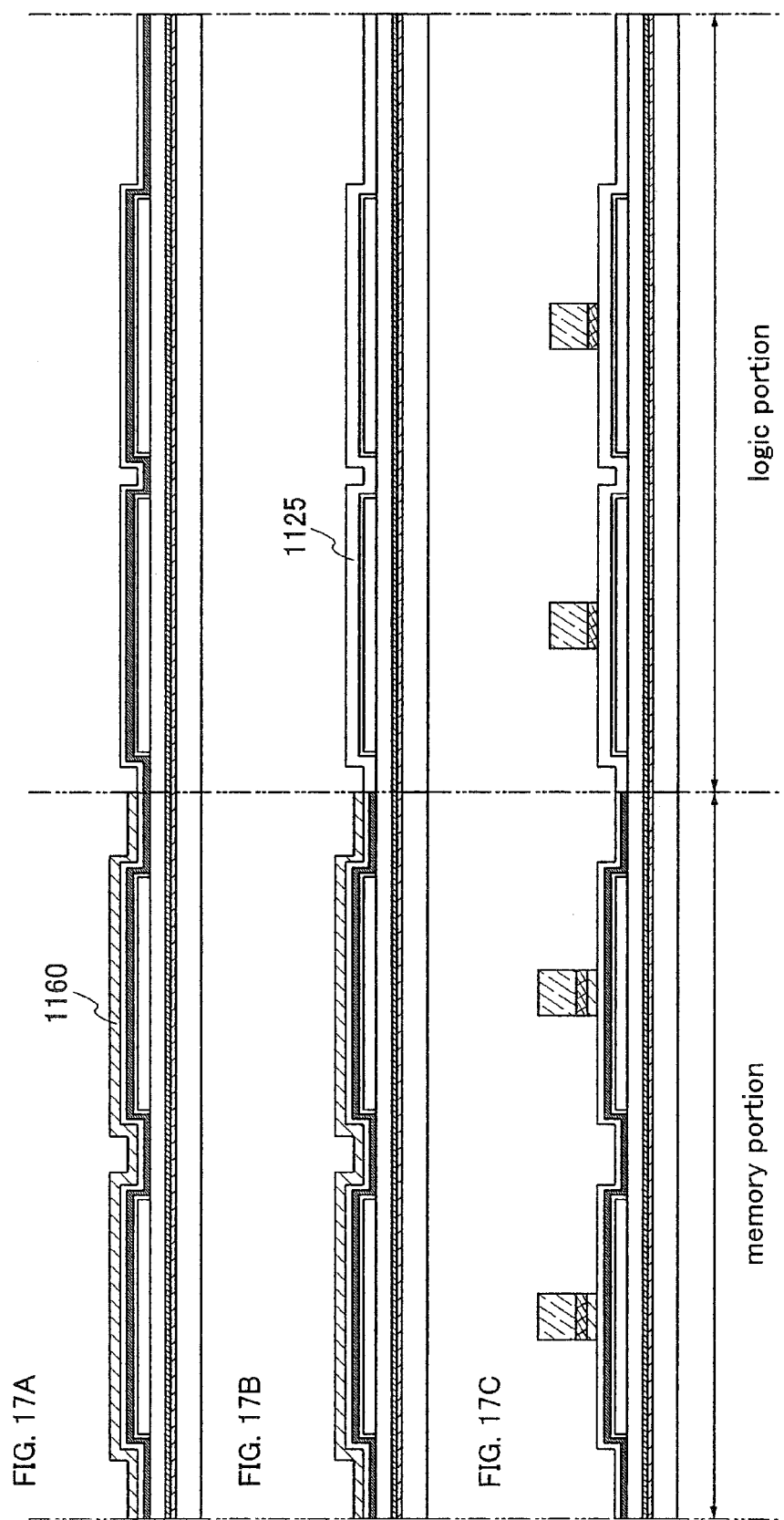

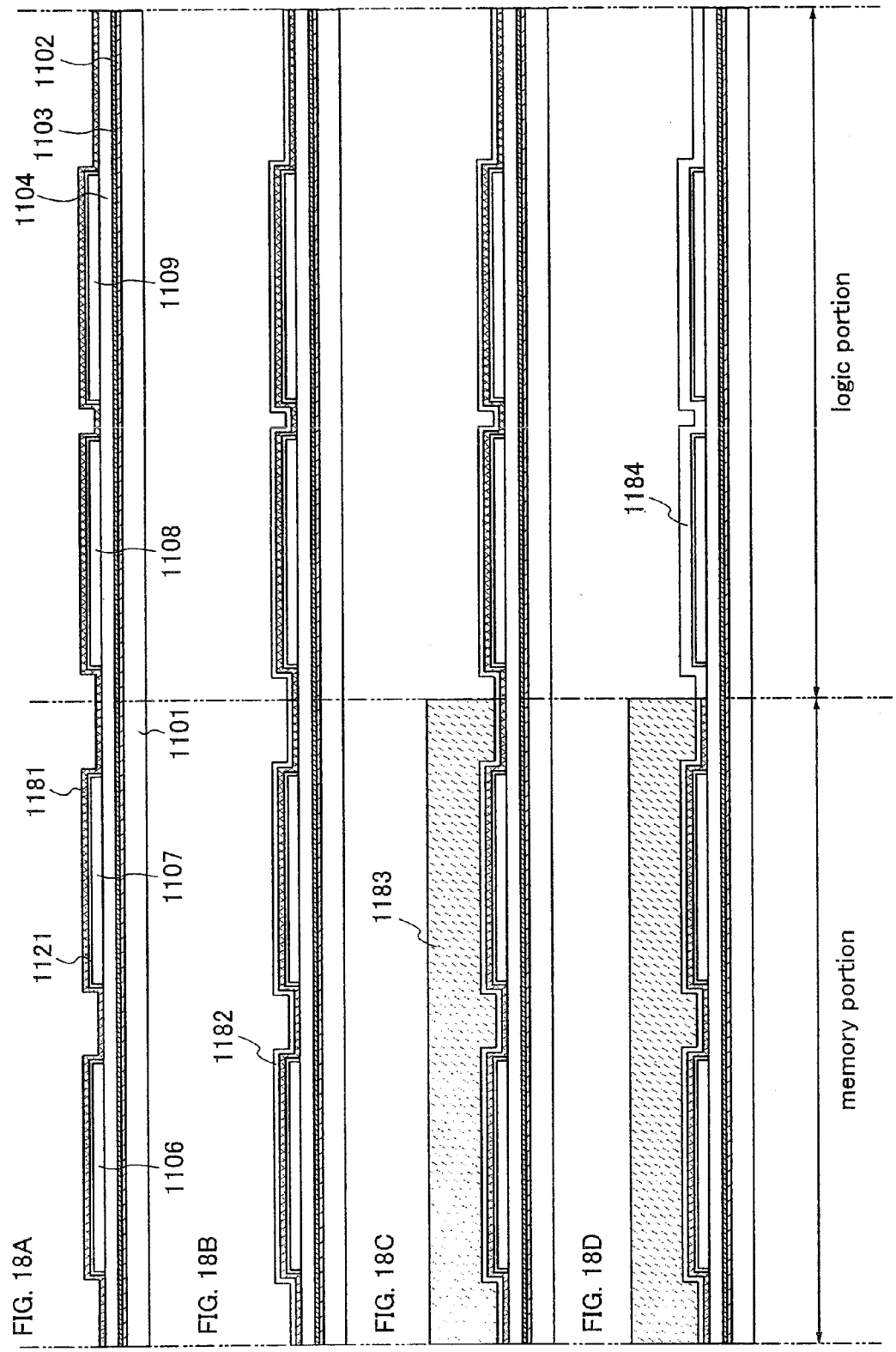

1140   1133   1141

1101
1103
1133
1145

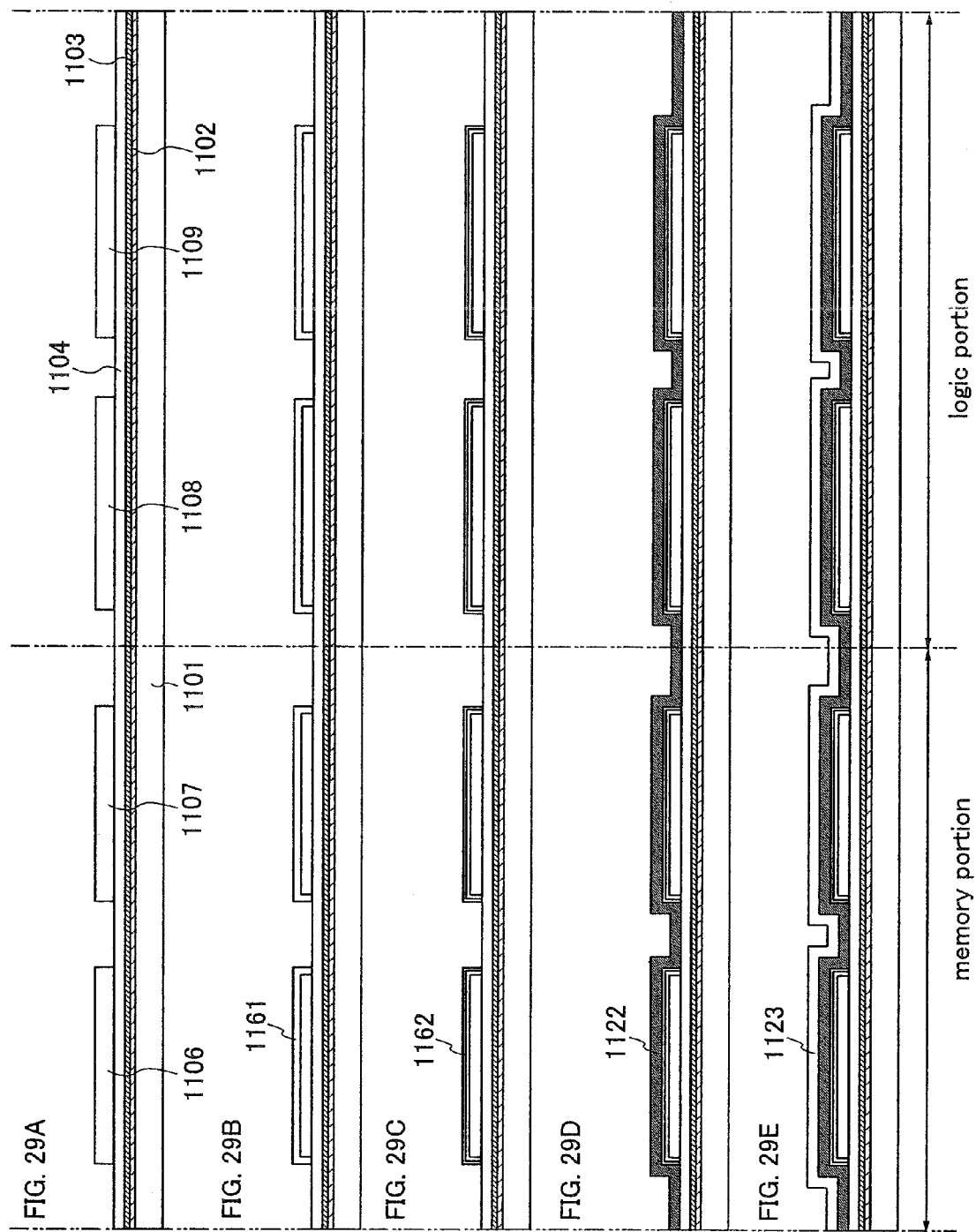

SEMICONDUCTOR DEVICE AND METHOD FOR MANUFACTURING THE SAME

BACKGROUND OF THE INVENTION

1. Field of the Invention

The present invention relates to a semiconductor device having a good-quality film obtained by conducting a plasma treatment to an insulating film or a semiconductor film to improve the quality of the surface, in a case that a conductive film, the insulating film, the semiconductor film and/or the like are/is stacked, and a manufacturing method thereof.

2. Description of the Related Art

In recent years, a technique for forming a thin film transistor (TFT) having a semiconductor thin film (the thickness of several nm to several hundreds nm) formed over a substrate having an insulating surface such as glass has been attracted. Such thin film transistors have been widely applied to semiconductor devices such as ICs or electro optical devices, and further, such thin film transistors have been needed to have a more miniaturized structure, in response to demands for downsizing and high performance of the semiconductor devices. In order to manufacture more miniaturized and higher performance thin film transistors, it is necessary to form a thin insulating film such as a gate insulating film, in addition to conductive films for a gate electrode, source and drain wirings or the like. In general, an insulating film such as a gate insulating film of a thin film transistor is formed by a CVD method or the like (for example, Reference 1: Japanese Patent Laid-Open No. 2001-135824).

SUMMARY OF THE INVENTION

However, an insulating film formed to have a thickness of several nm by a CVD method or a sputtering method has a defect in the film and the film quality is not sufficient. For example, in a case that an insulating film formed by a CVD method is used as a gate insulating film, there is a risk of leakage current or a short circuit between a semiconductor film and a gate electrode. In addition, by a thermal oxidation method, for example, a dense insulating film can be formed by oxidizing a surface of the semiconductor film; however, since in manufacturing a thin film transistor, a low heat resistant substrate such as glass is used on the cost front, it is difficult to employ a thermal oxidation method.

The present invention has been made in view of the problems. It is an object of the present invention to provide a manufacturing method of a semiconductor device by which a denser and less defective film is formed as compared with a film formed by a CVD method, a sputtering method or the like, in a case that a conductive film, an insulating film, a semiconductor film and/or the like are stacked, and such a semiconductor device.

A manufacturing method of a semiconductor device of the present invention includes the steps of: forming a first insulating film over a substrate; forming a semiconductor film over the first insulating film; oxidizing or nitriding the semiconductor film by conducting a plasma treatment to the semiconductor film under a condition of an electron density of $1\times10^{11}$ cm$^{-3}$ or more and $1\times10^{13}$ cm$^{-3}$ or less and an electron temperature of 0.5 eV or more and 1.5 eV or less, using a high frequency wave; forming a second insulating film to cover the semiconductor film; forming a gate electrode over the second insulating film; forming a third insulating film to cover the gate electrode; and forming a conductive film over the third insulating film.

In the above structure of the present invention, the plasma treatment can be conducted to the substrate, the first insulating film, the second insulating film or the third insulating film to be nitrided or oxidized.

In the present invention, oxidation of a semiconductor film or an insulating film by a plasma treatment means that oxygen species such as oxygen radicals or oxygen ions which are activated by a plasma treatment using a high frequency wave is reacted directly with the semiconductor film or the insulating film to conduct oxidation or nitriding. Nitriding of a semiconductor film or an insulating film by a plasma treatment means that nitrogen species such as nitrogen radicals or nitrogen ions which are activated by a plasma treatment using a high frequency wave is reacted directly with the semiconductor film or the insulating film to conduct oxidation or nitriding.

Another manufacturing method of a semiconductor device of the present invention includes the steps of: forming a first insulating film over a substrate; forming a semiconductor film having an end portion with a tapered shape over the first insulating film; oxidizing or nitriding selectively the end portion of the semiconductor film by conducting a plasma treatment to the end portion of the semiconductor film under a condition of an electron density of $1\times10^{11}$ cm$^{-3}$ or more and $1\times10^{13}$ cm$^{-3}$ or less and an electron temperature of 0.5 eV or more and 1.5 eV or less, using a high frequency wave; forming a second insulating film to cover the semiconductor film; forming a gate electrode over the second insulating film; forming a third insulating film to cover the gate electrode; and forming a conductive film over the third insulating film.

One feature of a semiconductor device of the present invention is to have a semiconductor film formed over an insulating surface, a gate electrode provided over the semiconductor film with a gate insulating film interposed therebetween, an insulating film provided to cover the gate electrode, and a conductive film provided over the insulating film, wherein an end portion of the semiconductor film is oxidized and nitrided. In addition, the end portion of the semiconductor film can have a tapered shape.

A semicondcutor film or an insulating film is oxidized or nitrided by a plasma treatment and the surface quality of the semiconductor film or the insulating film is improved, thereby obtaining a dense insulating film. Thus, a semiconductor device having excellent characteristics can be manufactured.

BRIEF DESCRIPTION OF THE DRAWINGS

In the accompanying drawings:

FIGS. 2A to 2D show an example of a manufacturing method of a semiconductor device of the present invention;

FIGS. 3A to 3C show an example of a manufacturing method of a semiconductor device of the present invention;

FIGS. 4A to 4D show an example of a manufacturing method of a semiconductor device of the present invention;

FIGS. 5A to 5D show an example of a manufacturing method of a semiconductor device of the present invention;

FIGS. 6A to 6D show an example of a manufacturing method of a semiconductor device of the present invention;

FIGS. 7A and 7B show an example of a manufacturing method of a semiconductor device of the present invention;

FIGS. 13A to 13D show an example of a manufacturing method of a semiconductor device of the present invention;

FIGS. 14A to 14D show an example of a manufacturing method of a semiconductor device of the present invention;

FIGS. 15A to 15D show an example of a manufacturing method of a semiconductor device of the present invention;

FIGS. 16A to 16C show an example of a manufacturing method of a semiconductor device of the present invention;

FIGS. 17A to 17C show an example of a manufacturing method of a semiconductor device of the present invention;

FIGS. 18A to 18D show an example of a manufacturing method of a semiconductor device of the present invention;

FIGS. 29A to 29E show an example of a manufacturing method of a semiconductor device of the present invention.

DETAILED DESCRIPTION OF THE INVENTION

Figure 1A:
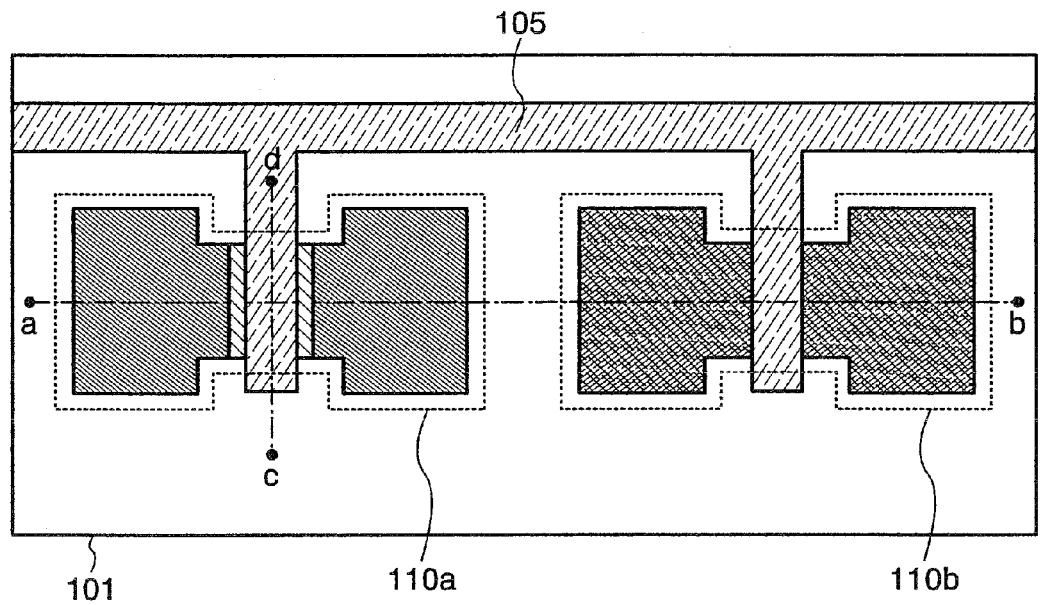
FIGS. 1A to 1C show an example of a semiconductor device of the present invention.

Hereinafter, the embodiment modes of the present invention will be described with reference to the accompanying drawings. The present invention is not limited to the following description, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that in the drawings, the same reference numerals are used for the same portions or the portions having the same functions in some cases.

Figure 1B:
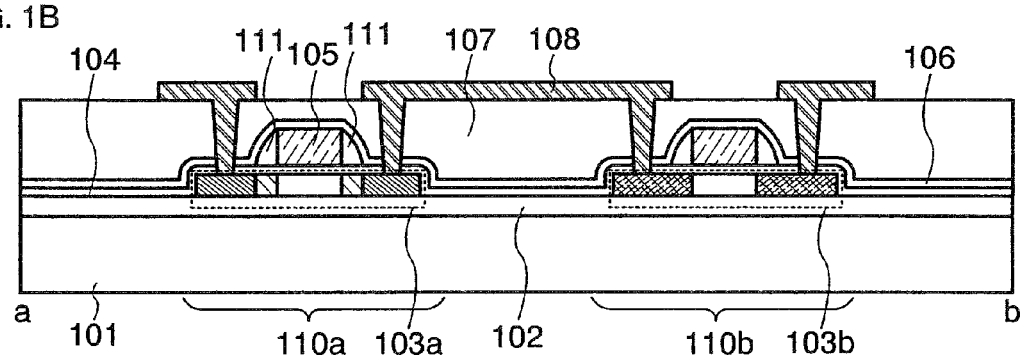
Figure 1C:
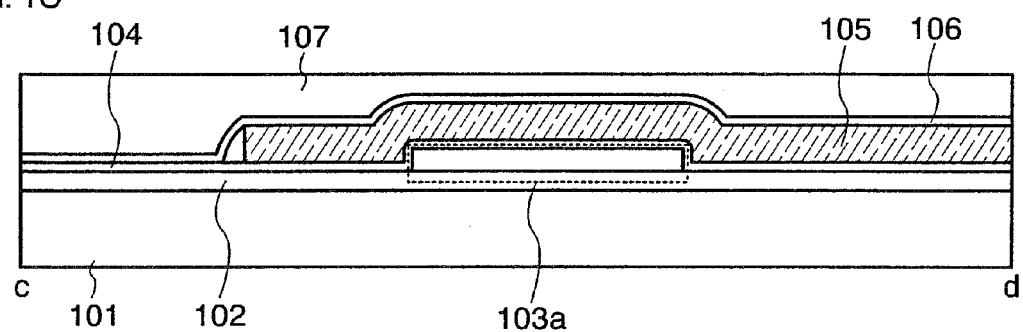

FIGS. 1A to 1C show an example of a semiconductor device of the present invention. As to FIGS. 1A to 1C, FIG. 1B corresponds to a cross-sectional view taken along a-b of FIG. 1A, and FIG. 1C to a cross-sectional view taken along c-d of FIG. 1A.

The semiconductor device shown in FIGS. 1A to 1C includes semiconductor films 103a and 103b provided over a substrate 101 with an insulating film 102 interposed therebetween, a gate electrode 105 provided over the semiconductor films 103a and 103b with a gate insulating film 104, insulating films 106 and 107 provided to cover the gate electrode, a conductive film 108 which is electrically connected to source and drain regions of the semiconductor films 103a and 103b and is provided over the insulating film 107. In FIGS. 1A to 1C, a case is shown that an n-channel thin film transistor 110a using a part of the semiconductor film 103a as a channel forming region and a p-channel thin film transistor 110b using as a part of the semiconductor film 103b as a channel forming region are provided.

As the substrate 101, a glass substrate such as alumino borosilicate glass or barium borosilicate glass, a quartz substrate, a ceramic substrate, a metal substrate including stainless steel or the like can be used. In addition, a substrate formed from plastics typified by polyethylene terephthalate (PET), polyethylene naphthalate (PEN), or polyethersulfone (PES), or a synthetic resin having flexibility such as acrylic can be used. By using a flexible substrate, a foldable semiconductor device can be manufactured. Further, there is no limitation to the area or shape of the substrate when using such a substrate, and thus, a rectangular substrate having one side of 1 meter or more, for example, is used as the substrate 101, so as to enhance the productivity extremely. Such merit is great advantages as compared with a circular silicon substrate.

An insulating film 102 functions as a base film, and it is provided so as to prevent an alkali metal such as Na or an alkaline-earth metal from being dispersed into semiconductor films 103a and 103b from the substrate 101 and from influencing adversely on the characteristics of a semiconductor element. As the insulating film 102, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xOy$) (x>y) can be employed. For example, when providing the insulating film 102 to have a two-layer structure, a silicon nitride oxide film as a first insulating film and a silicon oxynitride film as a second insulating film may be provided. When providing the insulating film 102 to have a three-layer structure, a silicon oxynitride film as a first insulating film, a silicon nitride oxide film as a second insulating film, and a silicon oxynitride film as a third insulating film may be provided.

The semiconductor films 103a and 103b can be formed with an amorphous semiconductor or a semiamorphous semiconductor (SAS). Alternatively, a polycrystalline semiconductor film may be used. An SAS is a semiconductor with an intermediate structure between an amorphous structure and a crystal structure (including a single crystal and a polycrystal). This is a semiconductor having a third condition that is stable in terms of a free energy, and a crystalline region having a short range order and lattice distortion is included therein. A crystalline region of from 0.5 nm to 20 nm can be observed at least in a part of region in the film. When silicon is contained as the main component, Raman spectrum is shifted to a lower wavenumber side less than 520 $cm^{-1}$. Diffraction peak of (111) or (220) to be caused from a crystal lattice of silicon is observed in X-ray diffraction. At least 1 atomic % or more of hydrogen or halogen is contained to terminate a dangling bond. An SAS is formed by carrying out grow discharge decomposition (plasma CVD) on a gas containing silicon. In addition to $SiH_4$, $Si_2H_6$, $SiH_2Cl_2$, $SiHCl_3$, $SiCl_4$, $SiF_4$, or the like can be used for the gas containing silicon. In addition, $GeF_4$ may be mixed. This gas containing silicon may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power frequency ranges from 1 MHz to 120

MHz, preferably from 13 MHz to 60 MHz. A substrate heating temperature may be 300° C. or less. It is desirable that an atmospheric constituent impurity such as oxygen, nitrogen, or carbon is $1\times10^{20}$ cm$^{-1}$ or less as an impurity element in the film, specifically an oxygen concentration is $5\times10^{19}$/cm$^3$ or less, preferably $1\times10^{19}$/cm$^3$ or less. An amorphous semiconductor film is formed by a known method (such as a sputtering method, an LPCVD method, or a plasma CVD method) with a material mainly containing silicon (Si), (e.g., $Si_xGe_{1-x}$, or the like), and is subjected to a known crystallization method such as a laser crystallization method, a thermal crystallization method using RTA or a furnace annealing method, a thermal crystallization method using a metal element promoting crystallization. Thereby, the amorphous semiconductor film is crystallized. As another crystallization method, thermal plasma is generated by applying DC bias and the thermal plasma acts the semiconductor film.

As the gate insulating film 104, a single layer structure or a multilayer structure of insulating films containing nitrogen or oxygen such as silicon oxide ($SiO_x$), silicon nitride ($SiN_x$), silicon oxynitride ($SiO_xNy$) (x>y), silicon nitride oxide ($SiN_xOy$) (x>y) can be employed.

As the insulating film 106, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon) can be employed.

As the insulating film 107, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), a film containing carbon such as DLC (diamond like carbon), or further, an organic material such as epoxy, polyimide, polyamide, poly vinylphenol, benzocyclobutene, or acrylic, a siloxane resin can be employed. The siloxane resin means a resin including a Si—O—Si bond. Siloxane includes a skeleton formed by the bond of silicon (Si) and oxygen (O). An organic group containing at least hydrogen (such as an alkyl group or aromatic hydrocarbon) is included as a substituent. In addition, a fluoro group may be used as the substituent. Further, a fluoro group and an organic group containing at least hydrogen may be used as the substituent. In the semiconductor device shown in FIGS. 1A to 1C, the insulating film 107 can be formed directly to cover the gate electrode 105 without providing the insulating film 106.

For a conductive film 108, a single layer structure or a multilayer structure of an element selected from aluminum (Al), titanium (Ti), tungsten (W), nickel (Ni), carbon (C), molybdenum (Mo), platinum (Pt), copper (Cu), tantalum (Ta), gold (Au), manganese (Mn) or an alloy containing some of the elements can be used. For example, as the conductive film made of an alloy containing some of the elements, an Al alloy including C and Ti, an Al alloy including Ni, an Al alloy including C and Ni, an Al alloy including C and Mn, or the like can be used. In addition, in the case of the multilayer structure, Al and Ti can be stacked.

Figure 26A:
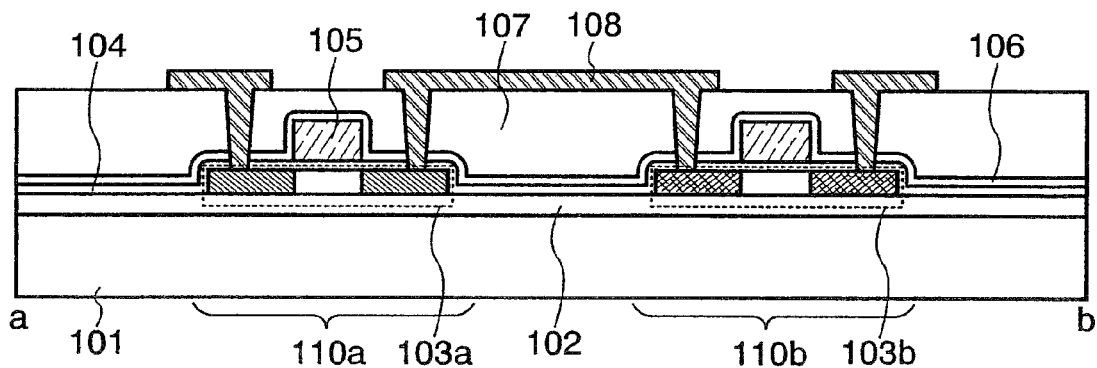
FIGS. 26A to 26C show one example of a semiconductor device of the present invention.
Figure 26B:
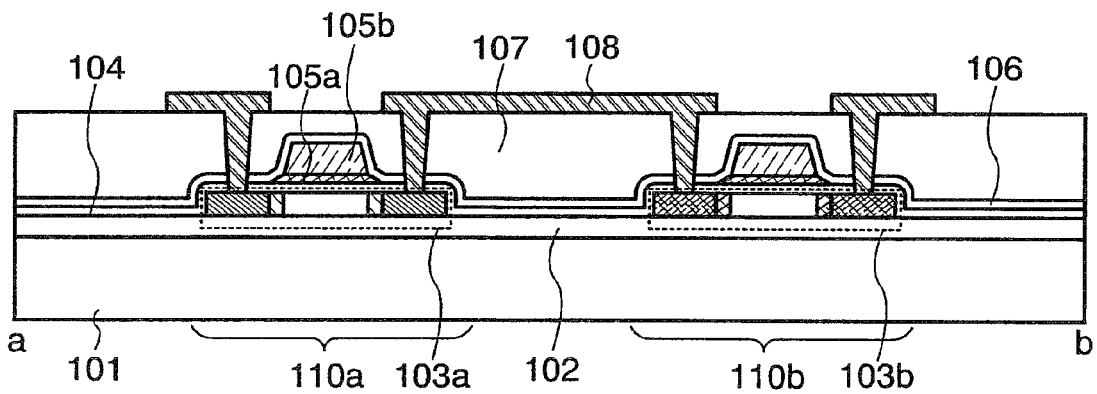
Figure 26C:
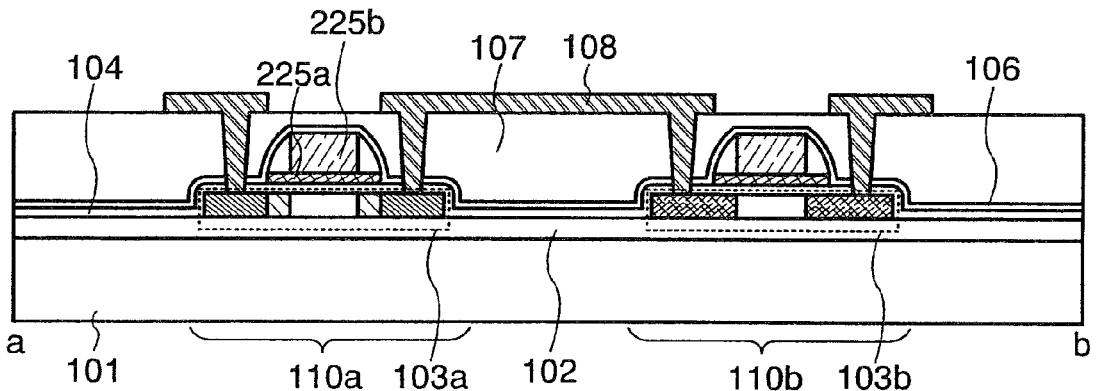

In addition, in FIGS. 1A to 1C, an n-channel transistor 110a has a sidewall 111 in contact with the side surface of the gate electrode 105 and source and drain regions in the semiconductor film 103a and an LDD region under the sidewall region, which are doped selectively with an impurity element imparting an n-type conductivity, are provided. In addition, a p-channel transistor 110b has a sidewall in contact with the side surface of the gate electrode 105 and source and drain regions in the semiconductor film 103b which are doped selectively with an impurity element imparting a p-type conductivity, are provided. It is noted that the structure of a thin film transistor included in a semiconductor device of the present invention is not limited to the above structure. For example, in FIGS. 1A to 1C, an LDD region is provided in the n-channel transistor 110a, and an LDD region is not provided in the p-channel transistor 110b; however, a structure in which LDD regions are provided in both transistors or a structure in which no LDD regions and no sidewalls are provided in both transistors may be employed (FIG. 26A). The structure of the transistor is not limited the above described structure, and a single gate structure having one channel forming region, a double gate structure having two channel forming regions or a multigate structure having three channel forming regions may be adopted. Further, a bottom gate structure or a dual gate structure having two gate electrodes which are provided above and below the channel forming region with the gate insulating film interposed therebetween may be employed. In addition, in a case where the gate electrode has a stacked structure, the first conductive film 105a below the gate electrode, and the second conductive film 105b formed over the first conductive film 105a are provided, and the first conductive film 105a is formed to have a tapered shape. At this time, an impurity region having a lower concentration than the impurity region functioning the source and drain regions can be provided to overlap only the first conductive film may be employed (FIG. 26B). In addition, in the case where the gate electrode has a stacked structure, a structure may be employed in which a first conductive film 225a below the gate electrode, and the second conductive film 225b formed over the first conductive film 225a are provided, and a sidewall is provided to be in contact with the side wall of the second conductive film 225b and over the first conductive film 225a (FIG. 26C). It should be noted that in the above structure, the impurity region functioning the source and drain regions of the semiconductor films 103a and 103b can be provided using a silicide of Ni, Co, W or the like.

It should be noted that at least one layer of the substrate 101, the insulating film 102, the semiconductor film 103a and 103b, the gate insulating film 104, the insulating film 106 and the insulating film 107 is subjected to an oxidation treatment or a nitriding treatment using plasma treatment, thereby oxidizing or nitriding the semiconductor film or the insulating film. As described above, by oxidizing or nitriding the semiconductor film or the insulating film with a plasma treatment, the surface of the semiconductor film or the insulating film is enhanced in its film quality. Thereby, a denser insulating film can be obtained than an insulating film formed by a CVD method or a sputtering method. Therefore, defects such as pin holes generated in a film can be suppressed and the characteristics of a semiconductor device can be enhanced.

A method for manufacturing a semiconductor device using a plasma treatment is described with reference to drawings. Specifically, a case is described, in which a semiconductor device is manufactured by oxidizing or nitriding the substrate 101, the insulating film 102, the semiconductor films 103a and 103b, the gate insulating film 104, an insulating film 106 or an insulating film 107.

Embodiment Mode 1

In Embodiment Mode 1, with reference to drawings, a manufacturing method of a semiconductor device is described, in which a plasma treatment is conducted to the semiconductor films 103a and 103b or the gate insulating film 104 shown in FIGS. 1A to 1C, and an oxidation treatment or a nitriding treatment is conducted to the semiconductor films 103a and 103b or the gate insulating film 104.

This embodiment mode shows a case that island-shaped semiconductor films are provided over the substrate first, and the shape of an end portion of the island-shaped semiconductor film is generally orthogonal.

Island-shaped semiconductor films 103a and 103b are formed on a substrate 101 (FIG. 2A). As to the island-shaped semiconductor films 103a and 103b, an amorphous semiconductor film is formed using a material mainly containing silicon (Si) (e.g., $Si_xGe_{1-x}$ etc.,) over an insulating film 102 which have been formed over the substrate 101, by a sputtering method, an LPCVD method, a plasma CVD method, or the like. Then, the amorphous semiconductor film is crystallized and the semiconductor film is selectively etched. A laser crystallization method, a thermal crystallization method using RTA or a furnace annealing method, a thermal crystallization method using a metal element promoting crystallization, a combination of the methods or the like can be adopted to crystallize the amorphous semiconductor film. In FIGS. 2A to 2D, the angle of the end shapes of the island-shaped semiconductor films 103a and 103b is generally orthogonal ($85° \leq \theta \leq 100°$).

A plasma treatment is conducted to the semiconductor films 103a and 103b to oxide or nitride the semiconductor films 103a and 103b, oxides film or nitride films 121a and 121b (hereinafter, also referred to as insulating films 121a, 121b) are formed on the surface of the semiconductor films 103a and 103b (FIG. 2B). It should be noted that a plasma treatment may be conducted in Ar atmosphere as a pretreatment before oxidizing or nitriding the semiconductor films 103a and 103b.

For example, when Si is used for the semiconductor films 103a and 103b, silicon oxide ($SiO_x$) or silicon nitride ($SiN_x$) is formed as the insulating films 121a and 121b. In addition, after oxidizing the semiconductor films 103a and 103b by a plasma treatment, a plasma treatment may be conducted again to nitride the semiconductor films 103a and 103b. In this case, silicon oxide ($SiO_x$) is formed in contact with the semiconductor films 103a and 103b, and silicon oxynitride ($SiO_xNy$) (x>y) or silicon nitride oxide ($SiN_xOy$) (x>y) is formed on the surface of the silicon oxide.

In the case that the semiconductor films are oxidized by the plasma treatment, the plasma treatment is conducted in an atmosphere including oxygen (e.g., an atmosphere including oxygen ($O_2$) and a rare gas (at least one of He, Ne, Ar, Kr, and Xe); an atmosphere including oxygen, hydrogen ($H_2$) and a rare gas; an atmosphere containing dinitrogen monoxide and a rare gas; or an atmosphere containing dinitrogen monoxide, hydrogen and a rare gas). Meanwhile, in the case that the semiconductor films are nitrided by the plasma treatment, the plasma treatment is conducted in an atmosphere including nitrogen (e.g., an atmosphere including nitrogen ($N_2$) and a rare gas (at least one of He, Ne, Ar, Kr, and Xe); an atmosphere including nitrogen, oxygen and a rare gas; or an atmosphere containing $NH_3$ and a rare gas.

As the rare gas, Ar can be used for example. In addition, a mixed gas of Ar and Kr may be used. The rare gas (a gas including at least one of He, Ne, Ar, Kr, and Xe) used for the plasma treatment is contained in the insulating films 121a and 121b, and in the case of using Ar, Ar is contained in the insulating films 121a and 121b.

In this embodiment mode, in the case that the plasma treatment is conducted so as to oxide the semiconductor films 103a and 103b, a mixed gas of oxygen ($O_2$), hydrogen ($H_2$) and argon (Ar) is introduced. The mixed gas used here may be introduced with 0.1 to 100 sccm of oxygen, 0.1 to 100 sccm of hydrogen and 100 to 5000 sccm of argon. The mixed gas is preferably introduced with the ratio of oxygen:hydrogen: argon=1:1:100. For example, a mixed gas with oxygen of 5 sccm, hydrogen of 5 sccm and argon of 500 sccm may be introduced.

In the oxidation process by the plasma treatment, it is thought that a rare gas is contained in the oxide film. Thus, a sample was formed by a plasma treatment of this process is conducted onto the substrate to form an oxide film. The sample was measured by TXRF. Here, the plasma treatment was conducted using Ar as the rare gas. Consequently, Ar was contained in the oxide film with a concentration of about $1 \times 10^{15}$ to $1 \times 10^{16}$ atoms/cm³. Therefore, the rare gas used in the plasma treatment is contained with almost the same concentration ($1 \times 10^{15}$ to $1 \times 10^{16}$ atoms/cm³).

In addition, in the case of the nitriding treatment by the plasma treatment, a mixed gas of nitrogen ($N_2$) and argon (Ar) is introduced. As the mixed gas used here, nitrogen of 20 to 2000 sccm, and argon of 100 to 10000 sccm may be introduced. For example, nitrogen of 200 sccm and argon of 1000 sccm may be introduced.

In addition, the plasma treatment is conducted with the electron density of $1 \times 10^{11}$ cm⁻³ or more and the electron temperature of plasma of 1.5 eV or less in the atmosphere containing the gases described above. More specifically, the electron density is $1 \times 10^{11}$ cm⁻³ or more and $1 \times 10^{13}$ cm⁻³ or less, and the electron temperature of plasma is 0.5 eV or more and 1.5 eV or less. The electron density of plasma is high and the electron temperature around an object (here, the semiconductor films 103a and 103b) formed over the substrate 101 is low. Thus, plasma damages to the object can be avoided. In addition, since the plasma density is as high as $1 \times 10^{11}$ cm⁻³ or more, the oxide film or the nitride film formed by oxidizing or nitriding the object by the plasma treatment has a superior evenness of film thickness as compared with a film formed by a CVD method, a sputtering method or the like, and thus, can be a dense film. In addition, since the electron temperature of plasma is as low as 1.5 eV or less, the oxidation treatment or the nitriding treatment can be conducted at a lower temperature than a conventional plasma treatment or a thermal oxidation method. For example, the oxidation treatment or the nitriding treatment can be conducted sufficiently even when the plasma treatment is conducted at a lower temperature by at least 100° C. than a strain point of a glass substrate. As the frequency for producing plasma, a high frequency wave such as a micro wave (2.45 GHz) can be employed.

It should be noted that in the present specification, the oxidation treatment or the nitriding treatment by the plasma treatment is conducted under the above described condition, unless otherwise noted.

Next, the gate insulating film 104 is formed to cover the insulating films 121a and 121b (FIG. 2C). The gate insulating film 104 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y). For example, when Si is used for the semiconductor films 103a and 103b, and silicon is oxidized by the plasma treatment, silicon oxide is formed as the insulating films 121a and 121b on the surfaces of the semiconductor films 103a and 103b. In this case, silicon oxide (SiOx) is formed as the gate insulating film 104 over the insulating films 121a and 121b. In addition, when the thickness is made thinner, in FIG. 2B, it is possible that the insulating films 121a and 121b which are formed by oxidizing or nitriding the semiconductor films 103a and 103b by the plasma treatment, are used as the gate insulating films, the gate electrode 105 can be formed over the insulating films 121a and 121b.

Next, by forming the gate electrode 105 or the like over the gate insulating film 104, a semiconductor device can be manufactured, which has an n-channel thin film transistor 110a and a p-channel thin film transistor 110b each using the semiconductor films 103a and 103b located under the gate electrode 105 as channel forming regions, and a p-channel thin film transistor 110b (FIG. 2D).

Before forming the gate insulating film 104 over the semiconductor films 103a and 103b, the surface of the semiconductor films 103a and 103b is oxidized or nitrided by the plasma treatment. Thereby, a short-circuit between the gate electrode and the semiconductor film due to coverage defect of the gate insulating film 104 in the end portions of the channel forming regions 151a, 151b or the like can be prevented. In other words, in the case the angles of the end portions of the island-shaped semiconductor films are generally orthogonal ($85° \leq \theta \leq 100°$), when the gate insulating film is formed to cover the semiconductor films by a CVD method, a sputtering method or the like, there is a risk that coverage defects due to breakage of the gate insulating film, or the like at the end portion of the semiconductor film. However, when the plasma treatment is conducted to the surface of the semiconductor film to oxide or nitride the surface, coverage defects and the like of the gate insulating film at the end portion or the semiconductor film can be prevented.

In FIGS. 2A to 2D, the gate insulating film 104 may be oxidized or nitrided by conducting a plasma treatment after forming the gate insulating film 104. In this case, the gate insulating film 104 is formed to cover the semiconductor film 103a, 103b (FIG. 3A), and a plasma treatment is conducted to the gate insulating film 104 to oxidize or nitride the gate insulating film 104, thereby forming an oxide film or a nitride film 1235 (hereinafter also referred to as an insulating film 123) in the surface of the gate insulating film 104 (FIG. 3B). The condition for the plasma treatment can be similar to those of FIG. 2B. In addition, the insulating film 123 contains a rare gas used in the plasma treatment, for example, in the case of using Ar, Ar is contained in the insulating film 123.

In FIG. 3B, once a plasma treatment is conducted in an atmosphere containing oxygen to oxidize the gate insulating film 104, then a plasma treatment may be conducted in an atmosphere containing nitrogen to nitride the gate insulating film 104. In this case, silicon oxide ($SiO_x$) or silicon oxynitride ($SiO_xN_y$) (x>y) is formed on the semiconductor films 103a and 103b, and a sidewall including silicon oxynitride ($SiO_xN_y$) (x>y) or silicon nitride oxide ($SiN_xO_y$) (x>y) is formed in contact with the gate electrode 105. After that, the gate electrode 105 or the like is formed over an insulating film 123, and a semiconductor device can be manufactured, which has an n-channel thin film transistor 110a and a p-channel thin film transistor 110b each using the semiconductor films 103a and 103b located under the gate electrode 105 as the channel forming regions, and a p-channel thin film transistor 110b (FIG. 3C). In this manner, by conducting the plasma treatment to the gate insulating film, the surface of the gate insulating film is oxidized or nitrided to be enhanced in its film quality. Thus, a dense film can be obtained. The insulating film obtained by the plasma treatment is denser and has fewer defects such as pin holes as compared with an insulating film formed by a CVD method or a sputtering method, and thus, the characteristics of a thin film transistor can be enhanced.

In FIGS. 3A to 3C, the case is described, that the plasma treatment is conducted to the semiconductor films 103a and 103b in advance, and the surface of the semiconductor films 103a and 103b is oxidized or nitrided. However, a method may be employed, in which a plasma treatment is conducted to the gate insulating film 104 after forming the gate insulating film 104 without conducting the plasma treatment to the semiconductor films 103a and 103b. In this manner, by conducting the plasma treatment before forming the gate electrode, even when coverage defects due to breakage of the gate insulating film at the end portion of the semiconductor films, the semiconductor film exposed due to the coverage defects can be oxidized or nitrided, and thus, a short-circuit between the gate electrode and the semiconductor film caused by the coverage defect of the gate insulating film at the end portion of the semiconductor film, or the like can be prevented.

Even when the end portion of the island-shaped semiconductor films are generally orthogonal, the plasma treatment is conducted to the semiconductor film or the gate insulating film to oxidize or nitride the semiconductor film or the gate insulating film, thereby avoiding a short-circuit the gate electrode and the semiconductor film caused by coverage defects of the gate insulating film at the end portion of the semiconductor film.

Next, a case is described, that the end portion of the island-semiconductor film has a tapered shape ($30° \leq \theta \leq 85°$) in the island-shaped semiconductor film provided over the substrate.

The island-shaped semiconductor films 103a and 103b are formed over the substrate 101 first (FIG. 4A). As to the island-shaped semiconductor films 103a and 103b, an amorphous semiconductor films is formed using a material mainly containing silicon (Si) (e.g., $Si_xGe_{1-x}$ etc.,) over an insulating film 102 which have been formed over the substrate 101, by a sputtering method, an LPCVD method, a plasma CVD method, or the like. Then, the amorphous semiconductor film is crystallized and the semiconductor film is selectively etched. A laser crystallization method, a thermal crystallization method using RTA or a furnace annealing method, a thermal crystallization method using a metal element promoting crystallization, a combination of the methods or the like can be adopted to crystallize the amorphous semiconductor film. In FIGS. 4A to 4D, the angle of the end portions of the island-shaped semiconductor films 103a and 103b is tapered ($30° \leq \theta \leq 85°$).

A gate insulating film 104 is formed to cover the semiconductor films 103a and 103b (FIG. 4B). The gate insulating film 104 can be formed to have a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) by a known method (such as a sputtering method, an LPCVD method, or a plasma CVD method).

Then, the gate insulating film 104 is oxidized or nitrided by a plasma treatment, and thus, an oxide film or a nitride film 124 (hereinafter also referred to as an insulating film 124) is formed on the surface of the gate insulating film 104 (FIG. 4C). Note that the condition for the plasma treatment can be similar to those described above. For example, when silicon oxide ($SiO_x$) or silicon oxynitride ($SiO_xN_y$) (x>y) is used as the gate insulating film 104, a plasma treatment is conducted in an atmosphere containing oxygen to oxidize the gate insulating film 104. The film obtained on the surface of the gate insulating film by the plasma treatment is dense and has fewer defects such as pin holes as compared with a gate insulating film formed by a CVD method, a sputtering method or the like. On the other hand, a plasma treatment is conducted in an atmosphere containing nitrogen to nitride the gate insulating film 104, and silicon oxynitride (SiOxNy) (x>y) or silicon nitride oxide ($SiN_xO_y$) (x>y) can be provided as the insulating film 124 on the surface of the gate insulating film 104. In addition, once a plasma treatment is conducted in an atmosphere containing oxygen to oxide the gate insulating film 104, then a plasma treatment may be conducted in an atmosphere containing nitrogen to nitride the gate insulating film 104. In addition, the insulating film 124 contains a rare gas used in the plasma treatment, for example, in the case of using Ar, Ar is contained in the insulating film 124.

A semiconductor device can be manufactured, which has an n-channel thin film transistor 110a and a p-channel thin film transistor 110b each using the semiconductor films 103a and 103b located under the gate electrode 105 by forming the gate electrode 105 or the like over the insulating film 124 (FIG. 4D).

In this manner, by conducting the plasma treatment to the gate insulating film, an insulating film formed with an oxide film or a nitride film is formed on the surface of the gate insulating film, and the surface of the gate insulating film can be enhanced in its film quality. The oxidized or nitrided insulating film by the plasma treatment is denser and has fewer defects such as pin holes as compared with a gate insulating film formed by a CVD method or a sputtering method, and thus, the characteristics of a thin film transistor can be enhanced. Further, it is prevent a short-circuit between the gate electrode and the semiconductor film caused by the coverage defect of the gate insulating film or the like at the end portion of the semiconductor film by forming the end portion of the semiconductor film into a tapered shape. However, by conducting the plasma treatment after forming the gate insulating film, a short-circuit between the gate electrode and the semiconductor film, or the like can be more prevented.

A manufacturing method of a semiconductor device different from that in FIGS. 4A to 4C is described with drawings. Specifically, a case is described, that a plasma treatment is selectively conducted to an end portion of a semiconductor film having a tapered shape.

The island-shaped semiconductor films 103a and 103b are formed over the substrate 101 (FIG. 5A). As to the island-shaped semiconductor films 103a and 103b, an amorphous semiconductor films is formed using a material mainly containing silicon (Si) (e.g., $Si_xGe_{1-x}$ etc.,) over an insulating film 102 which have been formed over the substrate 101, by a sputtering method, an LPCVD method, a plasma CVD method, or the like. Then, the amorphous semiconductor film is crystallized and the semiconductor film is selectively etched using resists 125a and 125b as masks. A laser crystallization method, a thermal crystallization method using RTA or a furnace annealing method, a thermal crystallization method using a metal element promoting crystallization, a combination of the methods or the like can be adopted to crystallize the amorphous semiconductor film.

Next, before removing resists 125a and 125b used for etching the semiconductor film, a plasma treatment is conducted to selectively oxidize or nitride the end portion of the island-shaped semiconductor films 103a and 103b. An oxide film or a nitride film 126 (hereinafter, referred to as an insulating film 126) is formed at each end portion of the semiconductor films 103a and 103b (FIG. 5B). The plasma treatment is conducted under the above described condition. In addition, the insulating film 126 includes a rare gas used in the plasma treatment.

A gate insulating film 104 is formed to cover the semiconductor films 103a and 103b (FIG. 5C). The gate insulating film 104 can be formed in the same manner as described above.

A semiconductor device can be manufactured, which has an n-channel thin film transistor 110a and a p-channel thin film transistor 110b each using the island-shaped semiconductor films 103a and 103b as channel forming regions by forming the gate electrode 105 or the like over the gate insulating film 104 (FIG. 5D).

When the end portion of the semiconductor films 103a and 103b is tapered, the end portion of the channel forming regions 152a and 152b formed in a part of the semiconductor films 103a and 103b are also tapered. Thus, the thickness of the semiconductor film or the gate insulating film is varied as compared with the center portion, and there is a risk that the characteristics of a thin film transistor is adversely affected. Thus, by selectively oxidizing or nitriding the end portion of the channel forming regions by the plasma treatment, an insulating film is formed on the semiconductor film which becomes the end portion of the channel forming region. Thus, the influences on the thin film transistor due to the end portion of the channel forming region can be reduced.

FIGS. 5A to 5D shows the example in which the plasma treatment is conducted to only the end portion of the semiconductor films 103a and 103b for oxidation or nitriding. Needless to say, it is possible that a plasma treatment is also conducted to the gate insulating film 104 for oxidation or nitriding as shown in FIGS. 4A to 4D (FIG. 7A).

Next, a manufacturing method of a semiconductor device is described with reference to drawings. The method is different from the method described above. Specifically, a plasma treatment is conducted to a semiconductor film having a tapered shape.

Island-shaped semiconductor films 103a and 103b are formed over a substrate 101 in the same manner as above (FIG. 6A).

Next, a plasma treatment is conducted to the semiconductor films 103a and 103b to oxidize or nitride the semiconductor films 103a and 103b, oxide films or nitride films 127a and 127b (hereinafter, also referred to as insulating films 127a, 127b) are formed (FIG. 6B). The plasma treatment can be conducted under the above described condition. For example, when Si is used for the semiconductor films 103a and 103b, silicon oxide ($SiO_x$) or silicon nitride ($SiN_x$) is formed as the insulating films 127a and 127b. In addition, after oxidizing the semiconductor films 103a and 103b by a plasma treatment, a plasma treatment may be conducted again to nitride the semiconductor films 103a and 103b. In this case, silicon oxide ($SiO_x$) is formed in contact with the semiconductor films 103a and 103b, and silicon oxynitride ($SiO_xN_y$) (x>y) or silicon nitride oxide ($SiN_xO_y$) (x>y) is formed on the surface of the silicon oxide. In addition, the insulating film 127a and 127b contain a rare gas used for the plasma treatment. By the plasma treatment, the end portions of the semiconductor films 103a and 103b are oxidized or nitrided at the same time.

Next, a gate insulating film 104 is formed to cover the insulating films 127a and 127b (FIG. 6C). As the gate insulating film 104, a single layer structure or a multilayer structure of insulating films containing nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) can be employed. For example, in a case that the semiconductor film 103a and 103b using Si is oxidized by a plasma treatment to form silicon oxide as the insulating films 127a and 127b in the surface of the semiconductor films 103a and 103b, silicon oxide ($SiO_x$) is formed as the gate insulating film 104 over insulating film 127a, 127b.

Next, a gate electrode 105 or the like is formed over the insulating film 127a, 127b, and a semiconductor device can be manufactured, which has an n-channel thin film transistor 110a and a p-channel thin film transistor 110b each using the semiconductor films 103a and 103b located under the gate electrode 105 by forming the gate electrode 105 or the like over the gate insulating film 104 (FIG. 6D).

When the end portions of the semiconductor films 103a and 103b are tapered, the end portions of the channel forming regions 153a and 153b formed in a part of the semiconductor films 103a and 103b are also tapered. Thus, there is a risk that the characteristics of a thin film transistor is affected. Thus, by oxidizing or nitriding the end portions of the channel forming regions as a result of oxidizing or nitriding the semiconductor films by the plasma treatment, the influences on a semiconductor element can be reduced.

In FIGS. 6A to 6D, the example is shown in which only the semiconductor film 103a, 103b are subjected to oxidization or nitriding by a plasma treatment; however, it is possible that a plasma treatment is conducted to the gate insulating film 104 to be oxidized or nitrided as shown in FIGS. 4A to 4D (FIG. 7B). In this case, once a plasma treatment is conducted in an atmosphere containing oxygen to oxide the gate insulating film 104, then a plasma treatment may be conducted in an atmosphere containing nitrogen to nitride the gate insulating film 104. In this case, silicon oxide ($SiO_x$) or silicon oxynitride ($SiO_xN_y$) (x>y) is formed in the semiconductor films 103a and 103b, and silicon oxynitride ($SiO_xN_y$) (x>y) or silicon nitride oxide ($SiN_xO_y$) (x>y) is formed in contact with the gate electrode 105.

In addition, in the above structure, it is possible that hydrogen can be introduced by conducting a plasma treatment in an atmosphere including hydrogen and a rare gas. For example, in FIG. 2D, after conducting activation to repair defects in an impurity region serving a source region or a drain region, a plasma treatment is conducted in the atmosphere including hydrogen and a rare gas, and thus, hydrogen is introduced into the gate insulating film 104. The, in a later step, a heat treatment is conducted at 350 to 450° C. to move hydrogen included in the gate insulating film 104 to the semiconductor films 103a and 103b. Thus, defects such as dangling bonds of the semiconductor films 103a and 103b can be repaired (hydrogen treatment). Here, any material of above-described materials is used for the gate insulating film 104 and hydrogen is introduced thereinto by the plasma treatment to conduct hydrogen treatment. In addition, a plasma treatment is conducted at 350 to 450° C. in an atmosphere including $NH_3$ and a rare gas, hydrogen is introduced into the gate insulating film 104 and at the same time, the surface of the gate insulating film is nitrided to improve the film quality of the surface. In addition, a heat treatment is conducted in the atmosphere including $NH_3$ and a rare gas in the plasma treatment, so that a hydrogen treatment and a nitriding treatment can be conducted at the same time. It should be noted that introduction of hydrogen by the plasma treatment can be conducted freely in combination of the above described steps. The plasma treatment can be conducted under the above described condition.

Figure 25A:
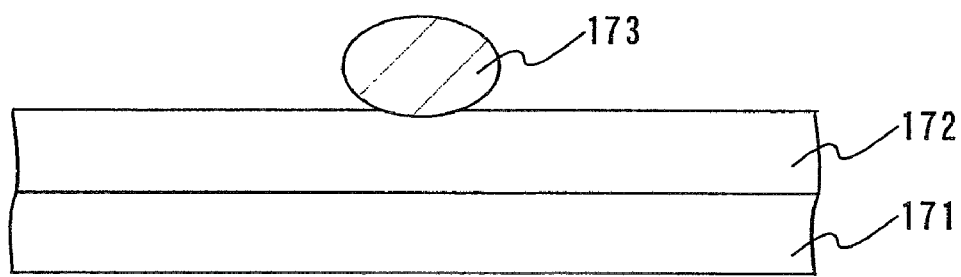
FIGS. 25A and 25B each show one example of a manufacturing method of a semiconductor device of the present invention.
Figure 25B:
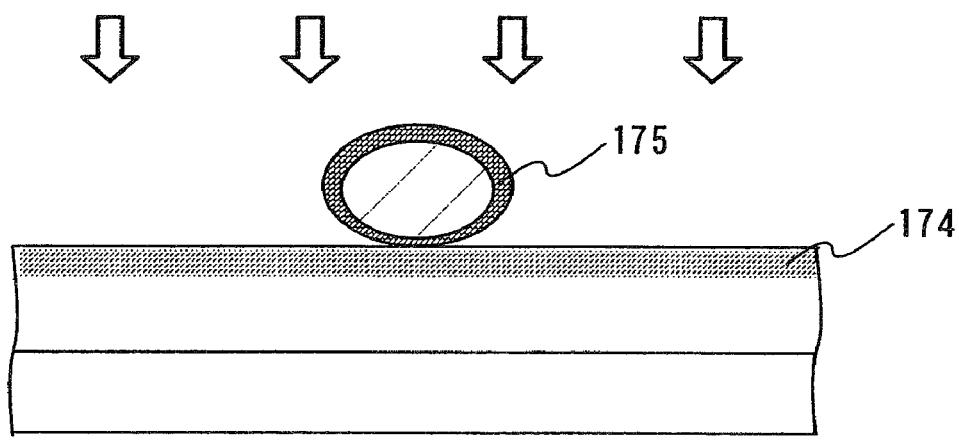

By conducting the plasma treatment in this manner, impurities such as dusts attached to the semiconductor film or the insulating film can be easily removed. In general, in some cases, dusts (also referred to as particles) are attached to the film formed by a CVD method, a sputtering method or the like. For example, as shown in FIG. 25A, a dust is formed over an insulating film 172 formed by a CVD method, a sputtering method or the like, which is formed over a film 171 such as an insulating film, a conductive film or a semiconductor film. In such a case, the insulating film 172 is oxidized or nitrided by the plasma treatment and an oxide film or a nitride film 174 (hereinafter, also referred to as an insulating film 174) is formed on the surface of the insulating film 172. As to the insulating film 174, a portion under the dust 173 as well as a portion in which the dust 173 does not exist is oxidized or nitrided, and thus the volume of the insulating film 174 is increased. On the other hand, the surface of the dust 173 is also oxidized or nitrided by the plasma treatment to form an insulating film 175, and as a result, the volume of the dust 173 is also increased (FIG. 25B).

At this time, the dust 173 can be easily removed from the surface of the insulating film 174 by easy cleaning such as brush cleaning. In this manner, by the plasma treatment, even the minute dust attached to the insulating film or a semiconductor film can be removed easily. It is noted that this is an effect obtained by conducting the plasma treatment, and this is true to other embodiment modes as well as this embodiment mode.

As described above, by improving the film quality of the surface of the semiconductor film or the gate insulating film by oxidation or nitriding by the plasma treatment, a dense and good film quality insulating film can be formed. In addition, dusts etc., attached to the surface of the insulating film can be removed easily by cleaning. Consequently, even when the insulating film is made thinner, defects such as pin holes can be avoided, and miniaturization and higher performance of a semiconductor element such as a thin film transistor can be realized.

Embodiment Mode 2

Embodiment Mode 2 describes a structure of a semiconductor device of the present invention, which is different from that of the described above embodiment mode with reference to drawings.

In this embodiment mode, a plasma treatment is conducted to the substrate 101 or the insulating film 102 shown in FIGS. 1A to 1C. By oxidizing or nitriding the substrate 101 or the insulating film 102, a semiconductor device is manufactured. The method is described with reference drawings.

A case is described with reference to drawings, that the substrate 101 is oxidized or nitrided by conducting a plasma treatment to the substrate 101 first.

Figure 8A:
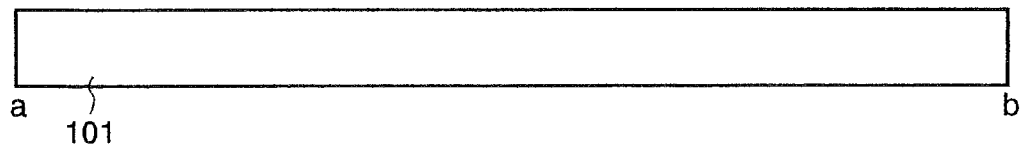
FIGS. 8A to 8E show an example of a manufacturing method of a semiconductor device of the present invention.

The substrate 101 is prepared, and is washed with hydrofluoric acid (HF), alkali or pure water (FIG. 8A). As the substrate 101, a glass substrates such as alumino borosilicate glass or barium borosilicate glass, a quartz substrate, a ceramic substrate, a metal substrate including stainless steel or the like can be used. In addition, a substrate formed from plastics typified by polyethylene terephthalate (PET), polyethylene naphthalate (PEN), or polyethersulfone (PES), or a synthetic resin having flexibility such as acrylic can be used. It is noted that a glass substrate is used as the substrate 101.

Figure 8B:
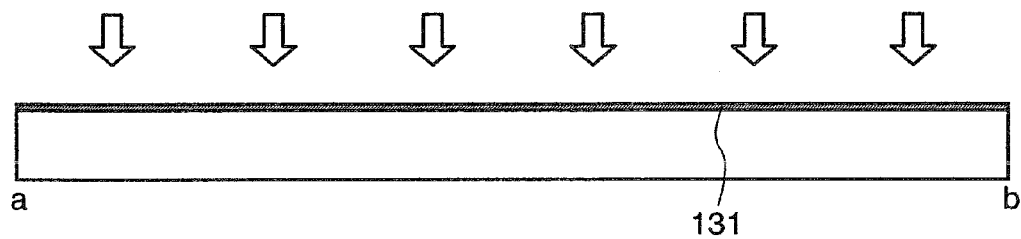

Next, the plasma treatment is conducted such that the substrate 101 is oxidized or nitrided, and an oxide film or a nitride film 131 (hereinafter also referred to as an insulating film 131) is formed on the surface of the substrate 101 (FIG. 8B). In general, when a semiconductor element such as a thin film transistor is formed over glass or plastics, an impurity element such as alkali metal such as Na or an alkaline earth metal included in the glass or plastics is mixed into the semiconductor element and contaminates it, and thus, there is a risk that the characteristics of the semiconductor element is affected adversely. However, by nitriding the surface of the substrate made from glass, plastics or the like, it is provided so as to prevent an alkali metal such as Na or an alkaline-earth metal from being mixed a semiconductor element from the substrate. The plasma treatment can be conducted under the same condition as Embodiment Mode 1. The insulating film 131 includes a rare gas (a gas including at least one of He, Ne, Ar, Kr, and Xe) used in the plasma treatment.

Figure 8C:
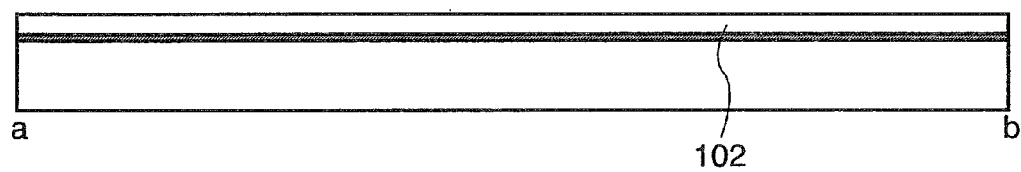

Next, an insulating film 102 serving as a base film is formed over the insulating film 131 (FIG. 8C). As the insulating film 102, a single layer structure or a multilayer structure of insulating films containing nitrogen or oxygen such as silicon oxide (SiOx), silicon nitride (SiNx), silicon oxynitride (SiOxNy) (x>y), or silicon nitride oxide (SiNxOy) (x>y) formed by a sputtering method, an LPCVD method, a plasma CVD method or the like, can be employed. Here, silicon nitride or silicon oxynitride is preferably formed as the insulating film 102 by nitriding the surface of the substrate 101 by a plasma treatment. When a large number of N atoms are included in the insulating film 102, the fixed charge amount is increased, and a semiconductor element such as a thin film transistor formed over the insulating film 102 is affected. In other words, a film including N atoms is needed to prevent an impurity element from mixing into the element from the substrate 101; however, when the number of films including N atoms is too large, the characteristics of the semiconductor element is affected. Thus, in FIGS. 8A to 8E, the surface of the substrate 101 is nitrided and silicon oxide or silicon oxynitride is formed over the nitrided film.

Figure 8D:
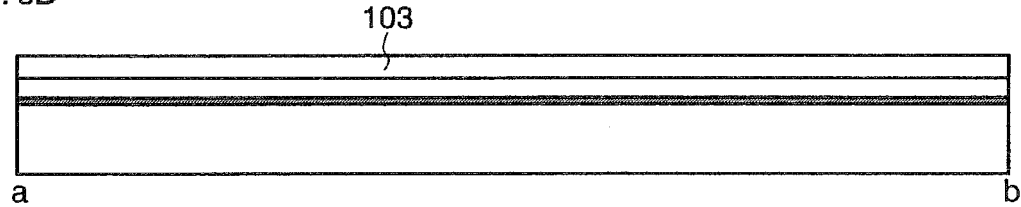

A semiconductor film 103 is formed over the insulating film 102 (FIG. 8D). The semiconductor film 103 is formed using a material mainly containing silicon (Si) (e.g., $Si_xGe_{1-x}$ etc.,) or the like by a sputtering method, an LPCVD method, a plasma CVD method or the like. The insulating film 102 and the semiconductor film 103 are formed by a CVD method sequentially. It is possible to prevent impurities from mixing into the semiconductor film 103 by forming sequentially the insulating film 102 and the semiconductor film 103 without being exposed to the air.

Figure 8E:
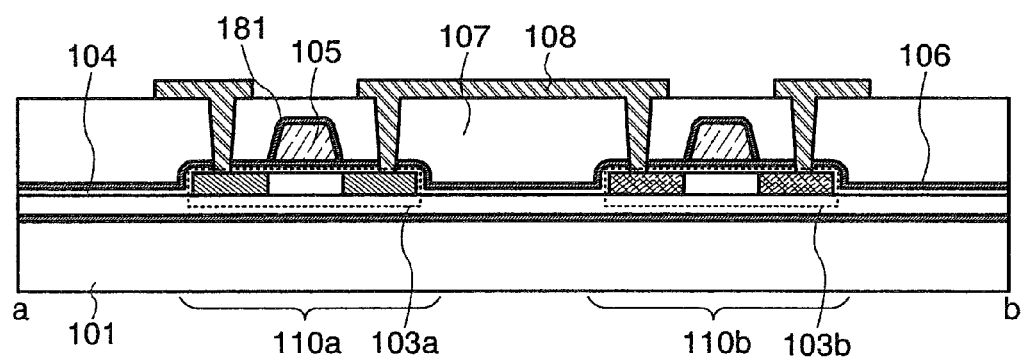

Next, by selectively etching the semiconductor film 103 to form island-shaped semiconductor films 103a and 103b, and a semiconductor device can be manufactured, which has an n-channel thin film transistor 110a and a p-channel thin film transistor 110b each using the semiconductor films 103a and 103b as channel forming regions (FIG. 8E). Note that a glass substrate is used as the substrate 101, and a plasma treatment is conducted in an atmosphere including nitrogen to nitride the surface of the glass substrate and a nitride film 131 is formed. Over the nitride film 131, silicon (SiOx) is formed as the insulating film 102, and the semiconductor films 103a and 103b are formed over the insulating film 102. Silicon oxide is formed to cover the semiconductor films 103a and 103b as the gate insulating film 104. The gate insulating film 104 is nitrided in an atmosphere including nitrogen by the plasma treatment. After that, a gate electrode 105 is formed from Mo, W, Cr, Ta, Ni or the like by a known method such as a sputtering method, and the plasma treatment is conducted in the atmosphere including nitrogen to nitride the surface of the gate electrode 105. For example, as the gate electrode 105, a nitride film of Mo 181 is formed on the surface of Mo in the case where the gate electrode 105 is formed of Mo. In this case, Mo is easily oxidized; however, the plasma treatment is conducted in an atmosphere including nitrogen to nitride the surface of Mo, thereby preventing oxidation of Mo.

In this manner, by oxidizing or nitriding the surface of the substrate 101 by the plasma treatment, it is possible to prevent an impurity element such as alkali metal such as Na or an alkaline earth metal included in the substrate from mixing into the semiconductor element and contaminating it.

A forming method of the insulating film 102 formed over the substrate 101 processed by the plasma treatment is described with reference to drawings. It should be noted that two forming methods of the insulating film 102 is shown in FIGS. 9A to 9E and FIGS. 10A to 10E.

Figure 9A:
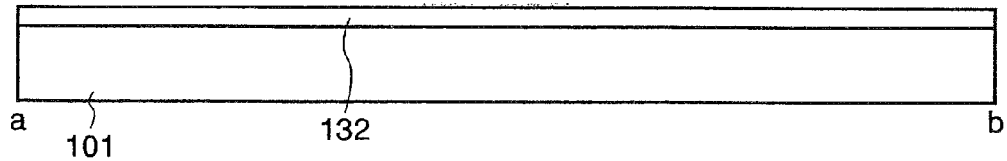
FIGS. 9A to 9E show an example of a manufacturing method of a semiconductor device of the present invention.

An insulating film 132 is formed over the substrate 101 by a known method (a sputtering method, an LPCVD method, or a plasma CVD method) (FIG. 9A). As the insulating film 132, silicon oxide ($SiO_x$) or silicon oxynitride ($SiO_xN_y$) (x>y) is used.

Figure 9B:
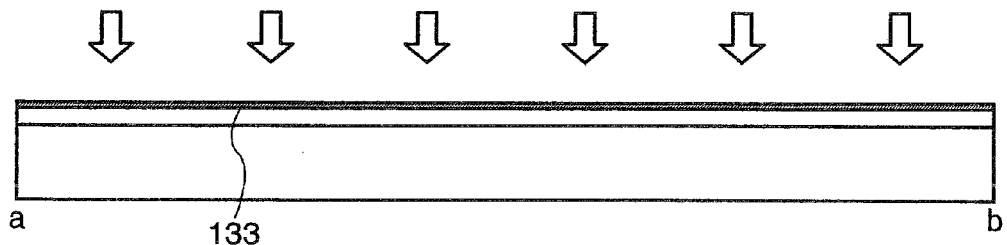

By oxidizing or nitriding the insulating film 132 by a plasma treatment to form an oxide film or a nitride film 133 (hereinafter, also referred to as the insulating film 133) in the surface of the insulating film 132 (FIG. 9B). Here, the plasma treatment is conducted in an atmosphere including nitrogen (an atmosphere including nitrogen ($N_2$) and a rare gas, or an atmosphere including $NH_3$ and a rare gas) to nitride the surface of the insulating film 132. Thus, silicon nitride oxide ($SiN_xO_y$) (x>y) is formed as an insulating film 133 in the surface of the insulating film 132. In addition, the insulating film 133 contains a rare gas (a gas including at least one of He, Ne, Ar, Kr, and Xe) used in the plasma treatment, for example, in the case of using Ar, Ar is contained in the insulating film 133. The plasma treatment is conducted in the same way under the above described condition.

Figure 9C:
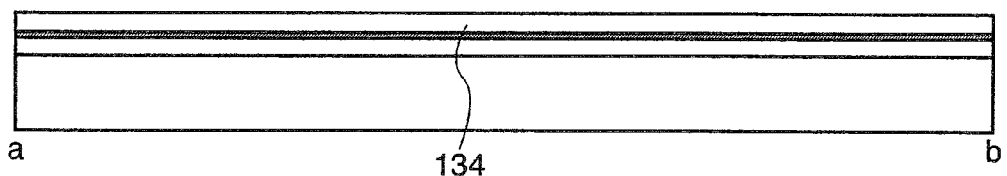

An insulating film 134 is formed by using a sputtering method, an LPCVD method, a plasma CVD method or the like over the insulating film 133 (FIG. 9C). As the insulating film 134, silicon oxide ($SiO_x$) or silicon oxynitride ($SiO_xN_y$) (x>y) is adopted.

Figure 9D:
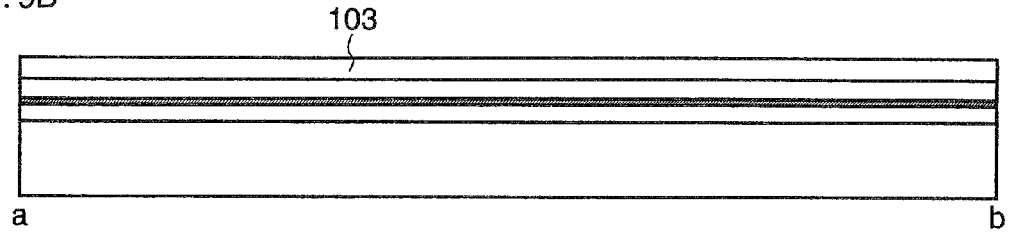

A semiconductor film 103 is formed over the insulating film 134 (FIG. 9D). The semiconductor film 103 is formed using a material mainly containing silicon (Si) (e.g., $Si_xGe_{1-x}$ etc.,) or the like by a sputtering method, an LPCVD method, a plasma CVD method or the like. The insulating film 134 and the semiconductor film 103 are formed by a CVD method sequentially. It is possible to prevent impurities from mixing into the semiconductor film 103 by forming sequentially the insulating film 134 and the semiconductor film 103 without being exposed to the air.

Figure 9E:
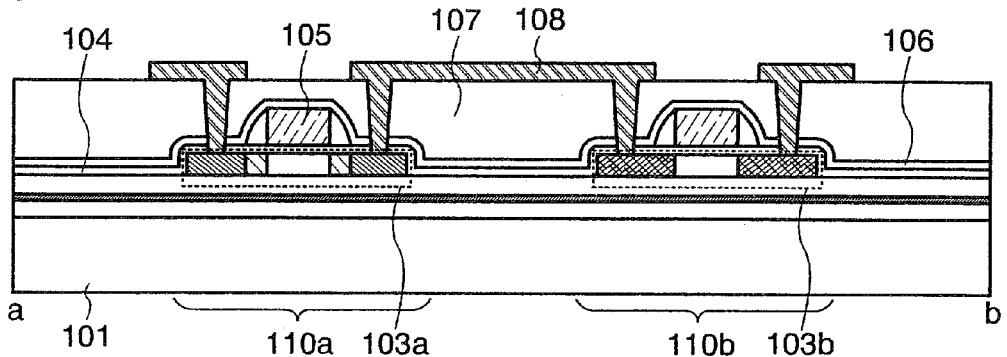

Next, by selectively etching the semiconductor film 103 to form island-shaped semiconductor films 103a and 103b, and a semiconductor device can be manufactured, which has an n-channel thin film transistor 110a and a p-channel thin film transistor 110b each using the island-shaped semiconductor films 103a and 103b as channel forming regions (FIG. 9E).

In this manner, a plasma treatment is conducted to oxidize or nitride the insulating film serving as a base film such that the surface has an improved quality. The thusly film obtained by the plasma treatment is dense and has fewer defects such as pin holes as compared with an insulating film formed by a CVD method, a sputtering method or the like. In addition, it is possible to prevent an impurity element such as alkali metal such as Na or an alkaline earth metal included in the substrate 101 from mixing into the semiconductor element and contaminating it. Thus, the characteristics of a semiconductor element such as a thin film transistor can be improved.

A manufacturing method of the insulating film 102, which is different from that in FIGS. 9A to 9E, is described.

Figure 10A:
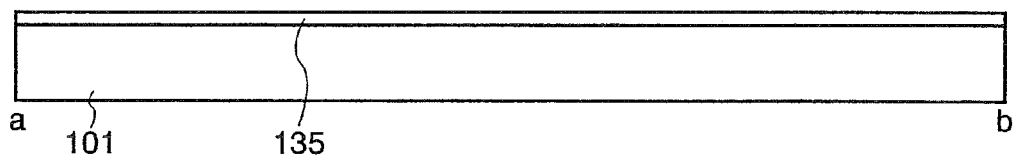
FIGS. 10A to 10E show an example of a manufacturing method of a semiconductor device of the present invention.

An insulating film 135 is formed over the substrate 101 by a sputtering method, an LPCVD method, a plasma CVD method or the like (FIG. 10A). As the insulating film 135, silicon nitride ($SiN_x$) or silicon nitride oxide ($SiN_xO_y$) (x>y) is used.

Figure 10B:
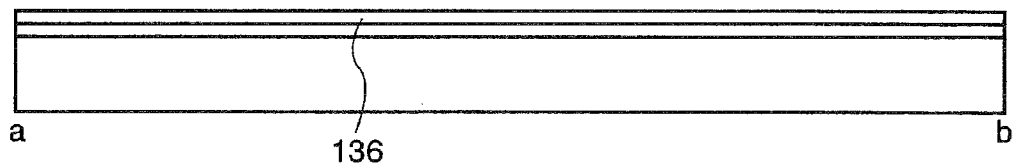

An insulating film 136 is formed by a sputtering method, an LPCVD method, a plasma CVD method or the like over the insulating film 133 (FIG. 10B). As the insulating film 136, silicon oxide ($SiO_x$) or silicon oxynitride ($SiO_xN_y$) (x>y) is adopted.

Figure 10C:
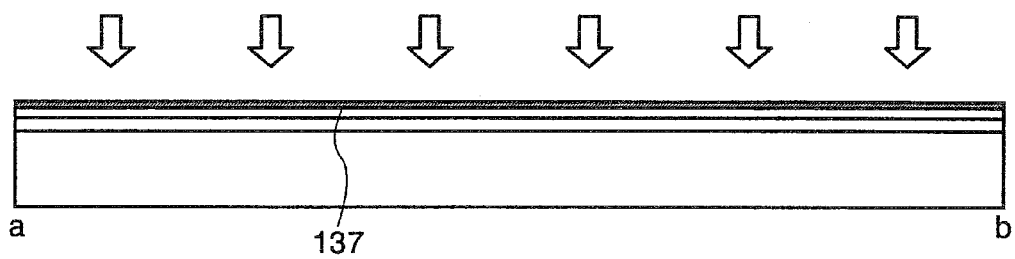

By oxidizing or nitriding the insulating film 136 by the plasma treatment to form an oxide film or a nitride film 137 (hereinafter, also referred to as the insulating film 137) on the surface of the insulating film 136 (FIG. 10C). Here, a plasma treatment is conducted to oxidize the insulating film to 136 form an oxide film on the surface of the insulating film 136. By oxidizing the surface of the insulating film 136, the surface of the insulating film 136 is improved in film quality and a dense film with fewer defects such as pin holes can be obtained. Further, by oxidizing the surface of the insulating film 136, an insulating film 137 whose content of N atoms is small can be formed, and thus, the interface characteristics between an insulating film 137 and the semiconductor film are improved, in the case of forming the semiconductor film over the insulating film 137. In addition, the insulating film 137 contains a rare gas (a gas including at least one of He, Ne, Ar, Kr, and Xe) used in the plasma treatment. The plasma treatment is conducted in the same way under the above described condition.

Figure 10D:
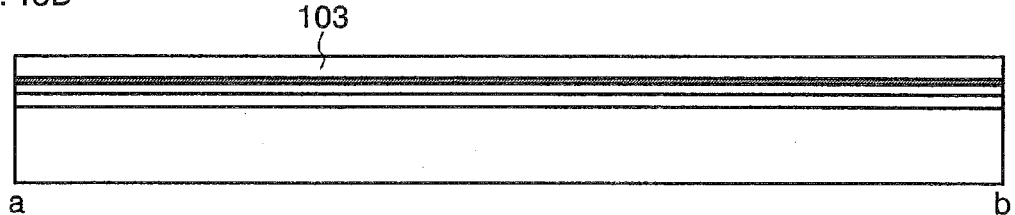

Next, a semiconductor film 103 is formed over the insulating film 137 (FIG. 10D). The semiconductor film 103 is formed using a material mainly containing silicon (Si) (e.g., $Si_xGe_{1-x}$ etc.,) or the like by a sputtering method, an LPCVD method, a plasma CVD method or the like.

Figure 10E:
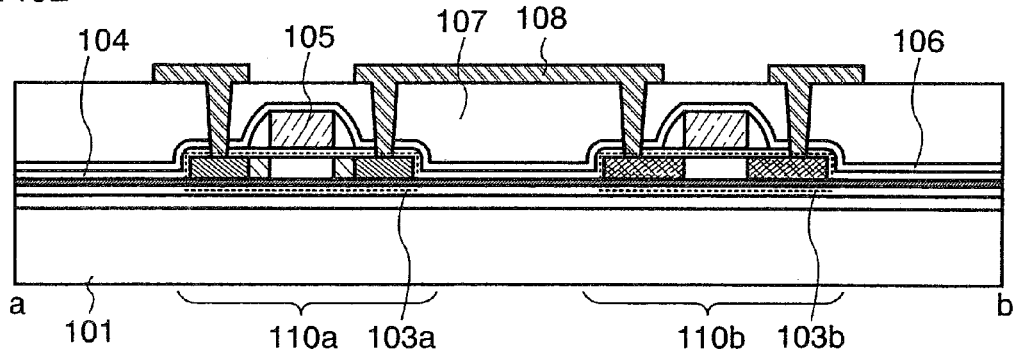

Next, by selectively etching the semiconductor film 103 to form island-shaped semiconductor films 103a and 103b, a semiconductor device can be manufactured, which has an n-channel thin film transistor 110a and a p-channel thin film transistor 110b each using the semiconductor films 103a and 103b as channel forming regions (FIG. 10E).

In this manner, a plasma treatment is conducted to oxidize or nitride the insulating film serving as a base film such that the surface has an improved quality. The thusly obtained film by the plasma treatment is dense and has fewer defects such as pin holes as compared with an insulating film formed by a CVD method, a sputtering method or the like.

This embodiment mode can be freely combined with the embodiment modes described above. In other words, the present invention includes all combinations such as a free combination of the structure shown in Embodiment Mode 2 and the structure shown in Embodiment Mode 1.

Embodiment Mode 3

Embodiment Mode 3 describes another structure of a semiconductor device of the present invention which is different from those of the above embodiment modes with reference to drawings.

This embodiment mode describes a case that a plasma treatment is conducted to the insulating film 106 or the insulating film 107 shown in FIGS. 1A to 1C to oxide or nitride the insulating film 106 or the insulating film 107 with reference to drawings.

Figure 11A:
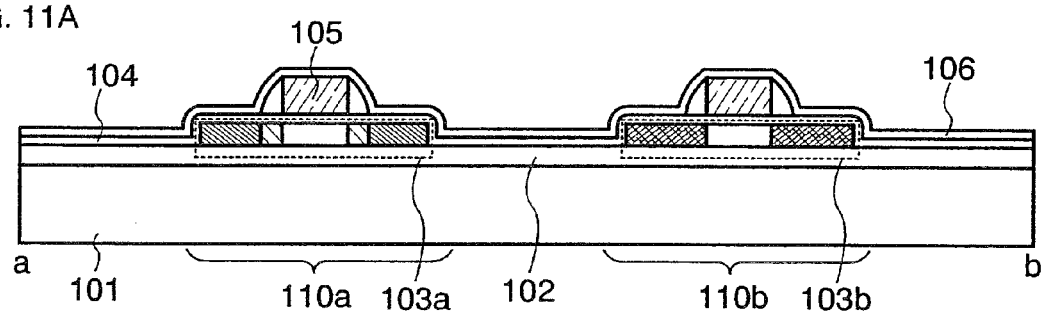
FIGS. 11A to 11D show an example of a manufacturing method of a semiconductor device of the present invention.

Island-shaped semiconductor films 103a and 103b are provided over a substrate 101 with an insulating film 102 interposed therebetween, and a gate electrode 105 is formed over the semiconductor film 103a, 103b with a gate insulating film 104 interposed therebetween, and an insulating film 106 is formed to cover the gate electrode 105 by a sputtering method, an LPCVD method, a plasma CVD method or the like (FIG. 11A).

Figure 11B:
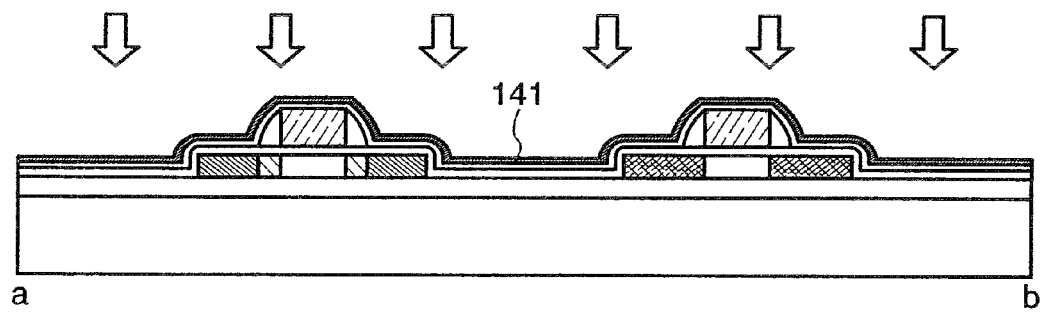

Next, a plasma treatment is conducted to oxide or nitride the insulating film 106, and thus, an oxide film or a nitride film 141 (hereinafter, also referred to an insulating film 141) is formed on the surface of the insulating film 106 (FIG. 11B). As the insulating film 106, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon) can be employed. In other words, a plasma treatment is conducted to an insulating film containing oxygen or nitrogen such as silicon oxide ($SiO_x$), silicone nitride ($SiN_x$), silicon oxynitride ($SiO_xN_y$) (x>y), or silicon nitride oxide ($SiN_xO_y$) (x>y), or a film containing carbon such as DLC (diamond like carbon) to oxidize or nitride the surface thereof. Thus, the insulating film 141 contains a rare gas (a gas including at least one of He, Ne, Ar, Kr, and Xe) used in the plasma treatment, for example, in the case of using Ar, Ar is contained in the insulating film 141.

In addition, without being limited to the above structure, hydrogen can be introduced into the insulating film 106 by the plasma treatment. In this case, as shown in FIG. 11A, after forming the insulating film 106 to cove the gate electrode, a plasma treatment may be conducted to introduce hydrogen to the insulating film 106. The plasma treatment is conducted in an atmosphere including hydrogen and a rare gas under the above described condition. The plasma treatment is conducted to the insulating film 106 in the atmosphere including $NH_3$ and a rare gas to introduce hydrogen into the insulating film 106, and further, to nitride the surface of the insulating film 106. After introducing hydrogen into the insulating film 106 by the plasma treatment in the atmosphere including hydrogen and a rare gas, a plasma treatment may be conducted in an atmosphere including nitrogen to nitride the surface of the insulating film. In a later step, a heat treatment is conducted at 350 to 450° C. to conduct a hydrogen treatment so that defects such as dangling bonds of the semiconductor films 103a and 103b can be repaired. In addition, the heat treatment is conducted at 350 to 450° C. in the atmosphere including $NH_3$ and a rare gas in the plasma treatment, so that a hydrogen treatment and a nitriding treatment can be conducted at the same time. Here, as the insulating film 106, silicon oxide ($SiO_x$), silicon nitride ($SiN_x$), silicon oxynitride ($SiO_xN_y$) (x>y), silicon nitride oxide ($SiN_xO_y$) (x>y), or the like is used, and hydrogen is introduced into the insulating film 106 by the plasma treatment to conduct a hydrogen treatment. As the rare gas, Ar can be used.

Figure 11C:
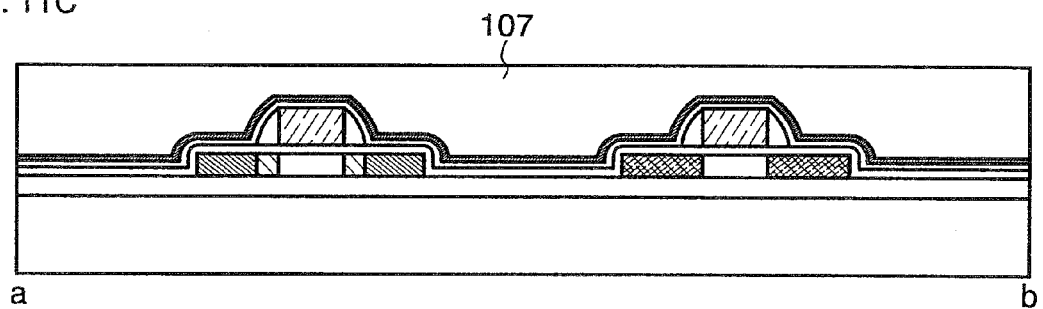

An insulating film 107 is formed to cover the insulating film 141 by a sputtering method, an LPCVD method, a plasma CVD method or the like (FIG. 11C).

Figure 11D:
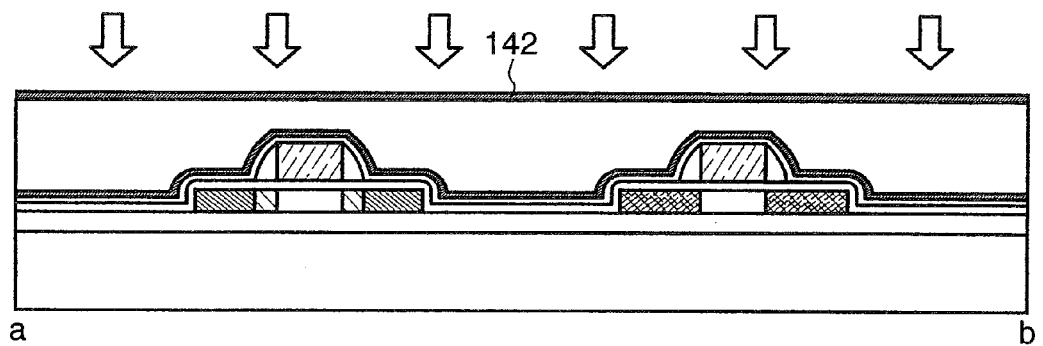

The insulating film 107 is oxidized or nitrided by the plasma treatment, and thus, an oxide film or a nitride film 142 (hereinafter, an insulating film 142) is formed in on the surface of the insulating film 107 (FIG. 11D). As the insulating film 107, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon), further, an organic material such as epoxy, polyimide, polyamide, poly vinylphenol, benzocyclobutene, or acryl, or a siloxane resin can be employed. The siloxane resin means a resin including a Si—O—Si bond. Siloxane includes a skeleton formed by the bond of silicon (Si) and oxygen (O). An organic group containing at least hydrogen (such as an alkyl group or aromatic hydrocarbon) is included as a substituent. In addition, a fluoro group can be used as the substituent. Further, a fluoro group and an organic group containing at least hydrogen may be used as the substituent. In addition, the insulating film 142 contains a rare gas (a gas including at least one of He, Ne, Ar, Kr, and Xe) used in the plasma treatment, for example, in the case of using Ar, Ar is contained in the insulating film 142.

As the insulating film 107, an organic material such as polyimide, polyamide, poly vinylphenol, benzocyclobutene, or acryl, a siloxane resin or the like is used. At this time, by oxidizing or nitriding the surface of the insulating film 107 by the plasma treatment, the film quality of the insulating film can be improved. By the surface modification, the strength of the insulating film 107 is increased and physical damages can be reduced, such as crack occurrence or film reduction in etching when forming an opening portion or the like. In addition, when the surface of the insulating film 107 is modified, the adhesiveness with a conductive film is improved when forming the conductive film over the insulating film 107. For example, in the case of nitriding the insulating film 107 formed of a siloxane resin by a plasma treatment, the surface of the siloxane resin is nitrided to form an insulating film containing nitrogen or a rare gas, and thus, the physical strength can be increased.

In addition, in forming an opening portion in the insulating film, a plasma treatment can be conducted to oxidize or nitride a side surface of the opening portion of the insulating film. As to this case, description is made with reference to drawings.

Figure 27A:
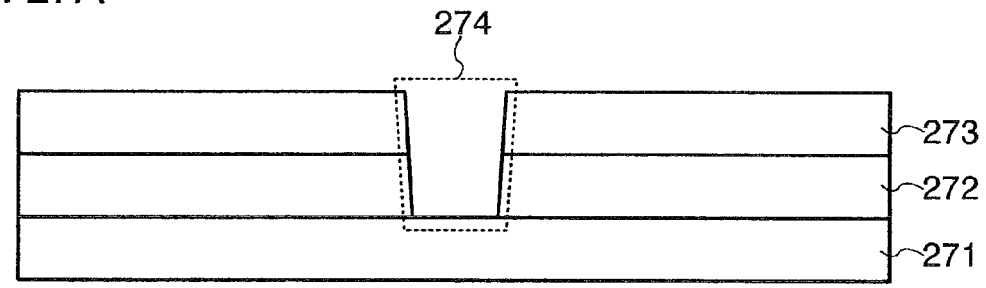
FIGS. 27A to 27D show an example of a manufacturing method of a semiconductor device of the present invention.

An opening portion 274 is formed in an insulating film 272 provided over a film 271 by using a resist 273 as a mask (FIG. 27A). As to the film 271, any film can be used as long as an opening portion can be formed in an insulating film provided over the film 271, for example, a semiconductor film such as Si, a conductive film such as copper (Cu), aluminum (Al), or titanium (Ti), a silicide of Ni, Co, W or the like can be applied. In addition, as the insulating film 272, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon), further, an organic material such as epoxy, polyimide, polyamide, poly vinylphenol, benzocyclobutene, or acryl, or a siloxane resin can be employed. Before providing the opening portion 274, a plasma treatment may be conducted to the insulating film 272 in an atmosphere containing oxygen or in an atmosphere containing nitrogen to oxidize or nitride the surface of the insulating film 272.

Figure 27B:
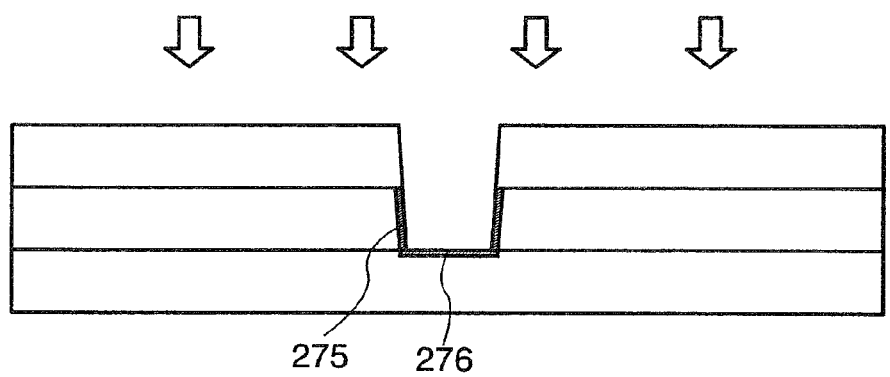

The plasma treatment is conducted in an atmosphere containing oxygen or an atmosphere containing nitrogen to oxidize or nitride the side surface of the insulating film 272 in the opening portion 274. Thus, an oxide film or a nitride film 275 (hereinafter, referred to as an insulating film 275) is formed. In addition, the surface of the film 271 is also oxidized or nitrided by the plasma treatment, and an oxide film or a nitride film 276 (hereinafter, an insulating film 276) is formed. Here, a plasma treatment is conducted in an atmosphere containing nitrogen to nitride the side surface of the insulating film 272 (FIG. 27B).

Figure 27C:
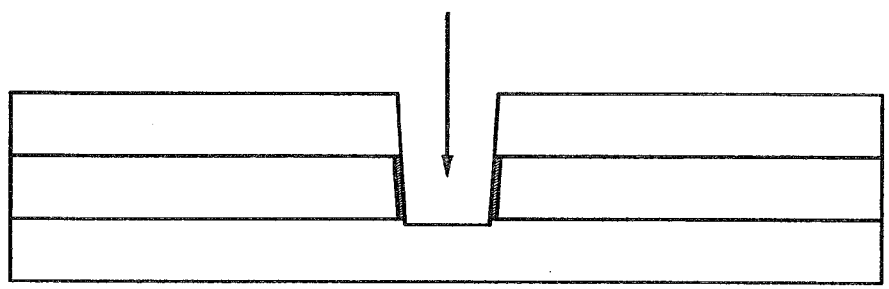

Next, the insulating film 276 made of the oxide film or the nitride film formed in the film 271 is selectively removed by anisotropic etching (FIG. 27C).

Figure 27D:
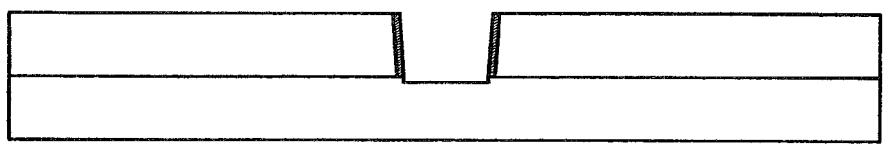

By removing the resist 273, the insulating film 275 is obtained as a result of nitriding the side surface of the insulating film 272 in the opening portions 274 (FIG. 27D).

As described above, by oxidizing or nitriding the side surface of the insulating film in the opening portion by the plasma treatment, an oxide film or a nitride film is formed on the side of the insulating film to improve the film quality of the surface. Thus, the strength is increased to prevent cracks or the like from occurring. In addition, as the result of the surface modification of the insulating film in the opening portion, the adhesion between the insulating film and a conductive film is increased, in the case of forming the conductive film in the opening portion.

This embodiment mode can be freely combined with the above mentioned embodiment modes. In other words, the present invention includes all combinations such as a free combination of the structure shown in Embodiment Mode 3 and the structure shown in Embodiment Mode 1 or 2.

Embodiment Mode 4

Embodiment Mode 4 describes a manufacturing method of a semiconductor device in which a film formation of an insulating film, a conductive film or a semiconductor film and a plasma treatment is conducted continuously with reference to drawings.

Figure 12A:
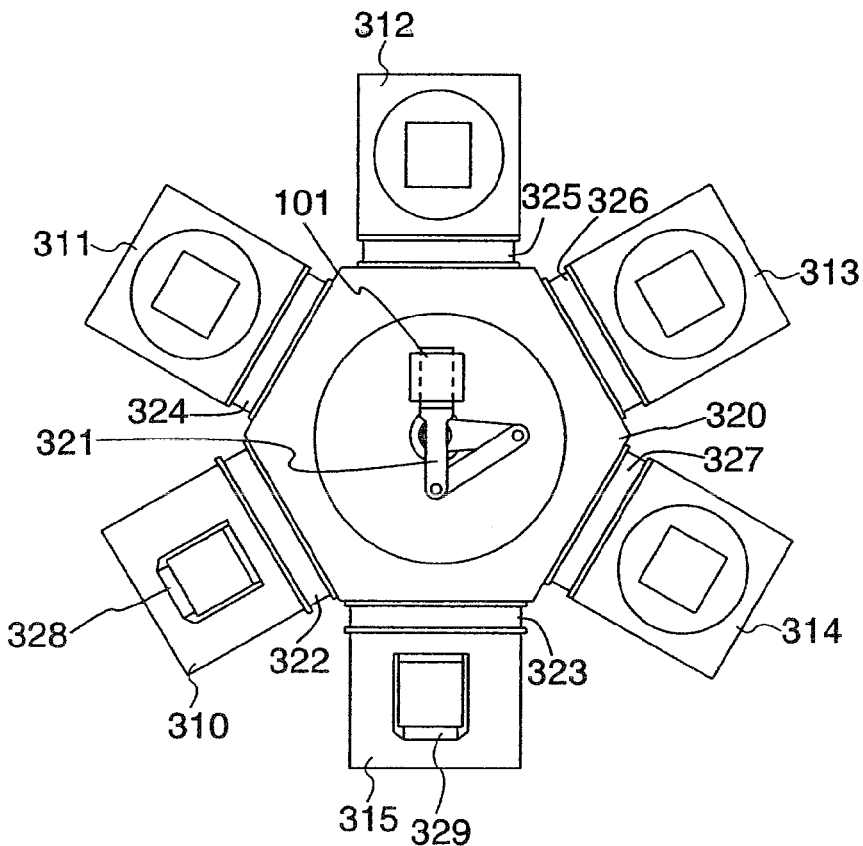
FIGS. 12A and 12B each show an apparatus for forming a semiconductor device of the present invention.

In the case of conducting the film formation of an insulating film, a conductive film or a semiconductor film and a plasma treatment continuously, an apparatus having plural chambers can be used. An example of the apparatus having plural chambers is shown in FIG. 12A. FIG. 12A is a top view of one structural example of the apparatus (continuous film formation system) shown in this embodiment mode.

The apparatus shown in FIG. 12A has a first chamber 311, a second chamber 312, a third chamber 313, and a fourth chamber 314, load lock chambers 310 and 315, and a common chamber 320 each of which has airtightness. Each chamber is provided with a vacuum evacuation pump and an inert gas induction system.

The load lock chambers 310 and 315 are chambers for carrying a sample (a substrate to be processed) to a system. The first to fourth chambers are chambers for forming a conductive film, an insulating film, or a semiconductor film over the substrate 101 or for performing etching, a plasma treatment, or the like. The common chamber 320 is provided to be in common for the load lock chambers 310 and 315 and the first to fourth chambers. In addition, gate valves 322 to 327 are provided between the common chamber 320 and the load lock chambers 310 and 315, and between the common chamber 320 and the first to fifth chambers 311 to 314. It is to be noted that a robot arm 321 is provided in the common chamber 320, which transfers the substrate 101 to each chamber.

As a specific example, described below is a case where an insulating film 102 is formed over the substrate 101 in the first chamber 311, a plasma treatment is conducted in the second chamber 312, and a semiconductor film 103 is formed in the third chamber 313.

First, a cassette 328 containing a plurality of the substrates 10 is transferred to the load lock chamber 310. After the cassette 328 is transferred therein, a door of the load lock chamber 310 is closed. In this state, the gate valve 322 is opened to take out one substrate to be processed out of the cassette 328, and then the substrate is disposed in the common chamber 320 by the robot arm 321. Alignment of the substrate 101 is performed in the common chamber 320 at this time.

Then, the gate valve 322 is closed and the gate valve 324 is opened to transfer the substrate 101 to the first chamber 311. A film formation process is performed in the first chamber 311 at 150 to 300° C. so that the insulating film 102 is formed. As the insulating film 102, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) can be employed. Here, in the first chamber 311, a silicon nitride oxide film is formed as the first insulating film and a silicon oxynitride film is formed as the second insulating film by a plasma CVD method. Note that a sputtering method using a target may be adopted, as well as the plasma CVD method.

After the insulating film 102 is formed, the substrate 101 is taken out to the common chamber 320 by the robot arm 321, and transferred to the second chamber 312. In the second chamber 312, a plasma treatment is conducted to the insulating film 102 so that the insulating film 102 is oxidized or nitrided. Here in the second chamber 312, the plasma treatment is conducted in an atmosphere containing oxygen, (e.g., an atmosphere containing oxygen and a rare gas, an atmosphere containing oxygen, hydrogen and a rare gas, an atmosphere containing dinitrogen monoxide and a rare gas, or an atmosphere containing dinitrogen monoxide, hydrogen and a rare gas). Thus, the surface of the insulating film 102 is oxidized.

After the insulating film 102 is formed, the substrate 101 is taken out to the common chamber 320 by the robot arm 321, and transferred to the third chamber 313. In the third chamber 313, a film formation process is performed at 150 to 300° C., and the semiconductor film 103 is formed by a plasma CVD method. The semiconductor film 103 can be formed from a microcrystal semiconductor film, an amorphous germanium film, an amorphous silicon germanium film, a stacked film of such films or the like. In addition, the formation temperature of the semiconductor film is set 350 to 500° C., and a heat treatment for reducing the hydrogen concentration may be omitted. Here, the plasma CVD method is adopted; however, a sputtering method using a target may be adopted.

After the semiconductor film is formed in this manner, the substrate 101 is transferred to the load lock chamber 315 by the robot arm 321 to be stored in a cassette 329.

It is to be noted that FIG. 12A illustrates just an example. For example, a conductive film or an insulating film may be formed continuously in the fourth chamber 314 after the semiconductor film is formed. The number of chambers can be increased. Furthermore, as shown in Embodiment Mode 2, a plasma treatment can be conducted to the substrate 101 before forming the insulating film 102 to oxidize or nitride the surface of the substrate 101. In other words, a semiconductor device can be manufactured by using the steps and materials described in the above-described embodiment modes and freely combining with the apparatus shown in FIG. 12A. In addition, although description is made on the case where single type chambers are employed for the first to fourth chambers 311 to 314 in FIG. 12A, a structure in which a plurality of substrates can be processed all at once by employing a batch type chamber may be adopted.

By using the apparatus shown in this embodiment mode, film formation of a conductive film, an insulating film or a semiconductor film and a plasma treatment can be conducted sequentially without being exposed to the air. Thus, it is possible to prevent mixture of contamination or improve production efficiency.

Next, in the present invention, an example of an apparatus for a plasma treatment is described with reference to FIG. 12B.

Figure 12B:
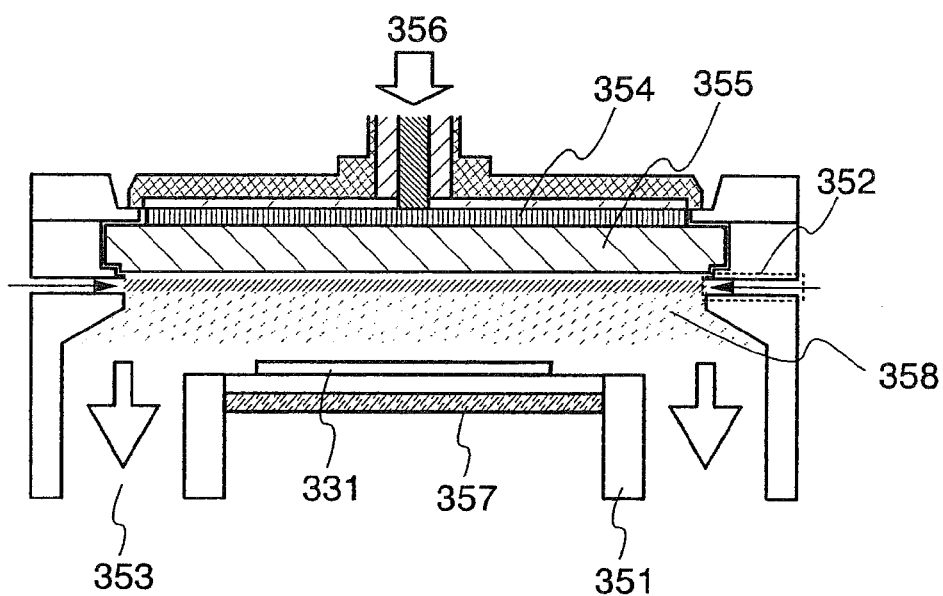

The apparatus shown in FIG. 12B includes a support stage 351 for installing an object 331 to be processed by plasma, a gas supply portion 352 for introducing a gas, an exhaust port 353, an antenna 354, a dielectric plate 355, and a high frequency supply portion 356 for supplying high frequency for generating plasma. In addition, by providing a temperature control portion 357 for the support stage 351, it is also possible to control the temperature of the object 331. Hereinafter, an example of a plasma treatment is described. As the object, any material can be used as long as a plasma treatment can be conducted thereto.

The inside of the treatment chamber is evacuated, and a gas including oxygen or nitrogen is introduced through the gas supply portion 352. For example, as the gas including oxygen, a mixed gas of oxygen ($O_2$) and a rare gas or a mixed gas of oxygen, nitrogen and a rare gas can be introduced. As the gas including nitrogen, a mixed gas of nitrogen and a rare gas or a mixed gas $NH_3$ and a rare gas can be introduced. Next, the object 331 is placed in the support stage 351 having the temperature control portion 357, and the object 331 is heated at 100 to 550° C. The interval between the object 331 and the dielectric plate 355 is in the rage of 20 to 80 mm (preferably, 20 to 60 mm).

A microwave is supplied to an antenna 357 from the high frequency supply portion 356. Here, a microwave with a frequency of 2.45 GHz is supplied. By introducing the microwave into the treatment chamber through the dielectric plate 355 from the antenna 354, a high density plasma 358 which is activated by plasma excitation is produced. For example, when a plasma treatment is conducted in an atmosphere including $NH_3$ and Ar, a high density excited plasma in which $NH_3$ gas and Ar gas are mixed, is produced by the microwave. In the high density excited plasma in which $NH_3$ gas and Ar gas are mixed, the introduced microwave excites the Ar gas to produce radical (Ar*), and the Ar radical and $NH_3$ molecules collide to each other to produce radical (NH*). The (NH*) reacts with the object 331 to nitride the object 331. After that, $NH_3$ gas and Ar gas are exhausted outside the treatment chamber through the exhaust port 353.

In this manner, by conducting a plasma treatment using the apparatus shown in FIG. 12B, a low electron temperature (1.5 eV or lower) and a high electron density ($1\times10^{11}$ cm$^{-3}$ or more) are obtained to form an object with fewer plasma damages.

This embodiment mode can be freely combined with the above mentioned embodiment modes. In other words, the present invention includes all combinations such as a free combination of the structure shown in Embodiment Mode 4 and the structure shown in Embodiment Modes 1 to 3.

Embodiment Mode 5

Embodiment Mode 5 describes a structure of a semiconductor device of the present invention, which is different from those of the above mentioned embodiment modes, with reference to drawings. Specifically, an example of a semiconductor device which has a memory element and which can transmit and receive data without contact, is described.

Figure 19A:
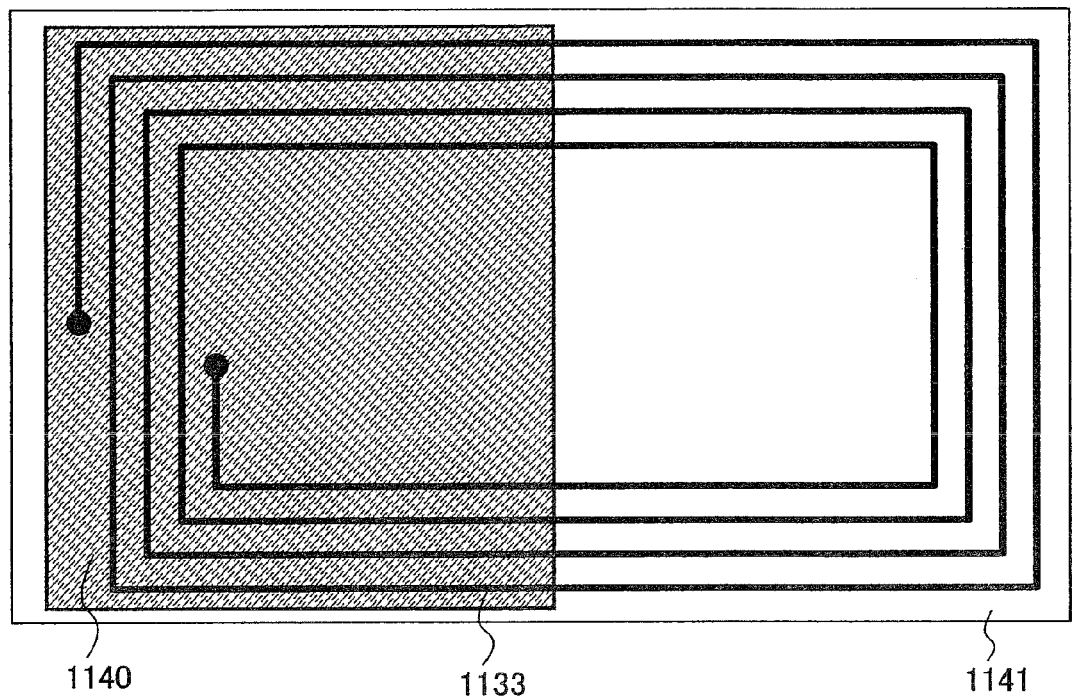
FIGS. 19A and 19B show an example of a manufacturing method of a semiconductor device of the present invention.

In the semiconductor device shown in this embodiment mode, an element group 1140 including a plurality of thin film transistors and a conductive film 1133 serving as an antenna are provided over a substrate 1141 as shown in FIG. 19A. The conductive film 1133 serving as an antenna is electrically connected to a thin film transistor included in an element group 1140. In addition, the semiconductor device receives and transmits data with an external device (reader/writer) without contact via the conductive film 1133 serving an antenna.

Figure 19B:
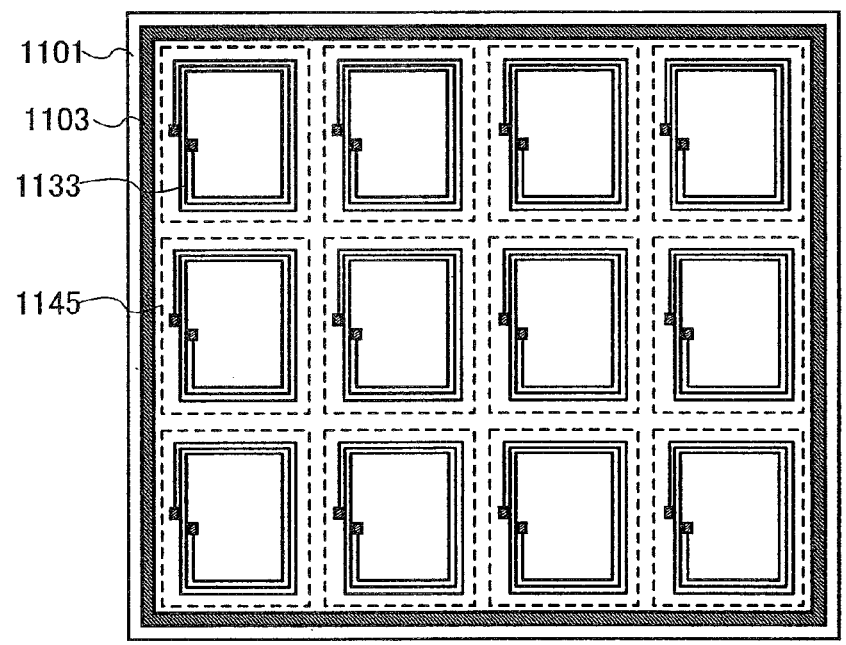

Hereinafter, an example of a manufacturing method of the semiconductor device is described with reference to drawings. Here, as shown in FIG. 19B, a case is described, that a plurality of semiconductor devices 1145 (here, 12 pieces=3× 4) is manufactured using one substrate 1101. In addition, in order to form a flexible semiconductor device, once a semiconductor device such as a thin film transistor, and an antenna are provided over a rigid substrate such as glass, then, the semiconductor element, the antenna and the like are separated form the substrate, and the semiconductor element, the antenna and the like are provided over a flexible substrate.

An insulating film 1102 and a separation layer 1103 are formed over a substrate 1101 (FIG. 13A)

As the substrate 1101, the same material as the substrate 101 mentioned above can be used. Here, a glass substrate can be used as the substrate 1101. In addition, as described in Embodiment Mode 2, a plasma treatment may be conducted to the substrate 1101 to oxide or nitride the surface of the substrate 1101.

As the insulating film 1102, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y) can be employed. Here, a glass substrate is used as the substrate 1101, and silicon oxynitride is formed to have a thickness of 50 to 150 nm as the insulating film 1102. In addition, a plasma treatment may be conducted to the insulating film 1102 to oxidize or nitride the insulating film 1102 as shown in the embodiment modes mentioned above.

As the separation layer 1103, a metal film, a stacked structure of a metal film and a metal oxide film or the like can be used. As the metal film, a single layer structure or a multilayer structure of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), or iridium (Ir) or an alloy material or a chemical compound material mainly containing some of the elements can be used. In addition, such materials can be formed by a know method (a sputtering method or various CVD methods such as a plasma CVD method). As the stacked structure of a metal film and a metal oxide film, after forming the metal film, a plasma treatment in an atmosphere including oxygen and a heat treatment in an atmosphere including oxygen are conducted to provide an oxide of the metal film in the surface of the metal film. For example, in the case that a tungsten film is formed by a sputtering method as the metal film, a plasma treatment is conducted to the tungsten film and a metal oxide film formed from tungsten oxide can be formed on the surface of the tungsten film. In addition, the tungsten oxide is expressed by $WO_x$, wherein "x" is 2 to 3, and there are a case where "x" is 2 ($WO_2$), a case where "x" is 2.5 ($W_2O_5$), a case where "x" is 2.75 ($W_4O_{11}$), and a case where "x" is 3 ($WO_3$), and the like. In forming the tungsten oxide, the value of "x" is not particularly limited, and which oxide is to be formed may be determined depending on an etching rate and the like. In addition to such metal oxide, a metal nitride or a metal oxynitride may be used. In this case, a plasma treatment or a heat treatment may be conducted to the above metal film in an atmosphere including nitrogen or in an atmosphere including nitrogen and oxygen. Further, as another method, after forming such a metal film, an insulating film is formed over the metal film by a sputtering method in an atmosphere including oxygen, thereby providing a stacked structure of the metal oxide film and the insulating film on the surface of the metal film. Moreover, after forming the metal film, it is also possible that sputtering is conducted using a metal as a target in an atmosphere including oxygen to a metal oxide film on the surface of the metal film. In this case, it is possible that the metal film and the metal oxide film can be formed different materials. Note that these methods are preformed in the atmosphere including nitrogen or the atmosphere including nitrogen and oxygen by a sputtering method, thereby forming a metal nitride film or a metal oxynitride film over the metal film.

An insulating film 1104 serving as a base film is formed over the separation layer 1103, an amorphous semiconductor film is formed over the insulating film 1104, and crystallization is conducted to the amorphous semiconductor film by a laser crystallization method, a thermal crystallization method such as RTA or a furnace annealing method, a thermal crystallization method using a metal element promoting crystallization, a method combining such methods or the like, and thus, a crystalline semiconductor film 1105 is formed (FIG. 13B).

The insulating film 1104 can be formed by using any structure of the insulating film 102 as shown in Embodiment Mode 2. Here, after forming silicon nitride oxide (SiNxOy) (x>y) for the base film 1104, a plasma treatment is conducted to the silicon nitride oxide film in an atmosphere containing nitrogen, and the surface of the silicon nitride oxide film is nitrided. Thereafter, silicon oxynitride ($SiO_xN_y$) (x>y) is formed over the silicon nitride oxide film to obtain a stacked structure. In general, a silicon nitride oxide film is formed by a CVD method or a sputtering method, such a silicon nitride oxide film has defects inside and inferior film quality. Thus, by nitriding the film by the plasma treatment in the atmosphere including nitrogen, the surface of the silicon nitride oxide film is improved in its film quality and a dense film can be formed. Consequently, when a semiconductor element is provided over the insulating film 1104, it is possible to prevent an impurity element from the substrate 1101 or the separation layer 1103 from mixing thereinto.

The crystalline semiconductor film 1105 is doped with an impurity element imparting a p-type conductivity. Here, boron (B) is added as the impurity element (FIG. 13C).

The crystalline semiconductor film 1105 is selectively etched to form the first to fourth semiconductor films 1106 to 1109 (FIG. 13D). Here, the first semiconductor film 1106 and the second semiconductor film 1107 are used for a memory portion and the third semiconductor film 1108 and the fourth semiconductor film 1109 are used for a logic circuit.

Next, after a resist mask 1110 is formed to cover the fourth semiconductor film 1109, the first to third semiconductor films 1106 to 1108 are doped with an impurity element imparting a p-type conductivity (FIG. 14A). In this embodiment mode, boron (B) is added as the impurity element The resist mask 1110 is removed and a plasma treatment is conducted to the first to fourth semiconductor films 1106 to 1109 to be oxidized or nitrided, so that an oxide film or a nitride film 1121 (hereinafter, also referred to as an insulating film 1121) is formed on the surface of the semiconductor film (FIG. 14B). Here, a plasma treatment is conducted in an atmosphere including oxygen to oxide the first to fourth semiconductor films 1106 to 1109, so that silicon oxide ($SiO_x$) or silicon oxynitride ($SiO_xN_y$) (x>y) is formed as the insulating film 1121. In general, a silicon oxide film or a silicon oxynitride film formed by a CVD method or a sputtering method has defects inside and inferior film quality. Thus, by oxidizing the semiconductor film by the plasma treatment in the atmosphere including oxygen, a denser insulating film than an insulating film formed by a CVD method, a sputtering method or the like can be formed on the semiconductor film. In addition, when a conductive film is formed above the semiconductor film with an insulating film formed by a CVD method, a sputtering method or the like, coverage defects due to breakage or the like of the insulating film at the end portion of the semiconductor film occur, and there is a risk that a short-circuit or the like between the semiconductor film and the conductive film occurs; however, by oxidizing or nitriding the surface of the semiconductor film by a plasma treatment in advance, coverage defects of the insulating film at the end portion of the semiconductor film can be prevented. Note that the insulating film 1121 functions as a tunnel insulating film in a memory element of the memory portion.

silicone nitride ($SiN_x$) or silicon nitride oxide (SiNxOy) (x>y) 1122 (hereinafter, also referred to as an insulating film 1122) is formed to cover the insulating film 1121 and the insulating film 1104. Here, a silicon nitride film of 4 to 20 nm thick is formed by a plasma CVD method as the insulating film 1122 (FIG. 14C). The insulating film 1122 functions as a film for trapping charges in the memory element of the memory portion.

A plasma treatment is conducted to the insulating film 1122 in an atmosphere including oxygen, and the surface of the insulating film 1122 is oxidized to form an insulating film 1123 (FIG. 14D). The plasma treatment under the condition described above. Here, by the plasma treatment, a silicon oxide film or a silicon oxynitride film of 2 to 10 nm thick can be formed as the insulating film 1123 on the surface of the insulating film 1122.

After selectively forming a resist mask 1124 only in the memory portion, the logic portion is selectively oxidized (FIG. 15A). Specifically, a plasma treatment is conducted to the silicon nitride film 1122 and the silicon nitride film containing oxygen 1123 of the logic portion to be oxidized in an atmosphere including oxygen. Here, by this plasma treatment, an oxide film 1125 is formed by oxidizing the insulating film 1122 made of silicon nitride oxide and the insulating film 1123 made of silicon oxynitride or silicon nitride oxide in the logic portion.

The resist mask 1124 is removed, and conductive films 1126 to 1129 serving as gate electrodes are formed above the first to fourth semiconductor films 1106 to 1109 (FIG. 15B). It should be noted that the conductive films 1126 to 1129 each have a stacked structure first conductive films 1126*a* to 1129*a* and second conductive films 1126*b* to 1129*b*. Here, tantalum nitride is used as the first conductive films 1126*a* to 1129*a* and tungsten is used as the second conductive films 1126*b* to 1129*b*, and the first conductive films 1126*a* to 1129*a* and the second conductive films 1126*b* to 1129*b* are stacked. Note that a single layer may be employed without being limited to this structure. In addition, the material is not limited especially, and an element selected from tantalum (Ta), tungsten (W), molybdenum (Mo), titanium (Ti), aluminum (Al), copper (Cu), chromium (Cr), or niobium (Nb) or an alloy material or a chemical compound material mainly containing some of the elements can be used. In addition, a semiconductor material typified by polysilicon doped with an impurity element such as phosphorus can be used.

Next, the first semiconductor film 1106 to the third semiconductor film 1108 are each doped with an impurity element imparting an n-type conductivity using the conductive films 1126 to 1128 as masks, and the fourth semiconductor film 1109 is doped with an impurity element imparting a p-type conductivity using the conductive film 112 as a mask to form source or drain regions. An insulating film 1130 is formed to cover the conductive films 1126 to 1129, and a conductive film 1131 is formed over the insulating film 1130 so as to be electrically connected to the source or drain regions of the first semiconductor films 1106 to 1109. Memory elements 1151*a* and 1151*b* using the first semiconductor film 1106 and the second semiconductor film 1107 as channel forming regions, an n-channel thin film transistor 1151*c* using the third semiconductor film 1108 as a channel forming region, and a p-channel thin film transistor 1151*d* using the fourth semiconductor film 109 as a channel forming region are provided (FIG. 15C).

Then, an insulating film 1132 is formed to cover the conductive film 1131, a conductive film 1133 serving as an antenna is formed over the insulating film 1132, and an insulating film 1134 is formed to cover the conductive film 1133 (FIG. 15D). Note that a layer including memory elements 1151*a* and 1151*b* and thin film transistors 1151*c* and 1151*d*, the conductive film 1133 and the like is referred to an element group 1155 for convenience sake here.

In addition, as the insulating films 1130, 1132, and 1134, a single layer structure or a multilayer structure of insulating films containing nitrogen or oxygen such as silicon oxide ($SiO_x$), silicon nitride ($SiN_x$), silicon oxynitride ($SiO_xN_y$) (x>y), silicon nitride oxide ($SiN_xO_y$) (x>y), or a film containing carbon such as DLC (diamond like carbon), further, an organic material such as epoxy, polyimide, polyamide, poly vinylphenol, benzocyclobutene, or acryl, can be employed. In particular, organic materials such as epoxy, polyimide, polyamide, poly vinylphenol, benzocyclobutene, or acryl, a material of siloxane based materials or the like can be formed by a spin coating method, a droplet discharging method, a printing method or the like. Thus, planarization or efficiency of processing time can be enhanced. The same material or different materials may be used for the insulating films 1130, 1132 and 1133. In addition, as shown in Embodiment Mode 3, it is also possible to oxide or nitride the insulating films 1130, 1132 and 1133 by the plasma treatment.

As the conductive film 1133, a conductive material including one or plurals of a metal such as copper (Cu), silver (Ag), gold (Au) aluminum (Al), chromium (Cr), molybdenum (Mo), titanium (Ti), tantalum (Ta), tungsten (W), nickel (Ni), carbon (C), or a metal compound containing such elements.

A region excluding the memory elements 1151*a* and 1151*b* and thin film transistors 1151*c* and 1151*d* is subjected to laser irradiation or the like, so as to form an opening portion 1150 and expose the separation layer 1103. Then, the element group 1155 is separated from the substrate 1101 by a physical means. In addition, as shown in FIG. 16A, before separating by the physical means, an etching agent may be introduced through the opening portion 1150 to remove the separation layer 1103. In the case of removing the separation layer 1103, a whole separation layer 1103 may be removed or the separation layer may be selectively removed to leave a portion, without removing the whole. By leaving a portion of the separation layer 1103, even after the separation layer 1103 is removed by the etching agent, the memory elements 1151*a* and 1151*b* and thin film transistors 1151*c* and 1151*d* can be held over the substrate 1101, and the handling in a later step becomes simple and easy. As the etching agent, halogen fluoride such as chlorine trifluoride or a gas or a liquid including halogen can be used. In addition, $CF_4$, $SF_6$, $NF_3$, $F_2$ or the like can be used.

When the element group is separated from the substrate 1101, for example, as shown in FIG. 16B, a first sheet material 1152 having an adhesion property is attached to the insulating film 1134, and the element group 1155 can be separated form the substrate 1101 by a physical means.

As the first sheet material 1152, a flexible film can be used, and at least one surface thereof has an adhesion property. For example, a sheet material provided with an adhesive on a base film used as a base such as polyester or the like can be used. As the adhesive, a material made of a rein material including an acrylic resin or a synthetic rubber material, can be used.

The separated element group 1155 is sealed with a flexible film. Here, the element group 1155 is sealed with a second sheet material 1153 and a third sheet material 1154 (FIG. 16C).

Flexible films can be used for the second sheet material 1153 and the third sheet material 1154, for example, a film made of polypropylene, polyester, vinyl, polyvinyl fluoride, vinyl chloride or the like, a paper made of a fibrous material, and a stacked film of a base film (polyester, polyamide, an inorganic deposition film, paper or the like) and an adhesive synthetic resin film (acrylic based synthetic resin, epoxy based synthetic resin or the like) or the like can be used. In addition, the film is attached by a thermal compression bond, and when a heat treatment and a pressurization treatment are conducted, an adhesive layer provided on the top surface of the film or a layer provided in the outermost layer (not adhesive layer) is melted by the heat treatment and it is bonded by the pressurization treatment. In addition, when an element formation layer is sealed with the first sheet material 1152 and the second sheet material 1153, the same material may be used for the first sheet material to conduct sealing.

Through the above steps, a semiconductor device which has a memory element and which can transmit and receive date without contacts can be obtained. In addition, the semiconductor device shown in this embodiment mode is flexible.

A method of selectively oxidizing the logic portion may be different from the method in which the resist mask 1124 is formed over the insulating film 1123 including oxygen provided in the memory portion as shown in FIG. 15A. For example, as shown in FIG. 17A, there is a method in which a conductive film 1160 is formed over the insulating film 1123 formed in the memory portion. By selectively forming the conductive film 1160 only in the memory portion, the logic portion is selectively oxidized to form an oxide film 1125 (FIG. 17B). In the case of using this method, the first conductive film and the second conductive film may be stacked without removing the conductive film, and may be selectively etched. Accordingly, the conductive film formed in the memory portion has a three-layer structure (FIG. 17C). As the conductive film 1160, a conductive material including one or plurals of a metal such as copper (Cu), silver (Ag), gold (Au) aluminum (Al), chromium (Cr), molybdenum (Mo), titanium (Ti), tantalum (Ta), tungsten (W), nickel (Ni), carbon (C), or a metal compound containing such elements.

This embodiment mode can be freely combined with above described embodiment modes. The materials or methods described in the above described embodiment modes can be used in this embodiment mode, and the materials or methods described in this embodiment mode can be used in the above described embodiment modes.

Embodiment Mode 6

Embodiment Mode 6 describes another manufacturing method of a semiconductor device with reference to drawings, which is different from the manufacturing method of the semiconductor device having a memory element shown in Embodiment Mode 5.

A state of FIG. 14B is obtained as described in Embodiment Mode 5.

A layer including dispersed conductive particles or semiconductor particles (hereinafter, referred to as dispersed particles 1181) are formed over an oxide film 1121 and a base film 1104 (FIG. 18A). As a manufacturing method for the layer including dispersed particles 1181, a known method such as sputtering, plasma CVD, a low pressure CVD (LPCVD), a vapor deposition, or a droplet discharging method can be used. The size of each dispersed particle is 0.1 to 10 nm, preferably, 2 to 5 nm. As a material for conductive particles, gold, silver, copper, palladium, platinum, cobalt, tungsten, nickel, and the like can be used. As a material for semiconductor particles, silicon (Si), germanium (Ge), or silicon germanium alloy, and the like can be used. Here, silicon microcrystal is used as the dispersed particles. By conducting a plasma treatment in an atmosphere including oxygen or an atmosphere including nitrogen, the surface of the layer including dispersed particle 1181 may be oxidized or nitrided. In addition, a conductive film can also be provided in addition to the dispersed particles.

An insulating film 1182 is formed over the layer including dispersed particle 1181 (FIG. 18B). As the insulating film 1182, silicon oxide ($SiO_x$), silicon oxynitride ($SiO_xN_y$) (x>y) or the like can be used.

As shown in FIG. 18C, after selectively forming the resist mask 1183 only in a memory element portion, only a logic portion is selectively oxidized. Specifically, a high density plasma treatment is conducted to the layer including dispersed particle 1181 of the logic portion and the insulating film 1182 made from a silicon oxide film containing nitrogen in an atmosphere including oxygen. By this plasma treatment, the layer including dispersed particle 1181 of the logic portion and the insulating film 1182 made from a silicon oxide film containing nitrogen are oxidized to form an oxide film 1184 (FIG. 18D).

In subsequent steps, in accordance with the method described above, a semiconductor device which has a memory element and which can transmit and receive data without contact can be obtained. It should be noted that in the steps shown in FIGS. 18A to 18D, it is possible that a crystalline semiconductor film is formed instead of the layer including dispersed particle 1181, and a plasma treatment is conducted to the crystalline semiconductor film to be oxidized or nitrided, so that a silicon oxynitride film 1182 is provided. The crystalline semiconductor film may be formed directly, or by crystallizing an amorphous semiconductor film after the amorphous semiconductor film is formed.

Embodiment Mode 7

Embodiment Mode 7 describes another manufacturing method of a semiconductor device with reference to drawings, which is different from the manufacturing method of the semiconductor device shown in Embodiment Mode 5 or 6.

As shown in Embodiment Mode 5, the state of FIG. 14A is obtained, and the resist mask 1110 to cover the fourth semiconductor films 1109 is removed (FIG. 29A).

Next, a high density plasma treatment is conducted to the first to fourth semiconductor films 1106 to 1109 in an atmosphere including oxygen to form an oxide film 1161 on the surfaces (top face and side face) of the first semiconductor film 1106 to the fourth semiconductor film 1109 (FIG. 29B). The oxide film 1161 is formed to have a thickness of 2 to 10 nm thick.

Next, a high density plasma treatment is conducted to the oxide film 1161 in an atmosphere including nitrogen to nitride the surface (top face and side face) of the oxide film 1161 and thus, an oxide film including nitrogen 1162 is formed (FIG. 29C). The thickness of the oxide film including nitrogen 1162 formed on the surface of the oxide film 1161 becomes 1 to 5 nm by the nitriding treatment. Note that the condition of the plasma treatment may be the condition described in the above embodiment modes. In addition, the oxide film 1161 and the oxide film including nitrogen 1162 function as a tunnel insulating film in a memory element of the memory portion.

Instead of the oxide film 1161 and the oxide film including nitrogen 1162, a high density plasma treatment may be conducted to the first semiconductor films 1106 to the fourth semiconductor films 1109 in an atmosphere including oxygen and nitrogen to form an oxide film including nitrogen on the surfaces (top face and side face) of the first semiconductor film 1106 to the fourth semiconductor film 1109.

Next, an insulating film 1122 is formed over the oxide film including nitrogen 1162 (FIG. 29D). As the insulating film 1122, a silicon nitride film is preferably formed to have a thickness of 4 to 20 nm by a plasma CVD method. In addition, the insulating film 122 in the memory portion functions as an insulating film trapping (capturing) charges.

Then, an insulating film 1123 is formed over the insulating film 1122 (FIG. 29E). As the insulating film 1123, a silicon oxynitride film is preferably formed to have a thickness of 4 to 20 nm thick by a plasma CVD method here.

In subsequent steps, a memory portion and a logic portion can be completed in accordance with the steps after FIG. 15A shown in Embodiment Mode 5.

This embodiment mode can be freely combined with above described embodiment modes. The materials or methods described in the above described embodiment modes can be used in this embodiment mode, and the materials or methods described in this embodiment mode can be used in the above described embodiment modes.

Embodiment Mode 8

Embodiment Mode 8 described application examples of a semiconductor device which can transmit and receive data without contact with reference to drawings. The semiconductor device which can transmit and receive data without contact is generally referred to as an RFID (Radio Frequency Identification) tag, an ID tag, an IC tag, an IC chip, an RF (Radio Frequency) tag, a wireless tag, an electronic tag, or a wireless chip.

Figure 20A:
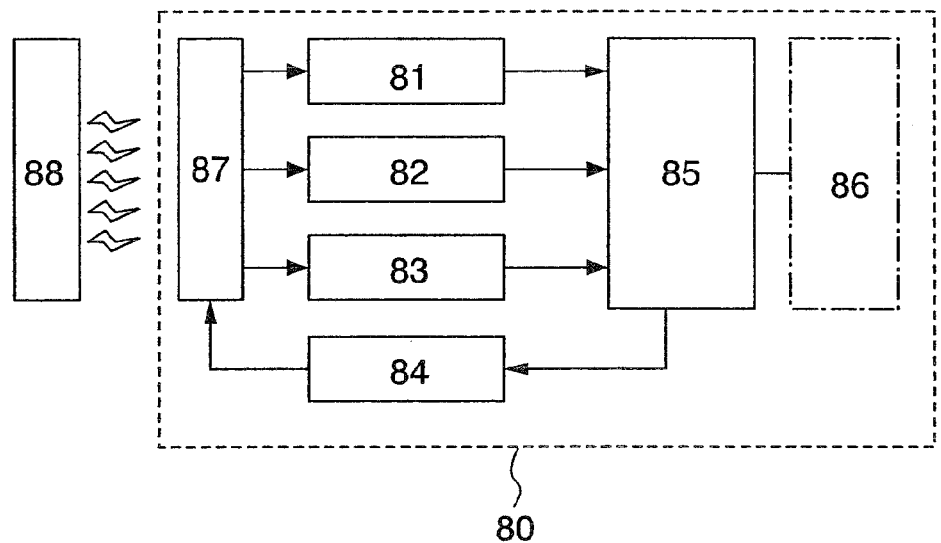
FIGS. 20A to 20C each show one example of usage mode of a semiconductor device of the present invention.

An RFID 80 has a function of transmitting and receiving data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 20A). Further, the RFID may includes plural memory circuits, rather than one memory circuit. An SRAM, a flash memory, a ROM, a FeRAM, a circuit, which uses an organic compound layer shown in the above described embodiment modes in a memory element portion, and the like can be used.

Signals sent from a reader/writer 88 as radio waves are modulated into alternating-current electric signals in the antenna 87 by electromagnetic induction. A power supply voltage is generated in the power supply circuit 81 by using the alternating-current electric signals, and supplied to each circuit using a power supply line. The clock generation circuit 82 generates various kinds of clock signals based on the alternating-current electric signals, which are input from the antenna 87, and supplies the various kinds of clock signals to the control signal 85. The modulation circuit 83 demodulates the alternating-current electric signals and supplies the demodulated alternating-current electric signals to the control circuit 85. In the control circuit 85, various kinds of arithmetic processings are performed in accordance with the input signals. Programs, data and the like that are used in the control circuit 85 are stored in the memory circuit 86. In addition, the memory circuit 86 can also be used as a work area in the arithmetic processings. Then, data is transmitted to the modulation circuit 84 from the control circuit 85, and load modulation can be added to the antenna 87 from the modulation circuit 84 in accordance with the data. Consequently, the reader/writer 88 receives load modulation applied to the antenna 87 via radio waves so that the reader/writer can read the data.

Furthermore, the RFID may be of a type in that the power supply voltage is supplied to each circuit via radio waves without having a power source (a buttery), or another type in that the power supply voltage is supplied to each circuit by utilizing both radio waves and a power source (a buttery).

A flexible RFID can be manufactured by employing such a structure described in the above embodiment modes, and thus, such RFID can be attached to an article having a curbed surface.

Figure 20B:
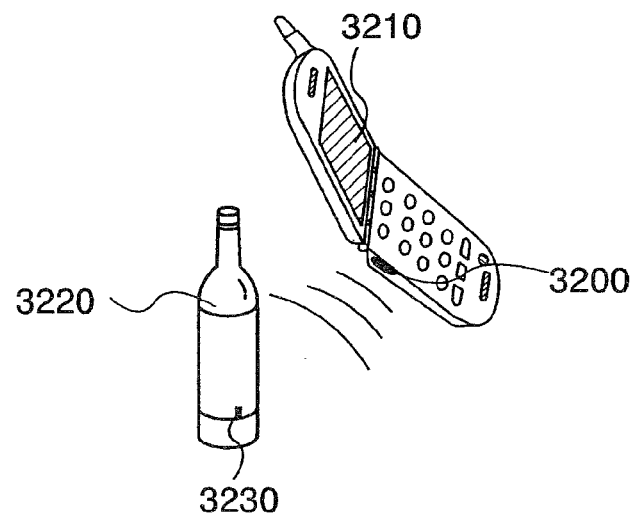
Figure 20C:
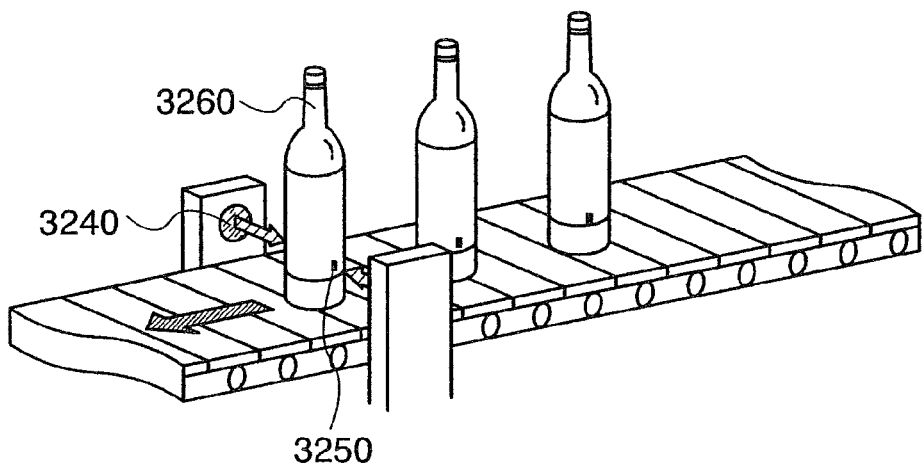
Figure 21A:
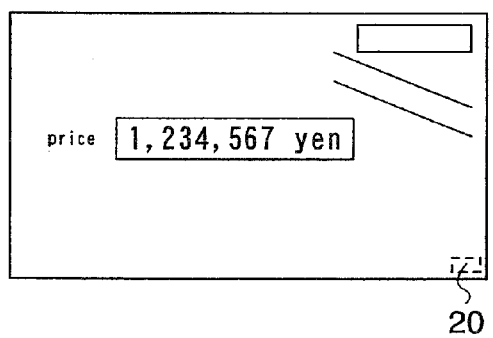
FIGS. 21A to 21H each show one example of usage mode of a semiconductor device of the present invention.
Figure 21B:
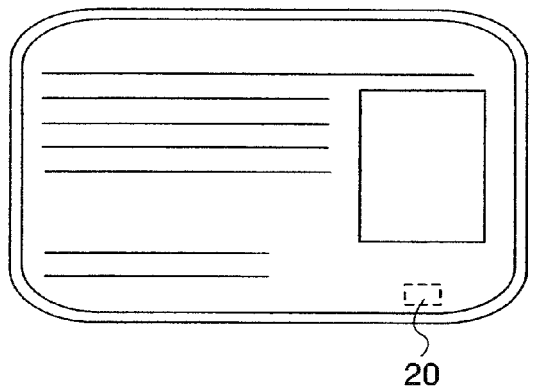
Figure 21C:
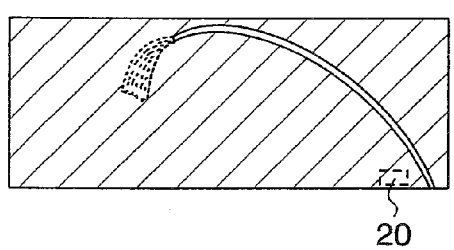
Figure 21D:
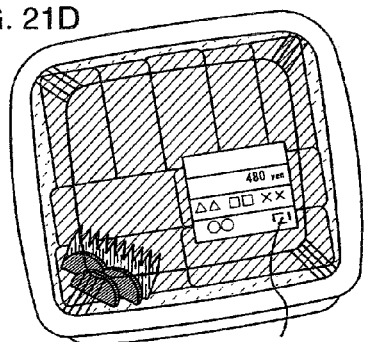
Figure 21E:
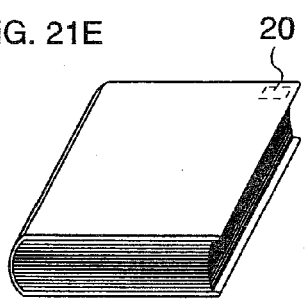
Figure 21F:
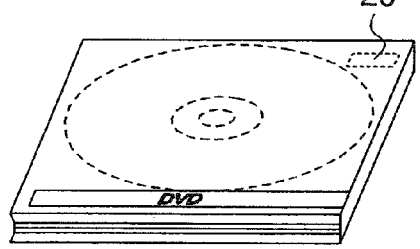
Figure 21G:
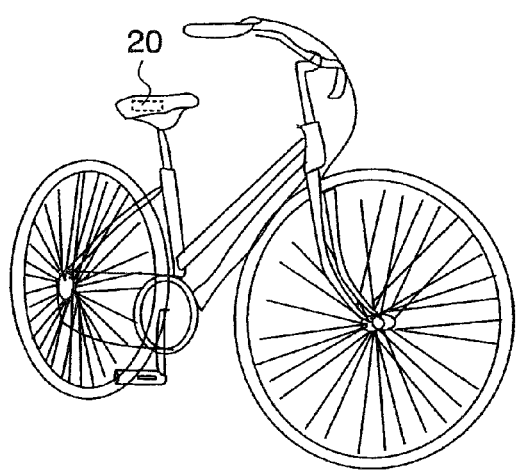
Figure 21H:
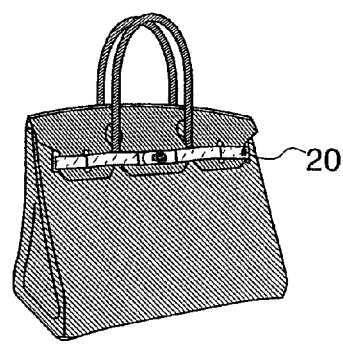

Next, an example of usage mode of a flexible RFID will be described. A reader/writer 3200 is provided on a side surface of a portable terminal that includes a display portion 3210. An RFID 3230 is provided on a side surface of a product 3220 (FIG. 20B). When holding the reader/writer 3200 over the RFID 3230 included in the product 3220, information about the product such as a raw material, a place of origin, test results in each production process, history of distribution process, and a description of a commodity, is displayed on the display portion 3210. In addition, when conveying a commodity 3260 by a belt conveyor, the inspection of the commodity 3260 can be carried out by utilizing a reader/writer 3240 and an RFID 3250 provided on the commodity 3260 (FIG. 20C). In this way, by utilizing an RFID for a system, information can be easily obtained, thereby realizing high performance and high added value. As described in the above embodiment modes, even when an RFID is attached to an article having a curved surface, damages to a thin film transistor or the like included in the RFID can be avoided. A highly reliable RFID can be provided.

An RFID having flexibility in addition to the above can be widely used in various fields since it can clarify a history and the like of an object without contact. RFID can be applied to any products so long as they are useful for production and management. For example, RFID can be provided to bills, coins, portfolios, bonds, bearer bonds, wrapping containers, documents, recording media, personal belongings, vehicles, foods, clothes, health goods, livingwares, chemicals, electronic devices, and the like. Examples thereof will be described with reference to FIGS. 21A to 21H.

Bills and coins indicate money circulating in the market, and include a thing valid in a certain area as currency (cash vouchers), memorial coins, and the like. Portfolios indicate checks, certificates, promissory notes, and the like (see FIG. 21A). Certificates indicate driver's licenses, certificates of residence, and the like (see FIG. 21B). Bearer bonds indicate stamps, various merchandise coupons, and the like (see FIG. 21C). Packing containers indicate wrapping papers for lunch boxes and the like, plastic bottles, and the like (see FIG. 21D). Documents indicate books, and the like (see FIG. 21E). Recording media indicate DVD software, video tapes, and the like (see FIG. 21F). Vehicles indicate vehicles such as bicycles, ships, and the like (see FIG. 21G). Personal belongings indicate bags, eye glasses, and the like (see FIG. 21H). Foods indicate food goods, drinks, and the like. Clothing indicates clothes, footwear, and the like. Health goods indicate medical appliances, health appliances, and the like. Livingware indicates furniture, lighting equipment, and the like. Chemicals indicate medical products, agrochemicals, and the like. Electric devices indicate liquid crystal display devices, EL display devices, television devices (TV sets or flat-screen televisions), cellular phones, and the like.

By providing RFIDs to such things as bills, coins, portfolios, certificates, bears bonds, counterfeits can be prevented. Further, efficiencies for an inspection system or a system used in a rental shop can be improved by providing RFIDs to packing containers, documents, recording media, personal belongings, foods, livingware, electronic devices, and the like. By providing RFIDs to vehicles, health goods, chemicals, and the like, counterfeits and theft can be prevented. In the case of a medicine, it can be possible to prevent it from being taken by mistake. An RFID is provided to the foregoing items by sticking it to their surfaces or embedding it therein.

For example, in the case of a book, an RFID may be embedded in a page or embedded in an organic resin when a packaging is made from organic resin. By using a flexible RFID, even when RFID is provided for a paper, breakage etc., of an element included in the RFID can be prevented by constituting the RFID with a semiconductor device having a structure shown in the above embodiment modes.

By providing the RFIDs to wrapping containers, recording media, personal belongings, foods, clothes, livingwares, electronic devices, and the like, in this manner, an inspection system, a system of a rental shop can be improved efficiently. Additionally, by providing the RFIDs to vehicles, the counterfeits and the theft can be prevented. By embedding the RFIDs in creatures such as animals, individual creatures can be identified easily. For example, by embedding an RFID in a creature such as livestock, a birth data, sexuality, breed, and the like can be easily identified and a health condition such as a body temperature, and the like can be easily managed.

This embodiment mode can be freely combined with the embodiment modes noted above.

Embodiment Mode 9

Embodiment Mode 9 describes a structure of a semiconductor device of the present invention, which is different from those of the above described embodiment modes with reference to drawings. Specifically, an example of a semiconductor device having a pixel portion is described.

Figure 22A:
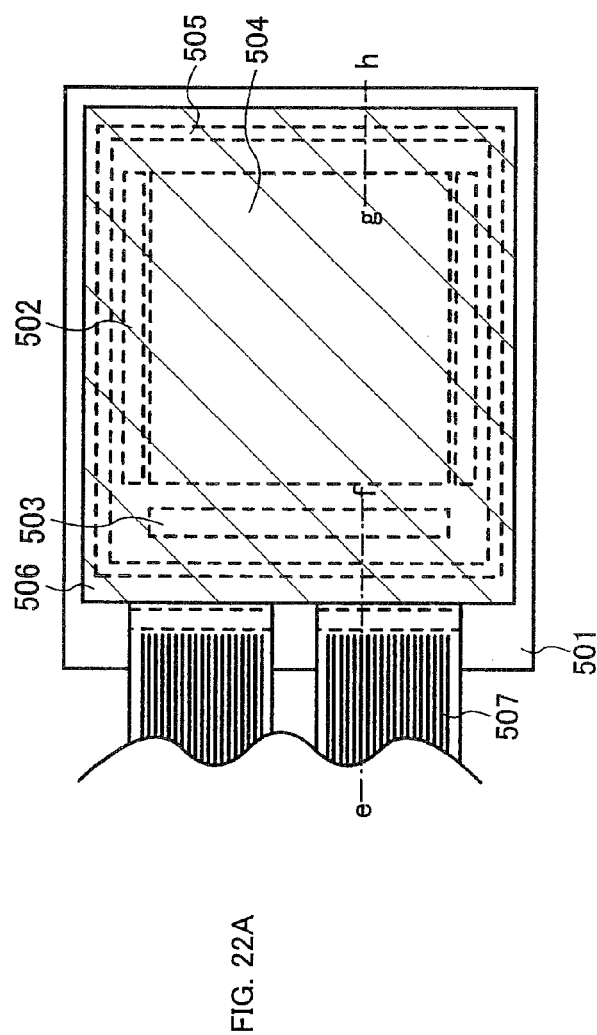
FIGS. 22A and 22B show one example of a semiconductor device of the present invention.
Figure 22B:
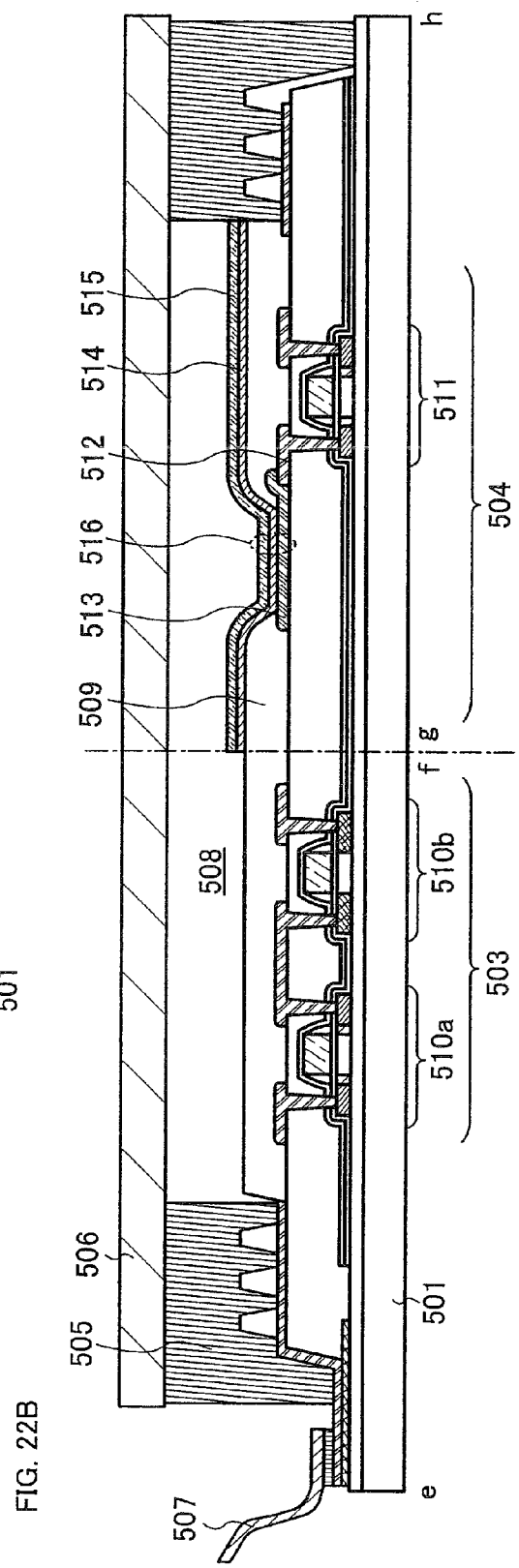

FIGS. 22A and 22B show a case that a light-emitting element is provided in a pixel portion. FIG. 22A is a top view showing an example of a semiconductor device, while FIG. 22B is a cross-sectional view taken along e-f and along g-h pf FIG. 22A.

As shown in FIG. 22A, the semiconductor device shown in this embodiment mode includes a scanning line driver circuit 502, a signal line driver circuit 503, a pixel portion 504 and the like over a substrate 501. In addition, an opposite substrate 506 is provided to sandwich at least the pixel portion 504 with a substrate 501. The scanning line driver circuit 502, the signal line driver circuit 503, and the pixel portion 504 are formed over the substrate 501 using a thin film transistor having a structure described in the embodiment modes described above. The substrate 501 and the opposite substrate 506 are bonded to each other by a sealing material 505. In addition, the scanning line driver circuit 502, and the signal line driver circuit 503 receive a video signal, a clock signal, a start signal, a reset signal and the like from an FPC 507 that is an external input terminal. Here, only an FPC (flexible printed circuit) is shown; however, a printed wiring board (PWB) may be attached to this FPC.

In addition, FIG. 22B is a cross-sectional view taken along e-f and along g-h pf FIG. 22A. The signal line driver circuit 503 and a thin film transistor included in the pixel portion 504 are provided over the substrate 501. The signal line driver circuit 503 is formed with a CMOS circuit combining a n-channel thin film transistor 510a and a p-channel thin film transistor 510b which each have any structure shown in the embodiment modes noted above. In addition, a driver circuit of the scanning line driver circuit 502, and the signal line driver circuit 503, and the like, may be formed with a known a CMOS circuit, a PMOS circuit or an NMOS circuit. Although this embodiment shows the example in which the pixel portion and the driver circuit such as the scanning line driver circuit 502, and the signal line driver circuit 503 are formed over the same substrate, the present invention is not limited to this, and the driver circuit can also be formed outside, not over the same substrate as the pixel portion.

In addition, the pixel portion 504 includes a plurality of pixels which each are formed from a light-emitting element 516, and a thin film transistor 511 for driving the light-emitting element 516. A thin film transistor having any structure shown in the above embodiment mode can be applied to the thin film transistor 511. In addition, here, a first electrode 513 is provided to be connected to the conductive film 512 connected to source or drain regions of the thin film transistor 511, and an insulating film 509 is formed to cover an end portion of the first electrode 513. The insulating film 509 functions as a partition in the plural pixels.

As the insulating film 509, a positive type photosensitive acrylic resin film is used. In order to improve the coverage, the insulating film 509 is formed so as to have curvature at its upper end or lower end. For example, in the case of using positive photosensitive acrylic for the insulating film 509, only the upper end portion of the insulating film 509 preferably has a curved surface with a radius of curvature of 0.2 to 0.3 μm. The insulating film 509 may be formed with either a negative type, which becomes insoluble to the etchant by the irradiation of light, or a positive type, which becomes soluble to the etchant by the irradiation of light. Not only the organic compound but also an inorganic compound such as silicon oxide, silicon oxynitride, a siloxane material, or the like can be used. In addition, as the insulating film 509, a single layer structure or a multilayer structure of an organic material such as epoxy, polyimide, polyamide, poly vinylphenol, benzocyclobutene, or acryl, can be employed. As described in the above embodiment modes, a plasma treatment is conducted to the insulating film 509 to oxidize or nitride the insulating film 509, and the surface of the insulating film 509 is improved in its film quality. Thus, a dense film can be obtained. By modifying the surface of the insulating film 509, the strength of the insulating film 509 is improved and physical damages can be reduced, such as crack occurrence or film reduction in etching when forming an opening portion. In addition, as a result of improved film quality for the surface of the insulating film 509, the interface characteristics such as adhesion with a light-emitting layer 514 provided over the insulating film 509 is improved, In the semiconductor device shown in FIGS. 22A and 22B, the light-emitting layer 514 is formed over the first electrode 513 and a second electrode 515 is formed over the light-emitting layer 514. The light-emitting element 516 has a stacked structure of the first electrode 513, the light-emitting layer 514 and the second electrode 515.

In addition, the light emitting layer 514 can be formed of a single layer or a stacked structure of an organic compound such as a low molecular material, a middle molecular material (including oligomer and dendrimer), or a high molecular material by a known method such as an evaporation method using an evaporation mask, an inkjet method, or a spin coating method. In addition, an inorganic compound can be used for the light-emitting layer 514, as well as the organic compound. In general, as a light-emitting material used for a light-emitting layer, there is given an organic compound and an inorganic compound. A light-emitting element using the organic compound is referred to as an organic EL element, while an light-emitting element using the inorganic compound is referred to as an inorganic EL element. Either EL element can be applied to this embodiment mode.

The inorganic EL elements are classified according to their element structures into a distributed inorganic EL element and a thin-film inorganic EL element. They are different in that the former has a light-emitting layer in which particles of a light emitting material are dispersed in a binder and the latter has a light-emitting layer formed from a thin film of a fluorescent material; however, they are in common in the mechanism, and emission can be obtained collision excitation of electrons that are accelerated by a high electric field and one of a base material and emission center and. In the case of providing such an inorganic EL device, either a distributed inorganic EL element or a thin-film inorganic EL element may be employed in this embodiment mode.

When the first electrode 513 and the second electrode 515 are driven by DC, one of the first electrode 513 and the second electrode 515 serves as an anode and the other serves as a cathode. In the case of being used as the anode, a material with a high work function is preferably used. For example, not only a single-layer film such as an ITO film, an indium tin oxide film containing silicon, a transparent conductive film formed with a target in which zinc oxide (ZnO) of 2 to 20 wt % is mixed with indium oxide by a sputtering method, zinc oxide (ZnO), a titanium nitride film, a chromium film, a tungsten film, a Zn film, or a Pt film, but also a stacked layer of a titanium nitride film and a film containing aluminum as its main component, a three-layer structure of a titanium nitride film, a film containing aluminum as its main component, and a titanium nitride film or the like can be used. Note that when employing a stacked structure, resistance of a wiring becomes low, a favorable ohmic contact can be obtained, and further the stacked structure can function as an anode. In the case of being used as the cathode, a material with a low work function (Al, Ag, Li, Ca, or an alloy thereof such as MgAg, MgIn, AlLi, $CaF_2$, or $Ca_3N_2$) is preferably used. Note that in a case of making the electrode used as the cathode have light transmitting properties, a stacked layer of a metal thin film whose thickness is thinned and a transparent conductive film is preferably used as the electrode. As the transparent conductive film, for example, ITO, indium tin oxide containing silicon, a transparent conductive film formed with a target in which zinc oxide (ZnO) of 2 to 20 wt % is mixed with indium oxide by a sputtering method, or zinc oxide (ZnO) can be used. Here, an ITO having light transmitting properties is used as the first electrode 513, and a structure in which light is extracted from a side of the substrate 501 is employed. Note that a structure in which light is extracted from a side of the opposite substrate 506 may be used by using a light transmitting material for the second electrode 515. Alternatively, a structure in which light is extracted from both sides of the substrate 501 and the opposite substrate 506 (dual emission) can be used as well by forming the first electrode 513 and the second electrode 515 with light transmitting materials. In addition, when the first electrode 513 and the second electrode 515 are driven by AC, any material described above may be used for the first electrode 513 and the second electrode 515, and one or both of the first electrode 513 and the second electrode 515 may be formed with a light-transmitting material.

In addition, a structure is used, in which the light emitting element 516 of the invention is provided in a space 508 which is surrounded by the substrate 501, the opposite substrate 506, and the sealing material 505 by bonding the opposite substrate 506 and the substrate 501 with the sealing material 505. Note that a structure of filling the space 508 with the sealing material 505 can be also employed in addition to the case of filling the space 508 with an inert gas (such as nitrogen or argon).

Note that epoxy resin is preferably used as the sealing material 505. Such materials are preferably materials which do not transmit moisture or oxygen as much as possible. As a material used for the opposite substrate 506, a plastic substrate made from FRP (Fiberglass-Reinforced Plastics), PVF (polyvinyl fluoride), mylar, polyester, acryric, or the like can be used as well as a glass substrate or a quartz substrate.

As described above, a light-emitting device having a semiconductor film or a nitride film formed by a plasma treatment having high density (high plasma treatment) can be provided.

The semiconductor device having a pixel portion is not limited to the above described structure in which a light-emitting element is used for the pixel portion, and further includes a semiconductor device including a pixel portion using a liquid crystal. A semiconductor device using a liquid crystal in a display portion is shown in FIG. 23.

Figure 23:
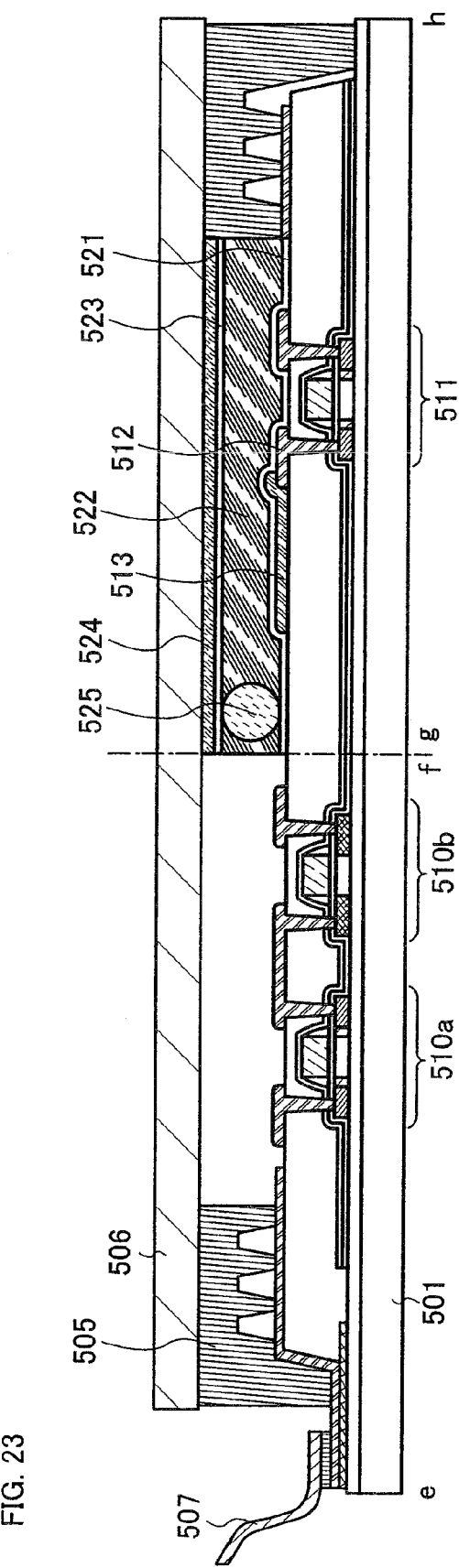
FIG. 23 shows one example of a semiconductor device of the present invention.

FIG. 23 shows an example of a semiconductor device having a liquid crystal in a pixel portion. A liquid crystal 522 is provided between an orientation film 521 formed to cover a conductive film 512 and a first electrode 513 and an orientation film 523 formed below an opposite substrate 506. In addition, a second electrode 524 is provided for the opposite substrate 506, and a voltage applied to the liquid crystal 522 which is provided between the first electrode 813 and the second electrode 524 is controlled, so as to control transmission of light and display an image. In addition, a spherical spacer 525 is provided in the liquid crystal 522 to control gap (cell gap) between the first electrode 513 and the second electrode 524. Any structure shown in the embodiment modes described above can be applied to the thin film transistors, 510a, 510b and 511. Thus, a liquid crystal display device having a semiconductor film or a nitride film formed by a plasma treatment having high density (high density plasma treatment) can be provided as described above.

In this manner, the semiconductor device shown in this embodiment mode may have a pixel portion including a light-emitting element or a pixel portion including a liquid crystal.

Next, application mode of the semiconductor device having such a pixel portion is described with reference to drawings.

Examples of usage modes of a semiconductor device having such pixel portion can be given as follows: a video camera, a digital camera, a goggle type display (head mounted display), a navigation system, an audio reproducing device (car audio, an audio component, or the like), a computer, a game machine, a portable information terminal (a mobile computer, a cellular phone, a portable game machine, an electronic book, or the like), an image reproducing device including a recording medium (specifically, a device capable of processing data in a recording medium such as a digital versatile disc (DVD) and having a display which can display the image of the data), and the like. Practical examples thereof are shown in FIGS. 24A to 24H.

Figure 24A:
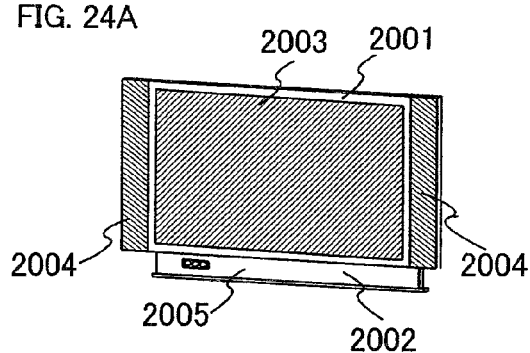
FIGS. 24A to 24H each show examples of usage mode of a semiconductor device of the present invention.

FIG. 24A shows a TV set (television receiver), which includes a chassis 2001, a support 2002, a display portion 2003, a loudspeaker portion 2004, a video input terminal 2005, or the like. The TV set can be manufactured by applying a structure or a manufacturing method shown in Embodiment Modes described above to a semiconductor element such as a thin film transistor provided in the display portion 2003, a driver circuit or the like.

Figure 24B:
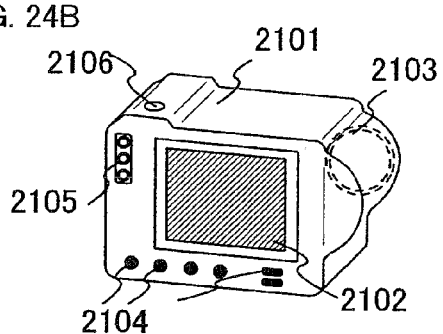

FIG. 24B shows a digital camera, which includes a main body 2101, a display portion 2102, an image receiving portion 2103, an operation key 2104, an external connection port 2105, a shutter 2106, or the like. The digital camera can be manufactured by applying a structure or a manufacturing method shown in Embodiment Modes described above to a semiconductor element such as a thin film transistor provided in t the display portion 2102, a driver circuit or the like.

Figure 24C:
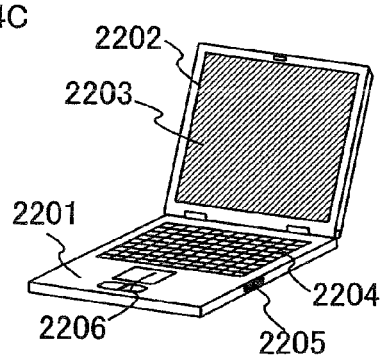

FIG. 24C shows a computer, which includes a main body 2201, a chassis 2202, a display portion 2203, a keyboard 2204, an external connection port 2205, a pointing mouse 2206, or the like. The computer can be manufactured by applying a structure or a manufacturing method shown in Embodiment Modes described above to a semiconductor element such as a thin film transistor provided in t the display portion 2203, a driver circuit or the like.

Figure 24D:
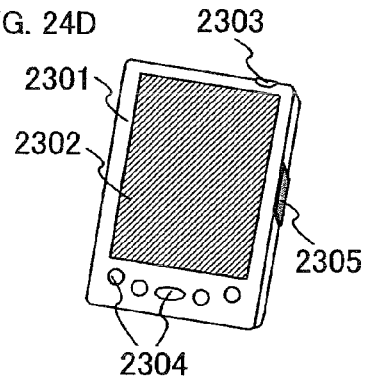

FIG. 24D shows a mobile computer, which includes a main body 2301, a display portion 2302, a switch 2303, an operation key 2304, an infrared port 2305, or the like. The mobile computer can be manufactured by applying a structure or a manufacturing method shown in Embodiment Modes described above to a semiconductor element such as a thin film transistor provided in t the display portion 2302, a driver circuit or the like.

Figure 24E:
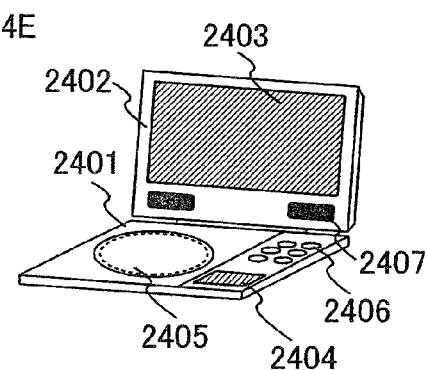

FIG. 24E shows a portable image reproducing device having a recording medium (such as a DVD player), which includes a main body 2401, a chassis 2402, a display portion A 2403, a display portion B 2404, a recording medium (DVD or the like) reading portion 2405, an operation key 2406, a loudspeaker portion 2407, or the like. The display portion A 2403 mainly displays image information, and the display portion B 2404 mainly displays character information. The image reproducing device can be manufactured by applying a structure or a manufacturing method shown in Embodiment Modes described above to a semiconductor element such as a thin film transistor provided in the display portion A 2403 and/or the display portion B 2404, a driver circuit or the like. A game machine and the like are included in the category of the image reproducing device having a recording medium.

Figure 24F:
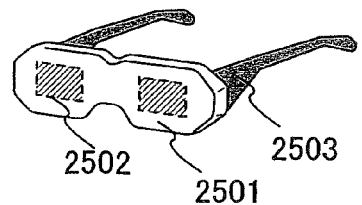

FIG. 24F shows a goggle type display (head mounted display), which includes a main body 2501, a display portion 2502, an arm portion 2503, or the like. The goggle type display can be manufactured by applying a structure or a manufacturing method shown in Embodiment Modes described above to a semiconductor element such as a thin film transistor provided in t the display portion 2502, a driver circuit or the like.

Figure 24G:
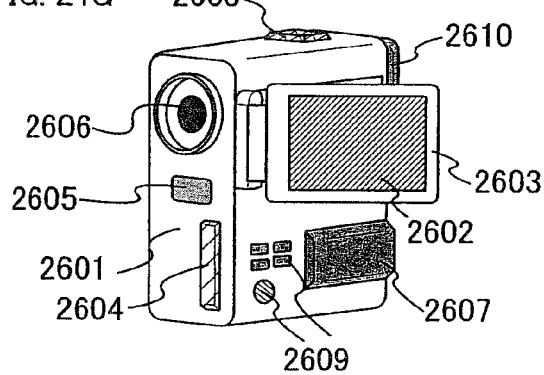

FIG. 24G shows a video camera, which includes a main body 2601, a display portion 2602, a chassis 2603, an external connection port 2604, a remote control receiving portion 2605, an image receiving portion 2606, a battery 2607, an audio input portion 2608, an operation key 2609, an eye piece portion 2610, or the like. The video camera can be manufactured by applying a structure or a manufacturing method shown in Embodiment Modes described above to a semiconductor element such as a thin film transistor provided in t the display portion 2602, a driver circuit or the like.

Figure 24H:
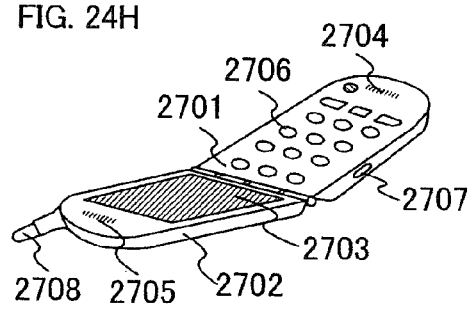

FIG. 24H shows a cellular phone, which includes a main body 2701, a chassis 2702, a display portion 2703, an audio input portion 2704, an audio output portion 2705, an operation key 2706, an external connection port 2707, an antenna 2708, or the like. The cellular phone can be manufactured by applying a structure or a manufacturing method shown in Embodiment Modes described above to a semiconductor element such as a thin film transistor provided in t the display portion 2703, a driver circuit or the like.

As described above, the applicable range of the present invention is so wide that the invention can be applied to electronic devices in various fields. Note that this embodiment mode can be freely combined with the above embodiment modes.

Example 1

Example 1 shows oxidation characteristics in a case that an oxidation treatment is conducted to an object by a high density plasma treatment shown in embodiment modes described above. Specifically, characteristics of oxidation speed of the object due to the type of gases used in the high density plasma treatment are shown.

Silicon oxynitride ($SiO_xN_y$, (x>y)) was formed as a base film by a CVD method over a substrate first, and an amorphous silicon film was formed by a CVD method over the base film. Next, a heat treatment was conducted to remove hydrogen included in the amorphous silicon film, and after that, the amorphous silicon film was crystallized by laser irradiation to form a crystalline semiconductor film. The crystalline semiconductor film was oxidized by a high density plasma treatment. A glass substrate was used as the substrate and the silicon oxynitride was formed to have a thickness of about 100 nm, and the amorphous semiconductor film was formed to have a thickness of about 66 nm.

The high density plasma treatment was conducted under the following condition: a pressure of 133.33 Pa, an atmosphere including Ar and oxygen (Ar: 500 sccm, $O_2$: 5 sccm) (Condition 1) or an atmosphere including Ar, hydrogen and oxygen (Ar: 500 sccm, $O_2$: 5 sccm, $H_2$: 5 sccm) (Condition 2). The characteristics of oxidation speed of the crystalline semiconductor film were observed under Condition 1 or Condition 2.

Figure 28:
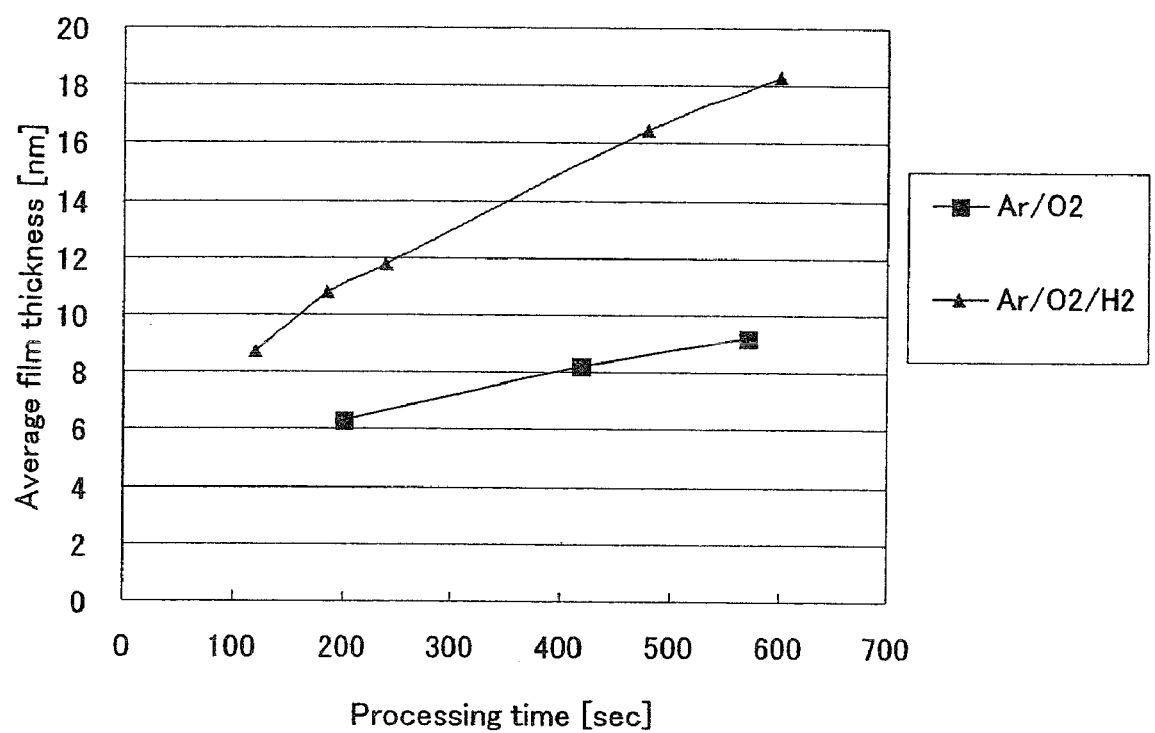
FIG. 28 is a graph showing characteristics of oxidation speed in a manufacturing method of a semiconductor device of the present invention.

The oxidation speed of the crystalline semiconductor film under Condition 1 and Condition 2 are shown in FIG. 28. In FIG. 28, the vertical axis represents an average film thickness (nm) and the horizontal axis represents processing time (sec). The processing time means a time during which a plasma treatment was conducted to the crystalline semiconductor film, and the average film thickness means a film thickness of an oxide film formed by oxidizing the crystalline semiconductor film by the plasma treatment.

It can be observed that under Condition 1 and Condition 2, as the processing time of plasma is increased, the crystalline semiconductor film is more oxidized, and the film thickness of the oxide film in the crystalline semiconductor film In addition, in the plasma treatment, the oxidation rate of the crystalline semiconductor film to the processing time is higher under Condition 2 in which hydrogen was added to Condition 1 (the atmosphere including Ar, oxygen and hydrogen) than under Condition 1 (the atmosphere including Ar and oxygen). In other words, it can be understood that when the oxidation treatment is conducted to the crystalline semiconductor film by the high density plasma treatment, the crystalline semiconductor film was oxidized at a shorter time and a thicker oxide film was formed in the surface of the crystalline semiconductor film by conducting the treatment in the atmosphere including hydrogen additionally According to the above results, when an oxide film is formed in a crystalline semiconductor film by a high density plasma treatment, the oxide film can be have a desired film thickness at a shorter time, and a processing time can be shortened by adding hydrogen to a reactive gas.

The present application is based on Japanese Patent Application serial No. 2005-133680 filed on Apr. 28, 2005 in Japanese Patent Office, the entire contents of which are hereby incorporated by reference.

What is claimed is:

1. A manufacturing method of a semiconductor device, comprising:

forming a semiconductor layer on an insulating surface;
forming a first insulating film covering the semiconductor layer by conducting a first plasma treatment to the semiconductor layer under a condition of an electron density of $1 \times 10^{11}$ cm$^{-3}$ or more and $1 \times 10^{13}$ cm$^{-3}$ or less and an electron temperature of 0.5 eV or more and 1.5 eV or less;

forming a second insulating film over the first insulating film by CVD;

conducting a second plasma treatment to the second insulating film.

2. The method according to claim 1, wherein the first insulating film functions as a tunnel insulating film.

3. The method according to claim 1, wherein the third insulating film functions as an insulating film for trapping charges.

4. The method according to claim 1, wherein silicon oxide ($SiO_x$) or silicon nitride ($SiN_x$) is formed as the first insulating film.

5. The method according to claim 1, wherein any one of silicon oxide ($SiO_x$), silicon nitride ($SiN_x$), silicon oxynitride ($SiO_xN_y$) (x>y), and silicon nitride oxide ($SiN_xO_y$) (x>y) is formed as the second insulating film.

6. The method according to claim 1,
wherein a third insulating film covering the second insulating film is formed by conducting the second plasma treatment, and
wherein the third insulating film includes silicon oxynitride ($SiO_xN_y$) (x>y) or silicon nitride oxide ($SiN_xO_y$) (x>y).

7. The manufacturing method according to claim 1, wherein the first plasma treatment is conducted in an atmosphere including oxygen and a rare gas.

8. The manufacturing method according to claim 1, wherein the first plasma treatment is conducted in an atmosphere including nitrogen and a rare gas.

9. The manufacturing method according to claim 1, wherein the second plasma treatment is conducted in an atmosphere including oxygen and a rare gas.

10. The manufacturing method according to claim 1, wherein the second plasma treatment is conducted in an atmosphere including nitrogen and a rare gas.

11. The method according to claim 1, wherein an end portion of the semiconductor layer has a tapered shape.

12. The manufacturing method of a semiconductor device according to claim 1, wherein the plasma treatment is conducted using a high frequency wave.

13. The manufacturing method according to claim 1, wherein a microwave is used as the high frequency wave.

14. A manufacturing method of a semiconductor device, comprising:
forming a semiconductor layer on an insulating surface;
forming a first insulating film covering the semiconductor layer by conducting a first plasma treatment to the semiconductor layer;
forming a second insulating film over the first insulating film by CVD;
conducting a second plasma treatment to the second insulating film under a condition of an electron density of $1\times10^{11}$ $cm^{-3}$ or more and $1\times10^{13}$ $cm^{-3}$ or less and an electron temperature of 0.5 eV or more and 1.5 eV or less.

15. The method according to claim 14, wherein the first insulating film functions as a tunnel insulating film.

16. The method according to claim 14, wherein the third insulating film functions as an insulating film for trapping charges.

17. The method according to claim 14, wherein silicon oxide ($SiO_x$) or silicon nitride ($SiN_x$) is formed as the first insulating film.

18. The method according to claim 14, wherein any one of silicon oxide ($SiO_x$), silicon nitride ($SiN_x$), silicon oxynitride ($SiO_xN_y$) (x>y), and silicon nitride oxide ($SiN_xO_y$) (x>y) is formed as the second insulating film.

19. The method according to claim 14,
wherein a third insulating film covering the second insulating film is formed by conducting the second plasma treatment, and
wherein the third insulating film includes silicon oxynitride ($SiO_xN_y$) (x>y) or silicon nitride oxide ($SiN_xO_y$) (x>y).

20. The manufacturing method according to claim 14, wherein the first plasma treatment is conducted in an atmosphere including oxygen and a rare gas.

21. The manufacturing method according to claim 14, wherein the first plasma treatment is conducted in an atmosphere including nitrogen and a rare gas.

22. The manufacturing method according to claim 14, wherein the second plasma treatment is conducted in an atmosphere including oxygen and a rare gas.

23. The manufacturing method according to claim 14, wherein the second plasma treatment is conducted in an atmosphere including nitrogen and a rare gas.

24. The method according to claim 14, wherein an end portion of the semiconductor layer has a tapered shape.

25. The manufacturing method of a semiconductor device according to claim 14, wherein the plasma treatment is conducted using a high frequency wave.

26. The manufacturing method according to claim 14, wherein a microwave is used as the high frequency wave.

27. A manufacturing method of a semiconductor device, comprising:
forming a semiconductor layer on an insulating surface;
forming a first insulating film covering the semiconductor layer by conducting a first plasma treatment to the semiconductor layer under a condition of an electron density of $1\times10^{11}$ $cm^{-3}$ or more and $1\times10^{13}$ $cm^{-3}$ or less and an electron temperature of 0.5 eV or more and 1.5 eV or less;
forming a second insulating film over the first insulating film by CVD;
conducting a second plasma treatment to the second insulating film under a condition of an electron density of $1\times10^{11}$ $cm^{-3}$ or more and $1\times10^{13}$ $cm^{-3}$ or less and an electron temperature of 0.5 eV or more and 1.5 eV or less.

28. The method according to claim 27, wherein the first insulating film functions as a tunnel insulating film.

29. The method according to claim 27, wherein the third insulating film functions as an insulating film for trapping charges.

30. The method according to claim 27, wherein silicon oxide ($SiO_x$) or silicon nitride ($SiN_x$) is formed as the first insulating film.

31. The method according to claim 27,
wherein a third insulating film covering the second insulating film is formed by conducting the second plasma treatment, and
wherein the third insulating film includes silicon oxynitride ($SiO_xN_y$) (x>y) or silicon nitride oxide ($SiN_xO_y$) (x>y).

32. The method according to claim 27, wherein silicon oxynitride ($SiO_xN_y$) (x>y) or silicon nitride oxide ($SiN_xO_y$) (x>y) is formed as the third insulating film.

33. The manufacturing method according to claim 27, wherein the first plasma treatment is conducted in an atmosphere including oxygen and a rare gas.

34. The manufacturing method according to claim 27, wherein the first plasma treatment is conducted in an atmosphere including nitrogen and a rare gas.

35. The manufacturing method according to claim 27, wherein the second plasma treatment is conducted in an atmosphere including oxygen and a rare gas.

36. The manufacturing method according to claim 27, wherein the second plasma treatment is conducted in an atmosphere including nitrogen and a rare gas.

37. The method according to claim 27, wherein an end portion of the semiconductor layer has a tapered shape.

38. The manufacturing method of a semiconductor device according to claim 27, wherein the plasma treatment is conducted using a high frequency wave.

39. The manufacturing method according to claim 27, wherein a microwave is used as the high frequency wave.

40. A manufacturing method of a semiconductor device, comprising:
    forming at least a first semiconductor layer and a second semiconductor layer on an insulating surface;
    forming a first insulating film covering the first and second semiconductor layers;
    selectively forming a metal film covering the first semiconductor layer; and
    conducting a plasma treatment to the first insulating film under a condition of an electron density of $1\times10^{11}$ cm$^{-3}$ or more and $1\times10^{13}$ cm$^{-3}$ or less and an electron temperature of 0.5 eV or more and 1.5 eV or less.

41. The method according to claim 40, wherein the first metal film includes one or plurals of a metal selected from copper (Cu), silver (Ag), gold (Au) aluminum (Al), chromium (Cr), molybdenum (Mo), titanium (Ti), tantalum (Ta), tungsten (W), nickel (Ni), carbon (C), or a metal compound containing one or plurals of the metals.

42. The method according to claim 40, wherein any one of silicon oxide (SiO$_x$), silicon nitride (SiN$_x$), silicon oxynitride (SiO$_x$N$_y$) (x>y), and silicon nitride oxide (SiN$_x$O$_y$) (x>y) is formed as the first insulating film.

43. The method according to claim 40,
    wherein a second insulating film covering the second semiconductor layer is formed by conducting the plasma treatment, and
    wherein the second insulating film includes any one of silicon oxide (SiO$_x$), silicon nitride (SiN$_x$), silicon oxynitride (SiO$_x$N$_y$) (x>y), and silicon nitride oxide (SiN$_x$O$_y$) (x>y).

44. The manufacturing method according to claim 40, wherein the plasma treatment is conducted in an atmosphere including oxygen and a rare gas.

45. The manufacturing method according to claim 40, wherein the plasma treatment is conducted in an atmosphere including nitrogen and a rare gas.

46. The method according to claim 40, wherein an end portion of the first and second semiconductor layers have a tapered shape.

47. The manufacturing method of a semiconductor device according to claim 40, wherein the plasma treatment is conducted using a high frequency wave.

48. The manufacturing method according to claim 40, wherein a microwave is used as the high frequency wave.

49. A manufacturing method of a semiconductor device, comprising:
    forming at least a first semiconductor layer and a second semiconductor layer on an insulating surface;
    forming a first insulating film covering the first and second semiconductor layers;
    selectively forming a first metal film covering the first semiconductor layer;
    conducting a plasma treatment to the first insulating film under a condition of an electron density of $1\times10^{11}$ cm$^{-3}$ or more and $1\times10^{13}$ cm$^{-3}$ or less and an electron temperature of 0.5 eV or more and 1.5 eV or less;
    forming a second metal film covering the first and second semiconductor layers; and
    patterning the first and second metal films,
    wherein a first gate electrode including the patterned first and second metal films is formed over the first semiconductor layer and a second gate electrode including the patterned second metal film is formed over the second semiconductor layer.

50. The method according to claim 49, wherein the first metal film includes one or plurals of a metal selected from copper (Cu), silver (Ag), gold (Au) aluminum (Al), chromium (Cr), molybdenum (Mo), titanium (Ti), tantalum (Ta), tungsten (W), nickel (Ni), carbon (C), or a metal compound containing one or plurals of the metals.

51. The method according to claim 49, wherein the second metal film includes one or plurals of a metal selected from tantalum (Ta), tungsten (W), molybdenum (Mo), titanium (Ti), aluminum (Al), copper (Cu), chromium (Cr), or niobium (Nb) or an alloy material or a chemical compound material containing one or plurals of the metals.

52. The method according to claim 49, wherein any one of silicon oxide (SiO$_x$), silicon nitride (SiN$_x$), silicon oxynitride (SiO$_x$N$_y$) (x>y), and silicon nitride oxide (SiN$_x$O$_y$) (x>y) is formed as the first insulating film.

53. The method according to claim 49,
    wherein a second insulating film covering the second semiconductor layer is formed by conducting the plasma treatment, and
    wherein the second insulating film includes any one of silicon oxide (SiO$_x$), silicon nitride (SiN$_x$), silicon oxynitride (SiO$_x$N$_y$) (x>y), and silicon nitride oxide (SiN$_x$O$_y$) (x>y).

54. The manufacturing method according to claim 49, wherein the plasma treatment is conducted in an atmosphere including oxygen and a rare gas.

55. The manufacturing method according to claim 49, wherein the plasma treatment is conducted in an atmosphere including nitrogen and a rare gas.

56. The method according to claim 49, wherein an end portion of the first and second semiconductor layers have a tapered shape.

57. The manufacturing method of a semiconductor device according to claim 49, wherein the plasma treatment is conducted using a high frequency wave.

58. The manufacturing method according to claim 49, wherein a microwave is used as the high frequency wave.

* * * * *